United States Patent [19]
Nakao

[11] Patent Number: 5,698,348
[45] Date of Patent: Dec. 16, 1997

[54] PHASE SHIFTING MASK, MANUFACTURING METHOD THEREOF, AND EXPOSURE METHOD USING SUCH A PHASE SHIFTING MASK

[75] Inventor: Shuji Nakao, Hyogo, Japan

[73] Assignee: Mitsubishi Denki Kabushiki Kaisha, Tokyo, Japan

[21] Appl. No.: 644,755

[22] Filed: May 10, 1996

Related U.S. Application Data

[62] Division of Ser. No. 298,098, Aug. 30, 1994, Pat. No. 5,536,602.

[30] Foreign Application Priority Data

Oct. 18, 1993 [JP] Japan ................................. 5-260034
Mar. 9, 1994 [JP] Japan ................................. 6-038725

[51] Int. Cl.⁶ ............................................. G03F 9/00
[52] U.S. Cl. ................................. 430/5; 430/323
[58] Field of Search ....................... 430/5, 322, 323, 430/324

[56] References Cited

U.S. PATENT DOCUMENTS

| | | | |
|---|---|---|---|
| 5,219,686 | 6/1993 | Kamon | 430/5 |
| 5,286,581 | 2/1994 | Lee | 430/5 |
| 5,411,823 | 5/1995 | Okamoto | 430/5 |

FOREIGN PATENT DOCUMENTS

| | | |
|---|---|---|
| 0528 687 | 2/1963 | European Pat. Off. . |
| 0395 425 | 10/1990 | European Pat. Off. . |
| 0493 963 | 7/1992 | European Pat. Off. . |
| 0567 169 | 10/1993 | European Pat. Off. . |
| 2-211450 | 8/1990 | Japan . |
| 4-42154 | 2/1992 | Japan . |
| 4-355758 | 12/1992 | Japan . |
| WO 94/17450 | 8/1994 | WIPO . |

OTHER PUBLICATIONS

"Phase–Shifting Mask Strategies: Isolated Dark Lines," Levenson, Microlithography World, Mar./Apr. 1992, pp. 6–12.

"The Effect of Duty Ratio of Line and Space in Phase–Shifting Lithography," Miyazaki et al., Proc. of SPIE vol. 1927, 55, pp. 677–685.

Primary Examiner—S. Rosasco
Attorney, Agent, or Firm—Lowe, Price, LeBlanc & Becker

[57] ABSTRACT

A quartz substrate includes a first light transmitting portion and a second light transmitting portion which transmit exposure light. The first and second light transmitting portions are formed such that exposure light transmitted through respective light transmitting portions are 180° out of phase with each other. A semi-light shielding film is located between first and second light transmitting portion and formed in a part of first and second light transmitting portions. Also, semi-light shielding film has transmittance of at least 3% and not more than 30%.

2 Claims, 55 Drawing Sheets

LIGHT INTENSITY ON WAFER

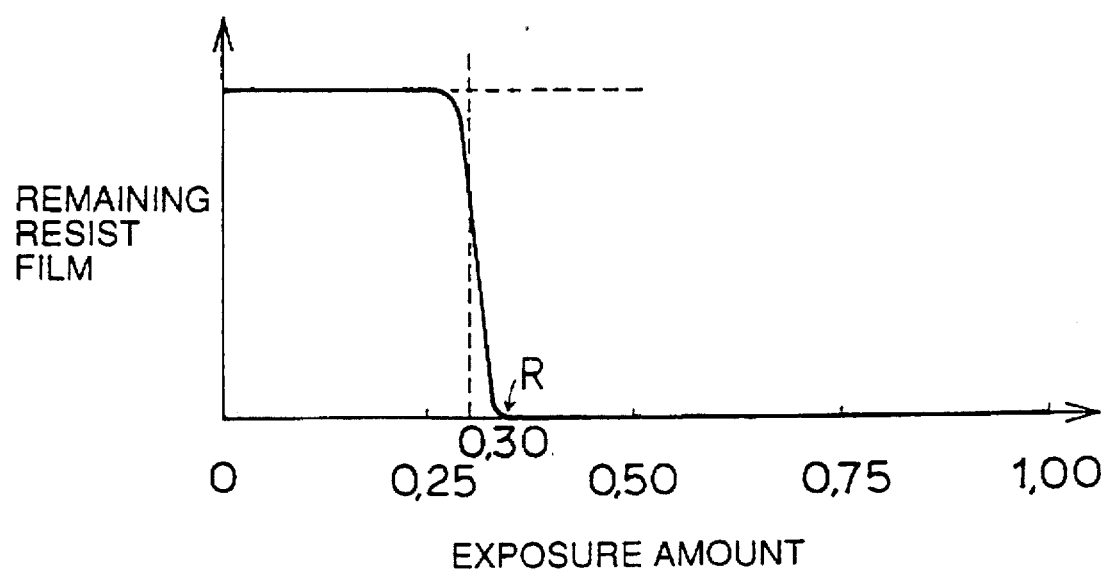

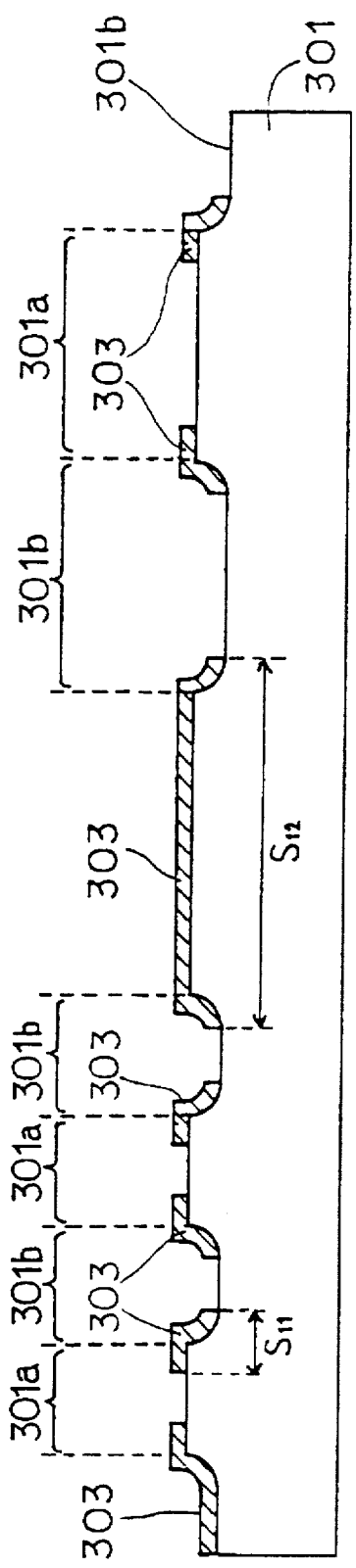
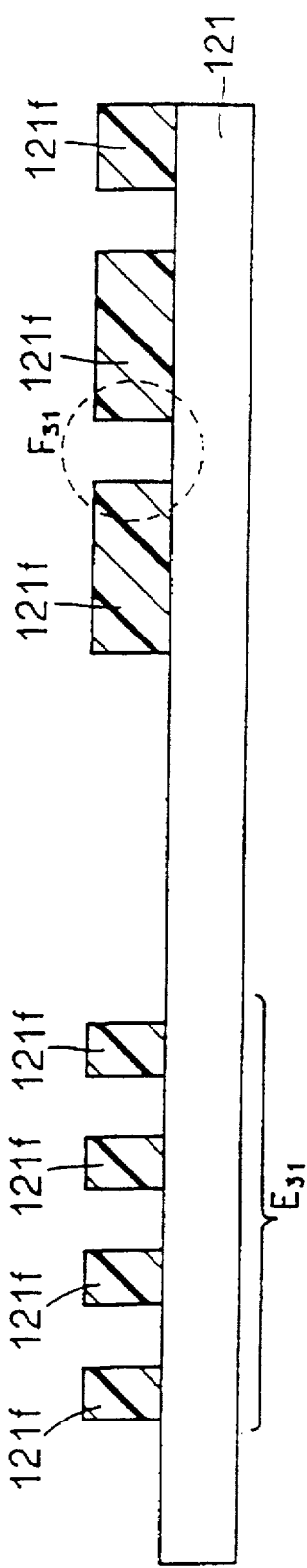
FIG.31A
FIG.31B

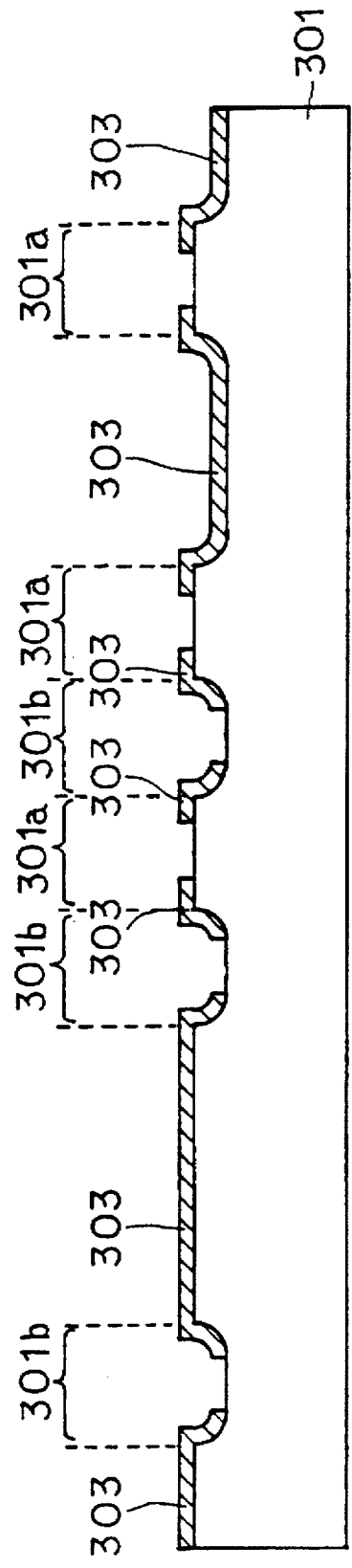
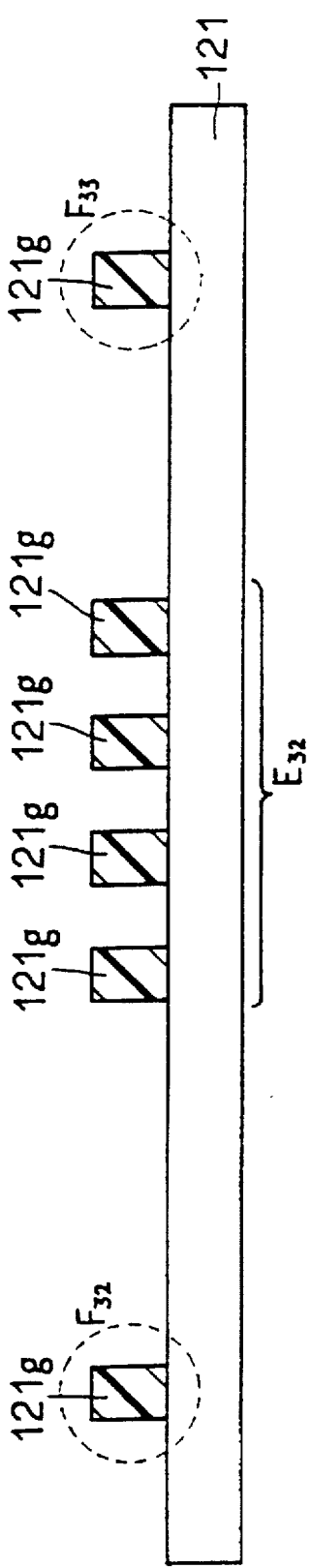
FIG.32A
FIG.32B

ELECTRIC
FIELD
ON MASK

LIGHT
INTENSITY
ON WAFER

ELECTRIC
FIELD
ON MASK

LIGHT
INTENSITY
ON WAFER

ELECTRIC FIELD ON MASK

LIGHT INTENSITY ON WAFER 5,698,348

1

PHASE SHIFTING MASK, MANUFACTURING METHOD THEREOF, AND EXPOSURE METHOD USING SUCH A PHASE SHIFTING MASK

This application is a division of application Ser. No. 08/298,098 filed Aug. 30, 1994 now U.S. Pat. No. 5,536,602.

BACKGROUND OF THE INVENTION

1. Field of the Invention

The present invention relates to a phase shifting mask and a manufacturing method thereof as well as an exposure method using such a phase shifting mask.

2. Description of the Background Art

In semiconductor integrated circuitry, so much developments have been made for high integration and miniaturization. Accordingly, the rapid development has been made for miniaturization of a circuit pattern which is formed on a semiconductor substrate (hereinafter referred merely to as a wafer).

Among other things, photolithography has been recognized widely as the basic technology for pattern formation, in which various developments and improvements have already been made. However, as miniaturization of patterns proceeds, an improvement of resolution of the pattern is strongly required.

Photography is a technology for transferring a mask (original) pattern on a photoresist applied on a wafer and patterning an underlying film to be etched. When transferring the photoresist, the photoresist is developed. During development, the photoresist of the type in which a portion exposed to light is removed is called a positive type photoresist, while the type in which a portion not exposed to light is removed is called a negative type. Now, a conventional exposure method utilizing the photolithography technology will be described.

FIG. 45 is a schematic diagram of an optical system for illustrating a conventional exposure method. In this optical system, referring to FIG. 45, a pattern on a mask is reduced and projected onto a photoresist placed on the wafer. The optical system includes an illumination optical system covering from a light source to a photomask pattern, and a projection optical system covering from the photomask pattern to the wafer.

The illumination optical system includes a mercury lamp 111 serving as a light source, a reflection mirror 112, a light collecting lens 118, a fly eye lenses 113, a diaphragm 114b, light collecting lenses 116a–116c, a blind diaphragm 115, and a reflection mirror 117. The projection optical system includes telephoto lenses 119a–119b and a diaphragm 125.

In exposure operation, a beam of light 111a emitted from mercury lamp 111 is reflected from reflection mirror 112, so that only a g-line (wavelength:436nm), for example, is reflected to become a beam of light having a single wavelength. Beam of light 111a then enters each lens 113a constituting fly eye lens 113, and after that, passes through diaphragm 114b.

Light passes through a light path 111b produced by one lens 113a constituting the fly eye lens, and light passes through a light path 111c produced by fly eye lens 113.

Beam of light 111a transmitted through diaphragm 114b then passes through light collecting lens 116a, blind diaphragm 115 and light collecting lens 116b, and is reflected from reflection mirror 117 at a predetermined angle.

2

Reflected from reflection mirror 117, beam of light 111a transmits through light collecting lens 116c and irradiates uniformly the entire surface of a photomask 720 in which a predetermined pattern is formed. Then, beam of light 111a is reduced by projection lenses 119a, 119b by a predetermined times for exposing a photoresist 121a placed on a semiconductor wafer 121.

Generally, a resolution limit R (nm) in photolithography using the demagnification exposure method is represented as $R = k_1 \cdot \lambda / (NA)$ where $\lambda$ is a wavelength (nm) of the light used, NA is a numerical aperture of a lens, and $k_1$ is a constant depending on a resist process.

As can be seen from the above expression, a method conceivable to improve resolution limit R, i.e., to obtain a fine pattern, is to reduce $k_1$ and $\lambda$ values and increase an NA value. In other words, it is sufficient to reduce the constant depending on the resist process while shortening the wavelength and increasing NA.

However, improvement of light source or the lens is technically difficult, and a depth of focus $\delta$ of the lens ($\delta = k_2 \cdot \lambda / (NA)^2$) might be shallower by proceeding shortening of the wavelength and increasing of NA, thus causing deterioration of the resolution.

With this in view, studies for attempting miniaturization of patterns by improving the photomask are under way. Lately, a phase shifting mask has been focused as a photomask capable of improving a resolution of the pattern. Now, a structure and the principle of such a phase shifting mask will be described in comparison with an ordinary photomask. The below description will be directed to a phase shifting mask of a Levenson system and a halftone system.

FIGS. 46A–46C represent, respectively, a cross section of a mask when a conventional photomask is used, an electric field on the mask, and a graph showing the light intensity on a wafer. Referring to FIG. 46A, a metal mask pattern 503 is formed on a glass substrate 501 in the conventional photomask. The electric field on such a conventional photomask is pulse-modulated spatially by metal mask pattern 503 as shown in FIG. 46B.

However, as can be seen from FIG. 46C, as the pattern is miniaturized, exposure light transmitted through the photomask also enters an unexposed region (a region where the exposure light is intercepted by metal mask pattern 503) due to diffraction of light. Therefore, light is directed also to the unexposed region on the wafer, thus decreasing contrast of light (a difference in light intensity between the exposed region and the unexposed region on the wafer). Consequently, the resolution is decreased, making transfer of fine patterns difficult.

FIGS. 47A–47C represent, respectively, a cross section of a mask when a phase shifting mask of the Levenson system is used, an electric field on the mask, and a graph showing light intensity on a wafer. Referring to FIG. 47A, the phase shifting mask includes an optical member called a phase shifter 505 provided on the conventional photomask.

More particularly, a chromium mask pattern 503 is formed on glass substrate 501 so that exposure regions and shaded regions are provided, and phase shifters 505 are provided every other exposure region. Phase shifter 505 serves to convert a phase of the transmitted light by 180°.

Referring to FIG. 47B, since phase shifters 505 are provided every other exposure region as described above, the electric field on the mask is structured such that phases of the light transmitted through the phase shifting mask are inverted alternately by 180°. Phases of light are thus reversed in adjacent exposure regions, so that beams of light are canceled with each other due to interference of light in a portion where reverse-phased beams of light are overlapped.

As a result, as shown in FIG. 47C, the light intensity is reduced at a boundary of adjacent exposure regions, so that a sufficient difference in light intensity between exposure regions and unexposure regions on the wafer can be secured. This allows improvement of the resolution for transferring fine patterns.

FIGS. 48A–48C represent, respectively, a cross section of a mask when a phase shifting mask of the halftone system is used, the electric field on the mask, and a graph showing light intensity on the wafer. Referring to FIG. 48A, an optical member called a phase shifter 506 is also provided in the phase shifting mask of the halftone system as in the above-described Levenson system.

Only difference is that optical member 506 is formed only on an opaque film 503 on glass substrate 501, so that a two-layered structure of phase shifter 506 and opaque film 503 is provided. Phase shifter 506 serves to convert the phase of the transmitted light by 180° as described above, and opaque film 503 serves to decay the intensity of the exposure light without completely intercepting the exposure light.

Referring to FIG. 48B, since the two-layered structure of phase shifter 506 and opaque film 503 is provided as described above, phases of light are converted by 180° alternately in the electric field on the mask, while at the same time the intensity of one phase becomes smaller than the other. More particularly, phases of light are converted by 180° due to transmission through phase shifter 506, and the intensity of light is decayed due to transmission through opaque film 503 such that a predetermined thickness of the photoresist can remain after development. The phases of the light are reversed in adjacent exposure regions so that beams of light are canceled with each other in the region where reverse-phased beams of light are overlapped.

As can be seen from FIG. 48C, the intensity of light can be reduced at an edge of the exposure pattern because the phase is reversed at the edge. Consequently, the difference in the light intensity between the region where the exposure light is transmitted through opaque film 503 and the region the light is not transmitted through the film becomes greater, whereby the resolution of the pattern image can be improved.

As described above, there are many types of phase shifting masks including the Levenson system, the halftone system and the like. Among others, a good resolution can be obtained according to the principles of a so-called phase shifting mask of the Levenson system which had been invented by Marc Levenson, and that system is considered as the most favorable system from the standpoint of resolution.

Various techniques have been invented and proposed for manufacturing such a phase shifting mask, however, none has been used in practice. Among these proposals, one prior art technique which is considered superior is a manufacturing technique by Marc Levenson which is described in Marc D. Levenson et al., "Phase-Shifting Mask Strategies: Isolated Dark Lines" MICROLITHOGRAPHY WORLD, pp. 6–12, March/April 1192.

Therefore, a structure and a manufacturing method of a phase shifting mask of the Levenson system according to the above technique will be described below as a conventional first phase shifting mask.

FIG. 49 is a cross sectional view schematically showing a structure of a conventional first phase shifting mask.

Referring to FIG. 49, a conventional first phase shifting mask 720 includes a quartz substrate 701 and a light shielding film 703.

Trenches are formed with a predetermined depth on a main surface of quartz substrate 701. A region where the trench is not formed serves as a first light transmitting portion 701a, while a region where the trench is formed serves as a second light transmitting portion 701b. Light shielding film 703 is formed on quartz substrate 701 so as to cover a sidewall portion of the trench and to expose predetermined regions of first and second light transmitting portions 701a and 701b. Light shielding film 703 has transmittance of not more than 1%, and a thickness of about 1000Å when chromium (Cr) is used as a material.

First and second light transmitting portions 701a and 701b are structured such that phases of the exposure light transmitted through respective portions are converted by 180°. Since the phases of exposure light transmitted through adjacent light transmitting portions are thus converted by 180°, the resolution can be improved, as described above.

A bottom wall of the trench is substantially perpendicular to a sidewall thereof.

Now, a manufacturing method of the first phase shifting mask will be described below.

FIGS. 50–57 are schematic cross sectional views showing in this order a manufacturing method of the conventional first phase shifting mask. First, referring to FIG. 50, a chromium film 705a is formed on a surface 701a of quartz substrate 701. A resist film 707a is applied on chromium film 705a. Resist 707a is then exposed with light and developed.

Referring to FIG. 51, a resist pattern 707 having a desired shape is formed through the above exposure and development. Using resist pattern 707 as a mask, anisotropic etching is carried out. Resist pattern 707 is then removed.

Referring to FIG. 52, a chromium film pattern 705 is thus formed wherein a shifter pattern is transferred.

Referring to FIG. 53, using chromium film pattern 705 as a mask, anisotropic etching is carried out on quartz substrate 701, whereby a trench is formed on a surface 701a of quartz substrate 701 for transferring the shifter pattern. Chromium film pattern 705 is then removed.

Referring to FIG. 54, first and second light transmitting portions 701a and 701b are thus formed in quartz substrate 701.

Referring to FIG. 55, a chromium film 703a is formed on the entire surface wherein first and second light transmitting portions 701a and 701b are formed. A resist film 709a is applied on chromium film 703a. Resist film 709a is then exposed with light and developed.

Referring to FIG. 56, a resist pattern 709 having a desired shape is formed through the above exposure and development. Using resist pattern 709 as a mask, anisotropic etching is conducted to form a light shielding film 703 which exposes desired regions of first and second light transmitting portions 701a and 701b. After that, resist pattern 709 is removed, thereby completing the conventional phase shifting mask 720 shown in FIG. 57.

In the above-described manufacturing method of the conventional phase shifting mask, resist films 707a and 709a are not applied directly on quartz substrate 701. Accordingly, compare to a manufacturing method of the phase shifting mask in which the resist film is directly applied on the substrate (Japanese Patent Laying-Open Nos. 4-355758 and 2-211450), this phase shifting mask includes an advantage that a defect such as is described below will easily be repaired.

As one example of the method in which the resist film is directly applied on the substrate, a manufacturing method of the phase shifting mask described in Japanese Patent Laying-Open No. 4-355758 will be described.

FIGS. 58–61 are schematic cross sectional views showing in this order the manufacturing method of the phase shifting mask described in the above document. First, referring to FIG. 58, after a phase shifting film 803 is formed on the surface of a quartz layer 801, a light shielding film 805 is formed on the surface of the film 803.

Referring to FIG. 59, after a resist pattern 807 is formed on light shielding film 805, light shielding film 805 is patterned by etching with using resist pattern 807 as a mask. Resist pattern 807 is then removed.

Referring to FIG. 60, a photoresist 809 is directly applied on the surface of the patterned light shielding film 805 and phase shifting film 803. After patterning photoresist 809 into a desired shape, phase shifting film 803 is etched with using resist pattern 809 as a mask.

Referring to FIG. 61, a trench 811 is formed in phase shifting film 803. After that, resist pattern 809 is removed, thereby completing the phase shifting mask.

In the manufacturing method of the phase shifting mask disclosed in the above document, a shifter pattern is formed in phase shifting film 803 after light shielding film 805 is patterned, whereby resist film 809 is directly applied on the surface of phase shifting film (substrate) 803 in the step shown in FIG. 60.

In a typical method for applying the resist film, a pinhole 809a which penetrates through resist film 809 is generated as shown in FIG. 62. If etching is carried out by using resist pattern 809 as a mask with such pinhole 809a generated, a configuration shown in FIG. 63 will be obtained.

Referring to FIG. 63, an etchant enters pinhole 809a, so that phase shifting film 803 located at the bottom of pinhole 809a is also removed by etching, thus generating a defect. If the phase shifting mask including such a defect is used for exposure of a wafer, the phase of exposure light is converted in the defect portion in addition to desired regions. Therefore, the resist film applied on the wafer cannot be exposed into a desired shape.

Therefore, when the resist film is applied directly on the substrate, the defect of the shifter is introduced directly into the substrate upon carrying out etching or the like with using the resist pattern as a mask.

On the contrary, in the manufacturing method proposed by Marc Levenson, as described above, the resist film is not formed directly on the quartz substrate. Thus, even if etching is carried out to the underlying layer by using the resist film wherein pinholes are generated as a mask, direct formation of the defect of the shifter in the substrate can be prevented.

More specifically, referring to FIG. 64, even if a pinhole 707a is generated in a resist pattern 707, since a chromium film 705 is lying under resist pattern 707, only chromium film 705 at the bottom of pinhole 707a is removed by etching after etching is carried out to the underlying layer by using resist pattern 707 as a mask.

As can be seen in the figure, a pinhole defect (clear defect) 705a generated at the bottom of pinhole 707a is not in quartz substrate 701 but in chromium film 705 lying thereon. Thus, pinhole defect 705a can be easily repaired by filling up by deposition of a carbon-based film 705c in accordance with an FIB (Focussed Ion Beam) method, as shown in FIG. 65.

In some cases, as can be seen from FIG. 64, a remaining defect (opaque defect) 705b is generated at a portion where the chromium film should have been removed by etching. However, since such remaining defect 705b is not the type of defect which is formed directly in quartz substrate 701, the defect can be repaired easily by removing by blow (melt) of irradiation of laser using a YAG laser, as shown in FIG. 65.

Thus, the conventional manufacturing method proposed by Marc Levenson has the advantage that defects can easily be repaired because the defect of the shifter is not formed directly in the substrate.

Now, a structure of a phase shifting mask of the halftone system will be described below as a conventional second phase shifting mask.

FIG. 66 is a cross sectional view schematically showing a structure of a conventional second phase shifting mask. As can be seen from FIG. 66, a conventional second phase shifting mask 920 includes a quartz substrate 901 and a semi-light shielding film 903. A trench is formed with a predetermined depth in a main surface of quartz substrate 901.

A region where the trench is formed serves as a first light transmitting portion 901a, while a region where the trench is not formed serves as a second light transmitting portion 901b. Semi-light shielding film 903 is formed on quartz substrate 901 so as to cover a sidewall portion of the trench and to expose a predetermined region of first light transmitting portion 901a. Semi-light shielding film 903 serves to reduce the intensity of exposure light transmitting through semi-light shielding film 903 to such an extent that a photoresist on the wafer is not photosensitized by the exposure light or a predetermined thickness of the photoresist is left after development.

First and second light transmitting portions 901a and 901b are structured such that phases of the exposure light transmitted through respective portions are out of phase by 180°. As the phases of the exposure light transmitted through adjacent light transmitting portions are thus converted by 180°, the resolution can be improved as described above.

In the meantime, a bottom wall of the trench is substantially perpendicular to a sidewall thereof.

With using conventional first and second phase shifting masks, as described above, a higher resolution can be obtained compared to an ordinary photomask. However, there are some problems in the conventional first and second phase shifting masks such as difficulty in obtaining a desired pattern shape because of [I] increase in complexity of a circuit pattern and [II] generation of a defect during formation of a shift mask. We will discuss these problems more in detail in the following.

[I] Increase in Complexity of the Circuit Pattern

The recent circuit patterns of semiconductor integrated circuits have been made smaller and become complex in order to obtain the semiconductor integrated circuits which has a large capacity and multiple functions. For instance, in a DRAM (Dynamic Random Access Memory), periodic patterns are provided densely (hereinafter referred merely to as a dense pattern) in each memory cell region, while circuit patterns having individual functions are isolated from each other (hereinafter referred merely to as an isolated pattern) in its peripheral circuit region.

If a circuit pattern in which a dense pattern and an isolated pattern are mingled is to be formed by the phase shifting mask of the Levenson system, a good resolution can be obtained in the dense pattern, while at the same time, the resolution is not so good in the isolated pattern. In the meantime, if the phase shifting mask of the halftone system is used, then the resolution is better in the isolated pattern than in the dense pattern.

FIGS. 67A and 67B illustrate the reason why the phase shifting mask of the Levenson system cannot be used to obtain the isolated pattern at a good resolution, wherein FIG. 67A shows a cross sectional view of the phase shifting mask of the Levenson system, and FIG. 67B shows the light intensity on the wafer when exposure is conducted by using the phase shifting mask shown in FIG. 67A.

Referring to FIGS. 67A and 67B, the isolated pattern exists away from the other circuit pattern. Thus, an exposure region 701b (hereinafter referred to as an isolated exposure region) constituting the isolated pattern is spaced apart by a considerable amount from an exposure region constituting the other circuit pattern. Accordingly, the exposure light directed onto the wafer after being transmitted through isolated exposure region 701b will not overlap the exposure light having a reverse phase which is transmitted through the other exposure region. This prevents the phase shifting mask effect of obtaining a good resolution by canceling reverse-phased beams of light with each other due to diffraction of light.

On the contrary, in the dense pattern, reverse-phased beams of light are overlapped in adjacent exposure regions, as shown in FIG. 47. This contributes to improvement of the resolution due to canceling of beams of light in the region where beams of light are overlapped.

Next, FIGS. 68A and 68B illustrate the reason-why the phase shifting mask of the halftone system cannot be used to achieve a good resolution in the dense pattern, wherein FIG. 68A shows a cross sectional view of the phase shifting mask of the halftone system, and FIG. 68B shows the light intensity on the wafer when exposure is conducted by using the phase shifting mask shown in FIG. 68A.

Referring to FIGS. 68A and 68B, since circuit patterns are dense in the dense pattern, a plurality of exposure regions 901a, 901a are disposed in proximity to each other. A portion $P_3$ is thus generated wherein beams of light of the same phase are overlapped with each other in adjacent exposure regions 901a. When the beams of light of the same phase are overlapped, the light intensity cannot be diminished at the edge ($P_3$ portion) of the exposure pattern because of a small intensity of the reverse-phased light transmitted through exposure region 901b. In this case, the resolution cannot be improved due to an insufficient difference of light intensity between the exposure region and the unexposure region.

On the contrary, in the isolated pattern, a portion where beams of light of the same phase are overlapped is not generated, as shown in FIG. 48. This contributes to an improvement of resolution because a sufficient difference in light intensity can be obtained at the edge of the exposure pattern due to overlap of the reverse-phased beams of light.

Therefore, in the pattern wherein the dense pattern and the isolated pattern are mingled, either one pattern cannot be formed with a good resolution even though the conventional first or second phase shifting mask is used. This prevents formation of a desired pattern in such a complex circuit pattern as having the dense pattern and the isolated pattern.

[II] Generation of a Defect During Formation of a Shifting Mask

In the conventional manufacturing method proposed by Marc Levenson in which a shifter pattern is formed in quartz substrate 701, anisotropic etching is carried out to quartz substrate 701. In this respect, there is a problem of difficulty in obtaining a predetermined shape pattern in this manufacturing method because of the reasons such as (1) adherence of the light shielding film to the quartz substrate is degraded, (2) foreign objects are likely to remain on the quartz substrate, and (3) disadvantage due to remaining defects are easily generated.

(1) Adherence of the Light Shielding Film to Quartz Substrate

In the conventional manufacturing method of the phase shifting mask, anisotropic etching is conducted to quartz substrate 701 in the steps shown in FIG. 52 and 53. The sidewall of the trench which is formed by the etching is thus substantially perpendicular to the bottom wall of the trench. In the step shown in FIG. 55, chromium film 703a is formed also to cover the trench. However, it is difficult to form the film appropriately on the sidewall portion of the trench having the above-described structure. Specially, if chromium 703a is formed by a method having a poor step coverage such as sputtering, the appropriate formation of the film becomes more difficult.

This leads to deterioration of adherence of chromium film 703a against quartz substrate 701 on the sidewall portion of the trench (a region indicated by $D_3$ in the figure). When the adherence of chromium film 703a is not favorable, chromium film 703a will be peeled off easily during the cleaning step of the manufacturing process of the phase shifting mask. Also, light shielding film 703 will be peeled off easily during cleaning after completion of the phase shifting mask.

A portion where light shielding film 703 is thus peeled off becomes a so-called clear defect. When exposure is carried out onto the wafer by using the phase shifting mask having the clear defect, a region which should not be exposed will be exposed with light on the wafer, thus preventing formation of a pattern having a desired shape.

(2) Remaining of Foreign Objects on the Quartz Substrate

As described above, according to the manufacturing method of the conventional phase shifting mask, quartz substrate 701 is subjected to anisotropic etching in the step shown in FIGS. 52 and 53, so that the bottom wall of the trench formed during the etching is substantially perpendicular to the sidewall of the trench, as shown in FIG. 70. Since an edge of the stepped portion (a region indicated by $D_4$ in the figure) is substantially 90°, a foreign object 750a is easily be trapped at the edge.

More specifically, after formation of the trench on the surface of quartz substrate 701 in the steps shown in FIGS. 53 and 54, a chromium film pattern 705 is removed. During this removal, a foreign object is trapped at the edge of the stepped portion. Also, foreign objects such as being generated internally from the etching apparatus or included in an etching solution can be trapped.

If a light shielding film is formed with foreign objects being trapped, an etchant spreads under a resist 709 through foreign object (or after melting the foreign object at a high speed) during patterning of light shielding film 703, as shown in FIGS. 71 and 72. Thus, light shielding film 703 is removed excessively by etching as shown in FIG. 73. This excessively-removed portion by etching becomes a so-called clear defect. A region which should not be exposed will be exposed with light on the wafer due to the clear defect, thus preventing formation of a pattern having a desired shape.

As can be seen from FIG. 73, a portion of light shielding film 703 indicated by an arrow K is not in contact with the sidewall of the stepped portion but is protruding into the space. This portion K of light shielding film 703 is easily be peeled off by cleaning after removal of the resist or by cleaning after repairing of the defect of light shielding film 703, thus generating the clear defect as in the above.

In the meantime, as shown in FIG. 74, the surface of light shielding film 703 which is formed on the edge of the stepped portion reflects the stepped shape of the underlying layer. Thus, a foreign object 750b will easily be trapped at a portion along the edge of the stepped portion of light shielding film 703 (a region indicated by $D_5$ in the figure), as in the above.

If the trapped foreign object 750b is large, foreign object 750b will remain penetrating onto the light shielding portion in some cases. If foreign object 750b is made of a material through which the exposure light cannot be transmitted, the foreign object will necessarily be a so-called opaque defect. Even if the exposure light can transmits through foreign object 750b, a proper function of light shielding mask 703 as a phase shifting mask will be prevented when a phase of the transmitted light is shifted by a considerable amount (usually 10°–20°) or more by the material. Thus, the shape to be transferred onto the resist on the wafer is deformed, thus generating a defect.

Thus, when the foreign object is trapped in the stepped portion or the like in quartz substrate 701 during processing of the phase shifting mask, it is difficult to expose the resist on the wafer into a desired shape.

(3) Disadvantage Caused By Remaining Defects

In some cases, during patterning of chromium film 705a shown in FIGS. 50 and 51, a remaining defect 705b is generated as shown in FIG. 75. Such a remaining defect 705b can be repaired by the above-described laser blow or the like. However, this does not mean that all of generated remaining defects 705b cannot be sensed and repaired. Also, it is sometimes desired to omit a step of repairing for the sake of simplifying of a manufacturing process. In such a case, some remaining defects 705b are still left.

In the manufacturing method of the conventional phase shifting mask, the trench is formed on the surface of quartz substrate 701 by anisotropic etching in the steps shown in FIGS. 52 and 53. However, if anisotropic etching is carried out with remaining defect 705b being generated, an unetched region (a region indicated by $D_6$ in the figure) which should have been etched is generated as shown in FIG. 76.

Referring to FIG. 77, the phases of the beams of exposure light transmitted through adjacent light transmitting portions are not converted by 180° in the thus formed phase shifting mask. More particularly, the exposure light transmitted through light transmitting portion 701a and the exposure light transmitted through a light transmitting portion 701ab have the same phase. Accordingly, the exposure light transmitted through both transmitting portions 701a and 701ab will be intensified in a portion where those beams of light are overlapped. Consequently, a difference of light intensity between the exposed region and the light-shielded region on the wafer becomes small, so that the resolution is degraded, and formation of a desired pattern cannot be achieved.

Additionally, as shown in FIG. 78, if region 701ab which is not etched due to the remaining defect is generated partially at the light transmitting portion, the shape of transfer pattern will be deformed.

More particularly, phases of exposure light transmitted through unetched region 701ab and a region 701bb which is removed by etching are reverse. Accordingly, at an interface P between unetched region 701ab and etched region 701bb, a portion having the light intensity of zero is generated due to canceling of exposure light.

The resist on the wafer cannot be exposed with light at such portion having the light intensity of zero. In other words, a region where exposure should have been carried out is generated on the resist, so that a resist pattern having a desired shape cannot be obtained. If patterning of the underlying layer is carried out by using such a resist pattern, an insufficient pattern is formed.

Specially, when a negative type resist in which a portion shielded from light is removed by a developing solution is used, resist will not be left at a portion having the light intensity of zero (region P). That is, a region wherein resist should have been left is generated. When an interconnection layer, for example, is formed by patterning with using such a resist pattern, the interconnection will be cut off at region P having the light intensity of zero, as shown in FIG. 79.

Thus, in addition to deterioration of the resolution, the pattern shape will be deformed when the remaining defects are generated.

SUMMARY OF THE INVENTION

The present invention is made in view of the description in the above [I], [II], and an object of the present invention is to provide a phase shifting mask which facilitates formation of a desired pattern shape, a manufacturing method of such a phase shifting mask, and an exposure method using such a phase shifting mask.

A phase shifting mask according to one aspect of the present invention includes a substrate and a semi-light shielding film. The substrate includes a first and a second light transmitting portion for transmitting exposure light. The second light transmitting portion is adjacent to the first light transmitting portion and transmits the exposure light to have a phase different from that of the exposure light transmitted through the first light transmitting portion. The semi-light shielding film is located at an interface between adjacent first and second light transmitting portions, and is formed at a region of the first and the second light transmitting portion. The first light transmitting portion includes a first transmitting region and a first attenuated transmitting region wherein a semi-light shielding film is formed. A light intensity of the exposure light transmitted through the first transmitting region is greater than that of exposure light transmitted through the first attenuated transmitting region. The second light transmitting portion includes a second transmitting region and a second attenuated transmitting region wherein a semi-light shielding film is formed. A light intensity of the exposure light transmitted through the second transmitting region is greater than that of the exposure light transmitted through the second attenuated transmitting region. Transmittance of the semi-light shielding film is at least 3% and not more than 30%.

In the phase shifting mask according to one aspect of the present invention, when a distance between the first and the second transmitting region spaced apart by the semi-light shielding film becomes close and dense (that is, a dense pattern), beams of exposure light transmitted through the first and the second transmitting region are overlapped at an edge portion of an exposure pattern. Since these overlapping beams of exposure light are in different phases, that is, the phases are reversed from each other, the beams of exposure light are canceled with each other in the overlapping portion. Thus, a portion having light intensity of zero is necessarily generated at the edge portion of the exposure pattern, so that a shape of the exposure pattern becomes sharp, thus improving a resolution.

In the meantime, the semi-light shielding film has transmittance of at least 3% and not more than 30% so that exposure light can be transmitted to a certain extent. In other words, the exposure light is also transmitted through the first and second attenuated transmitting region. Thus, even if a distance between the first and the second transmitting regions spaced apart by the semi-light shielding film becomes large so that either one of the transmitting regions (for example, the first transmitting region) is isolated to be an isolated pattern, the exposure light transmitted through the first transmitting region and the exposure light transmitted through the second attenuated transmitting region are overlapped at the edge portion of the exposure pattern. Since phases of these overlapping beams of exposure light are different, that is, the phases are reversed with each other, the beams of exposure light are canceled with each other in the overlapping portion. Consequently, the portion having the light intensity of zero is necessarily be generated at the edge portion of exposure pattern, so that the shape of the exposure pattern becomes sharp, thus achieving improvement of the resolution.

As described above, since a good resolution can be obtained in both the dense pattern and the isolated pattern, a desired pattern shape can easily be formed even if a circuit pattern becomes complex.

It is noted that the intensity of light transmitted through the semi-light shielding film must be adjusted such that a photoresist is not photosensitized, or even after photosensitizing, a predetermined thickness of the photoresist is left. When transmittance of the semi-light shielding film exceeds 30%, the photoresist might be photosensitized by the light transmitted through the semi-light shielding film. Therefore, transmittance of the light semi-light shielding film has to be not more than 30%.

In the meantime, if the intensity of light transmitted through the semi-light shielding film is too weak, the effect of obtaining a sharp exposure pattern by virtue of overlapping of light which is out of phase with the light transmitted through the semi-light shielding film cannot be achieved. When transmittance of the semi-light shielding film becomes less than 3%, the above effect cannot be achieved because the light transmitted through the semi-light shielding film is too weak. Therefore, transmittance of the semi-light shielding film has to be not less than 3%.

In a phase shifting mask according to a preferred aspect of the present invention, a substrate includes a stepped portion of a predetermined height which is constructed by a surface of a first light transmitting portion and a surface of a second light transmitting portion. The stepped portion of the substrate is covered by a semi-light shielding film. A sidewall of the stepped portion of the substrate is in a shape having substantially the same radius of curvature as the height of the stepped portion.

In a phase shifting mask according to one preferred aspect of the present invention, the sidewall of the stepped portion of the substrate is in the shape having substantially the same radius of curvature as the height of the stepped portion. In other words, a slope of the sidewall of the stepped portion is gentle. Therefore, even when the semi-light shielding film is formed on the stepped portion, a favorable adherence of the semi-light shielding film to the substrate can be obtained.

Also, since the sidewall of the stepped portion is gentle, trapping of a foreign object at a bottom of the stepped portion during cleaning can be prevented.

Therefore, a defect is unlikely to generate in the phase shifting mask, thus facilitating formation of a desired pattern shape.

In a phase shifting mask according to another preferred aspect of the present invention, a substrate includes a first film, and a second film which is formed on the first film and made of a material having an under etching characteristic different from that of the first film, wherein a surface of a first light transmitting portion is formed by a surface of the first film, and a surface of a second light transmitting portion is formed by a surface of the second film.

In a phase shifting mask according to another preferred aspect of the present invention, the substrate includes first and second films which are respectively made by materials having different under etching characteristics. Thus, during etching of the second film for forming a stepped portion on the substrate surface, the first film serves as an etching stopper layer. Accordingly, controllability of the height of the stepped portion formed on the substrate surface becomes favorable, thus facilitating formation of the stepped portion having the predetermined height. Therefore, controllability of a phase shifting angle of the first and the second light transmitting portion can be very much improved, so that a desired pattern shape can be easily formed.

A phase shifting mask according to another aspect of the present invention includes a substrate and a light shielding film. The substrate includes a first light transmitting portion through which exposure light is transmitted, and a second light transmitting portion. The second light transmitting portion serves to convert a phase of exposure light transmitted therethrough into a reverse phase with respect to a phase of exposure light which is transmitted through the first light transmitting portion. In the meantime, a stepped portion having a predetermined height is provided by a surface of the first light transmitting portion and a surface of the second light transmitting portion. The light shielding film is provided to cover such a stepped portion of the substrate for intercepting exposure light such that predetermined regions of the first and the second light transmitting portion are exposed. A sidewall of the stepped portion of the substrate is at its bottom portion in a shape having substantially the same radius of curvature as the height of the stepped portion.

In the phase shifting mask according to another aspect of the present invention, the sidewall of the stepped portion of the substrate is in the shape having substantially the same radius of curvature as height of the stepped portion. In other words, a slope of the sidewall of the stepped portion is gentle. Thus, even when the light shielding film is formed on the stepped portion, adherence of the light shielding film to the substrate is favorable.

Also, since the sidewall of the stepped portion is gentle, trapping of a foreign object generating during cleaning at the bottom of the stepped portion can be prevented.

Therefore, a defect is unlikely to generate in the phase shifting mask, thus facilitating formation of a desired pattern shape.

In a phase shifting mask according to one preferred aspect of the present invention, a substrate includes a first film, and a second film formed on the first film and made of a material having an under etching characteristic different from that of the first film, wherein a surface of a first light transmitting portion is formed by a surface of a first film and a surface of a second light transmitting portion is formed by a second film.

In a phase shifting mask according to one preferred aspect of the present invention, the substrate includes first and second films which are respectively made of materials having different under etching characteristics. Thus, during etching of the second film for forming a stepped portion on the substrate surface, the first film serves as an etching stopper layer. Accordingly, controllability of the stepped portion formed on the substrate surface is improved, thus facilitating formation of the stepped portion having a predetermined height. Therefore, controllability of a phase shifting angle of the first and second light transmitting portions is very much improved, so that a predetermined pattern shape can easily be formed.

An exposure method using a phase shifting mask according to one aspect of the present invention includes the following steps.

Exposure light is emitted from a light source and directed to a phase shifting mask. The exposure light is then transmitted through the phase shifting mask and is projected onto a photoresist placed on a film to be etched, so that a predetermined region of the photoresist is photosensitized. The phase shifting mask includes a substrate and a semi-light shielding film. The substrate includes a first light transmitting portion for transmitting exposure light and a second light transmitting portion. The second light transmitting portion is provided adjacent to the first light transmitting portion, and transmits the exposure light to have a phase different from that of the exposure light transmitted through the first light transmitting portion. The semi-light shielding film is disposed at an interface between adjacent first and second light transmitting portions, and is formed in a region of the first and the second light transmitting portion. The first light transmitting portion includes a first transmitting region and a first attenuated transmitting region wherein the semi-light shielding film is formed. Intensity of exposure light transmitted through the first transmitting region is greater than that of the exposure light transmitted through the first attenuated transmitting region. The second light transmitting portion includes a second transmitting region and a second attenuated transmitting region wherein the semi-light shielding film is formed. Intensity of the exposure light transmitted through the second transmitting region is greater than that of the exposure light transmitted through the second attenuated transmitting region. Transmittance of the light shielding film is at least 3% and not more than 30%.

In the exposure method using the phase shifting mask according to one aspect of the present invention, the phase shifting mask capable of achieving a good resolution in both a dense pattern and an isolated pattern is used. Formation of a desired pattern shape can easily be achieved even in a circuit pattern wherein the dense pattern and the isolated pattern are mingled.

Also, since both the dense pattern and the isolated pattern can be formed by the phase shifting mask, it is possible to set coherency σ to be an appropriate value. Thus, a phase shifting effect becomes more conspicuous, so that the resolution is improved and a desired pattern shape can easily be formed.

An exposure method using a phase shifting mask according to another aspect of the present invention includes the following steps.

First, exposure light is emitted from a light source and is directed to a phase shifting mask. The exposure light transmitted through the phase shifting mask is then projected onto a photoresist placed on a film to be etched, so that a desired region of the photoresist is photosensitized. The phase shifting mask includes a substrate and a light shielding film. The substrate includes a first light transmitting portion for transmitting exposure light, and a second light transmitting portion. The second light transmitting portion transmits the exposure light in a phase different from that of the exposure light transmitting through the first light transmitting portion. A stepped portion having a predetermined height is formed by surfaces of the first and second light transmitting portions. The light shielding film is provided to cover the stepped portion of the substrate and to expose predetermined regions of the first and the second light transmitting portion. Also, a sidewall of the stepped portion of the substrate is in a shape having substantially the same radius of curvature as the height of the stepped portion.

In the exposure method using the phase shifting mask according to another aspect of the present invention, the phase shifting mask in which adherence of the light shielding film to the substrate is favorable and trapping of a foreign object is unlikely to occur is used. Therefore, an unsatisfactory pattern shape due to defects is unlikely to generate, so that a desired pattern shape can easily be formed.

A manufacturing method of a phase shifting mask according to one aspect of the present invention includes the followings steps.

First, a substrate is formed which includes a first light transmitting portion for transmitting exposure light, and a second light transmitting portion which is provided adjacent to the first light transmitting portion, and transmits the exposure light to have a phase different from that of the exposure light transmitted through the first light transmitting portion. Then, a semi-light shielding film is formed on the substrate so as to be located at an interface between adjacent first and second light transmitting portions. The first light transmitting portion includes a first transmitting region and a first attenuated transmitting region wherein the semi-light shielding film is formed, intensity of the exposure light transmitted through the first transmitting region being greater than that of the exposure light transmitted through the first attenuated transmitting region, and the second light transmitting portion includes a second transmitting region and a second attenuated transmitting region wherein a semi-light shielding film is formed, intensity of the exposure light transmitted through the second transmitting region being greater than that of the exposure light transmitted through the second attenuated transmitting region. Transmittance of the semi-light shielding film is set at least 3% and not more than 30%.

In the manufacturing method of the phase shifting mask according to one aspect of the present invention, a good resolution can be obtained in both a dense pattern and an isolated pattern, whereby the phase shifting mask capable of easily achieving a desired pattern shape can be manufactured.

A manufacturing method of a phase shifting mask according to another aspect of the present invention includes the following steps.

First, a mask having a predetermined shape is formed on a main surface of a substrate which transmits exposure light. By isotropically etching the main surface of the substrate using a mask, a first light transmitting portion, and a second light transmitting portion which transmits the exposure light to have a phase different from the exposure light transmitted through the first light transmitting portion are formed on the substrate. Then, a light shielding film which intercepts the exposure light is formed on the main surface of the etched substrate so as to expose predetermined regions of the first and the second light transmitting portion.

In the manufacturing method of the phase shifting mask according to the present invention, the main surface of the substrate is isotropically etched. Thus, a sidewall of the stepped portion formed through the etching has a gentle slope compared to the case when anisotropic etching is carried out. Accordingly, even when the light shielding film is formed on the stepped portion, adherence of the light shielding film to the substrate is still favorable.

Also, trapping of a foreign object generated during cleaning at the bottom of the stepped portion can be prevented by virtue of a gentle sidewall of the stepped portion.

In the meanwhile, during anisotropic etching, an etchant spreads under a mask or the like. Therefore, even if a remaining defect is generated on the substrate, the etchant spreads under the remaining defect during etching to remove that portion of the substrate. The remaining defect is then fallen from the substrate because the underlying layer is lost. In this respect, even if the remaining defect exists, a portion which is left without being etched will not be generated in a region to be removed by etching on the substrate after isotropic etching of the substrate. When the resist film placed on the wafer is exposed by using the thus formed phase shifting mask, degradation of the resolution and deformation of the pattern shape are prevented.

As described above, defects are unlikely to generate in the phase shifting mask. Therefore, the phase shifting mask in which a desired pattern shape can easily be formed is manufactured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a graph showing a relationship between exposure amount for exposing a resist and thickness of a resist film left after development.

FIG. 31A is a cross sectional view schematically showing a structure of the phase shifting mask according to the third embodiment of the present invention when used to form a pattern in which the dense pattern and the isolated pattern are mingled.

FIG. 31B is a cross sectional view schematically showing a resist pattern formed by the phase shifting mask shown in FIG. 31A.

FIG. 32A is a cross sectional view schematically showing a structure of the phase shifting mask according to the third embodiment of the present invention when used to a pattern in which the dense pattern and the isolated pattern are mingled.

FIG. 32B is a cross sectional view schematically showing a resist pattern formed by the phase shifting mask shown in FIG. 32A.

DESCRIPTION OF THE PREFERRED EMBODIMENTS

Embodiments of the present invention will be described below in conjunction with the drawings.

Embodiment 1

Figure 1:
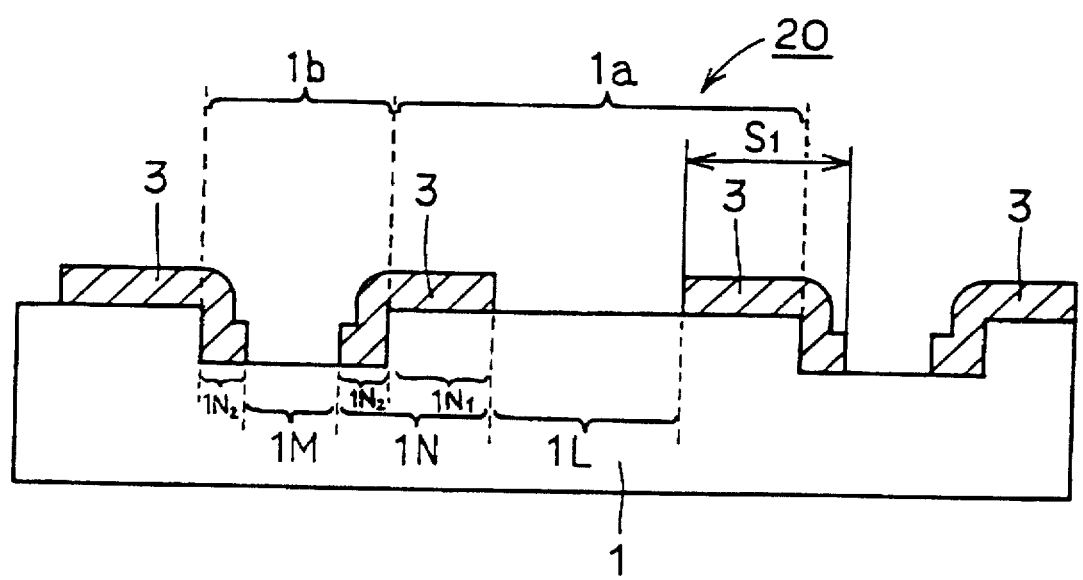
FIG. 1 is a cross sectional view schematically showing a structure of a phase shifting mask according to a first embodiment of the present invention.

Referring to FIG. 1, a phase shifting mask 20 according to a first embodiment includes a quartz substrate 1 and a semi-light shielding film 3. A trench is formed on the surface of quartz substrate 1. A region in which the trench is not formed serves as a first light transmitting portion 1a, while a region in which the trench is formed serves as a second light transmitting portion 1b. These first and second light transmitting portions 1a and 1b are structured such that phases of exposure light transmitted through respective portions are out of phase by 180° with each other.

First light transmitting portion 1a includes a first transmitting region 1L which is not covered by semi-light shielding film 3, and a first attenuated transmitting region $1N_1$ which is covered by semi-light shielding film 3. Second light transmitting portion 1b includes a second light transmitting region 1M which is not covered by semi-light shielding film 3, and a second attenuated transmitting region $1N_2$ which is covered by semi-light shielding film 3.

A sidewall of the trench is substantially perpendicular to a bottom wall thereof. A stepped portion is formed on the sidewall of the trench. Semi-light shielding film 3 is formed on the surface of quartz substrate 1 so as to cover the stepped portion and to expose predetermined regions of first and second light transmitting portions 1a and 1b.

Semi-light shielding film 3 has transmittance of at least 3% and not more than 30%. The phases of exposure light after transmitting through semi-light shielding film 3 are converted by 0°, 360°, 360°×2, ..., 360°×n, ... with respect to phases of exposure light before transmitting through the film. In other words, semi-light shielding film 3 does not convert the phase of transmitted light substantially, and maintains phases of exposure light before and after transmission through semi-light shielding film 3 substantially equal.

As a material of semi-light shielding film 3, chromium (Cr) film, for example, is used. A specific thickness of the chromium film will be about 200Å when an i-line is used as exposure light, and about 150Å when KrF excimer laser is used, providing 10% of exposure light is transmitted. Also it is sufficient to set the thickness of the chromium film within a range of 100Å–300Å, considering the wavelength of exposure light used and transmittance to be set.

A depth of the trench (or a height of the stepped portion) will be about 4050Å when the i-line is used as exposure light and about 2720Å when KrF excimer laser is used, in order to provide a phase difference between first and second light transmitting portions 1a and 1b.

Next, a manufacturing method of a phase shifting mask of this embodiment will be described.

Figure 2:
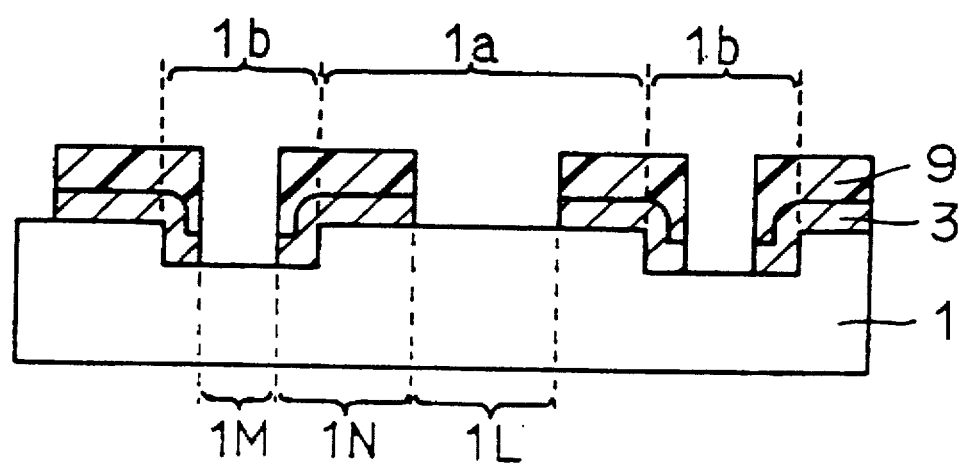
FIG. 2 is a schematic cross sectional view showing a manufacturing method of the phase shifting mask according to the first embodiment of the present invention.

Referring to FIG. 2, after a quartz substrate having a thickness of 6.35mm is prepared, a trench is formed on the surface of quartz substrate 1 by the step as in the conventional method. Quartz substrate 1, and first and second light transmitting portions 1a and 1b are thus formed.

A chromium film having a thickness of 100Å–300Å is then formed on the entire surface so as to cover the trench. A resist pattern 9 having a desired shape is formed on the surface of chromium film 3. Using resist pattern 9 as a mask, chromium film 3 is subjected to anisotropic etching, thereby forming a semi-light shielding film 3 which forms the sidewall of the trench and exposes desired regions of first and second light transmitting portions 1a and 1b. After that, resist pattern 9 is removed, whereby phase shifting mask 20 as shown in FIG. 1 is completed.

In the phase shifting mask of this embodiment, a high resolution can be obtained in both a dense pattern and an isolated pattern, for which a detailed description will be given below.

Figure 3A:
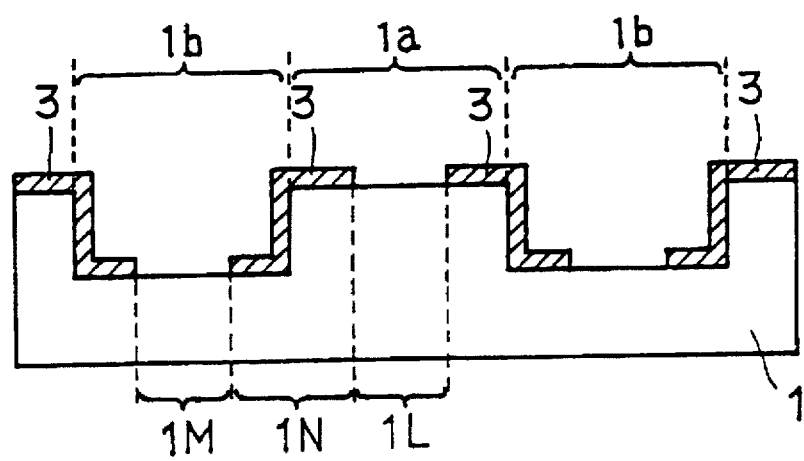
FIG. 3A is a schematic cross sectional view of the phase shifting mask of the present invention for illustrating that a good resolution can be obtained in a dense pattern in the phase shifting mask according to the first embodiment of the present invention.
Figure 3B:
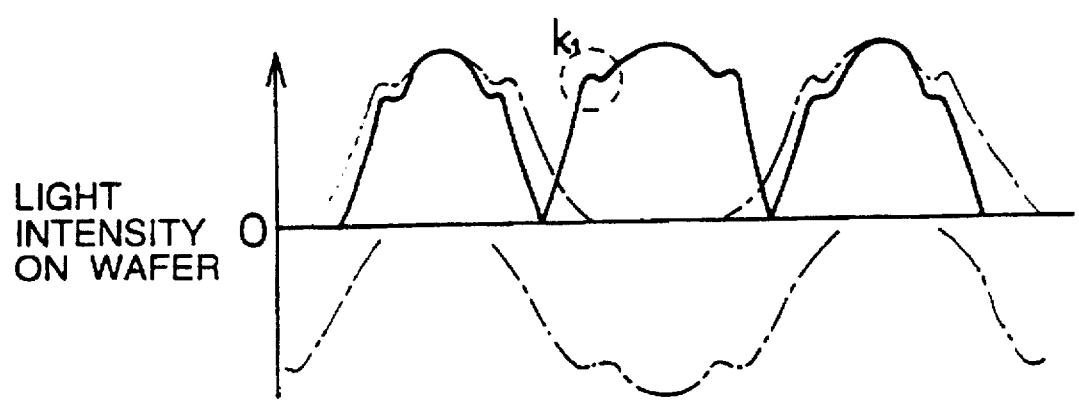
FIG. 3B is a graph showing light intensity on a wafer when the phase shifting mask shown in FIG. 3A is used.

Referring to FIGS. 3A and 3B, adjacent transmitting regions, (regions not covered by semi-light shielding film 3) 1L and 1M are disposed in proximity to each other in the case of the dense pattern. Accordingly, beams of exposure light transmitted through each of adjacent transmitting regions 1L and 1M are overlapped at an edge of an exposure pattern, as shown by a dash-dot line in the figure. Since these overlapping beams of exposure light are out of phase with each other, that is, the phases are reverse, they will be canceled with each other. Thus, light intensity of the exposure pattern necessarily includes a portion having a light intensity of zero at the edge portion (between adjacent exposure patterns) as shown by a solid line in the figure. Therefore, a sharp exposure pattern can be obtained at the edge portion, whereby a sufficient difference of light intensity can be provided to improve the resolution.

It is noted that in a region $k_1$ indicated in the figure, light intensity of the exposure pattern is enhanced locally because light shielding film 3 does not intercept the exposure light completely and transmits the exposure light to a certain extent.

As for the isolated pattern, referring to FIG. 4, adjacent transmitting regions are spaced apart by a considerable distance from each other. Accordingly, beams of exposure light transmitted through each of adjacent transmitting regions 1M and 1M (or 1M and 1L, or 1L and 1L) are not overlapped. In the meantime, in this embodiment, transmission of semi-light shielding film 3 is set at least 3% and not more than 30% so as to permit transmission of some of the exposure light. This means that attenuated transmitting region (a region covered by light shielding film 3) 1N also transmits the exposure light to a certain extent. Therefore, beams of exposure light transmitted through transmitting region 1M and attenuated transmitting 1N are overlapped at an edge portion of an exposure pattern. Since these overlapping beams of exposure light are out of phase with each other, they are canceled with each other. Thus, as can be seen by a solid line in the figure, light intensity of the exposure pattern necessarily includes a portion having a light intensity of zero at the edge portion thereof, whereby a sharp exposure pattern can be obtained at the edge portion to improve the resolution.

As described above, a good resolution can be obtained in both the dense pattern and the isolated pattern in the phase shifting mask of this embodiment. Therefore, even if the dense pattern and the isolated pattern are mingled on the same mask, a high resolution can be obtained upon application of this embodiment. In other words, a desired pattern shape can easily be formed even though a circuit pattern becomes smaller and increases its complexity.

It should be noted that in the phase shifting mask of this embodiment, the intensity of exposure light should be adjusted such that a photoresist is not photosensitized by the exposure light transmitted through semi-light shielding film 3, or a certain thickness of the photoresist is left after development even when the photoresist is photosensitized.

Referring to FIG. 5, in the case of exposure of a usual hole pattern, exposure light is directed to a mask with such amount of light as is about 3–4 times the exposure amount by which no resist is left after development (point R in the figure). If transmittance of semi-light shielding film 3 has to be 30%, a thickness of the photoresist becomes zero due to the exposure light transmitted through semi-light shielding film 3, or the photoresist is reduced and cannot be used as an etching mask. In this respect, transmittance of semi-light shielding film 3 has to be 30% or less.

Figure 4A:
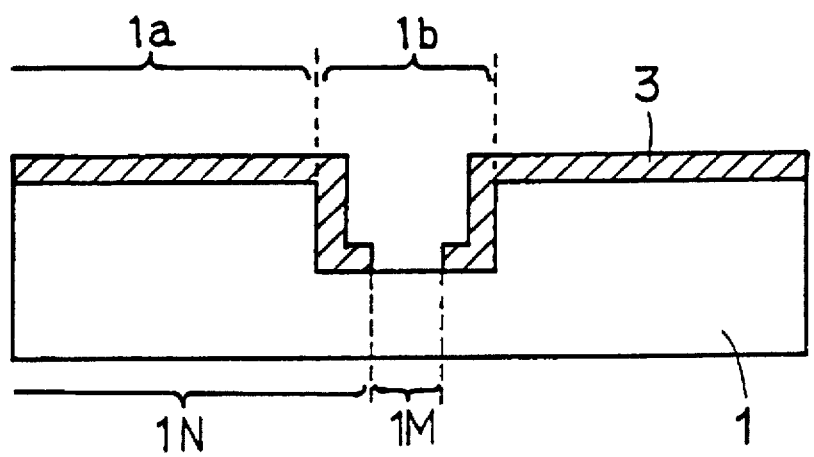
FIG. 4A is a schematic cross sectional view of the phase shifting mask of the present invention for illustrating that a good resolution can be obtained in an isolated pattern in the phase shifting mask according to the first embodiment of the present invention.
Figure 4B:
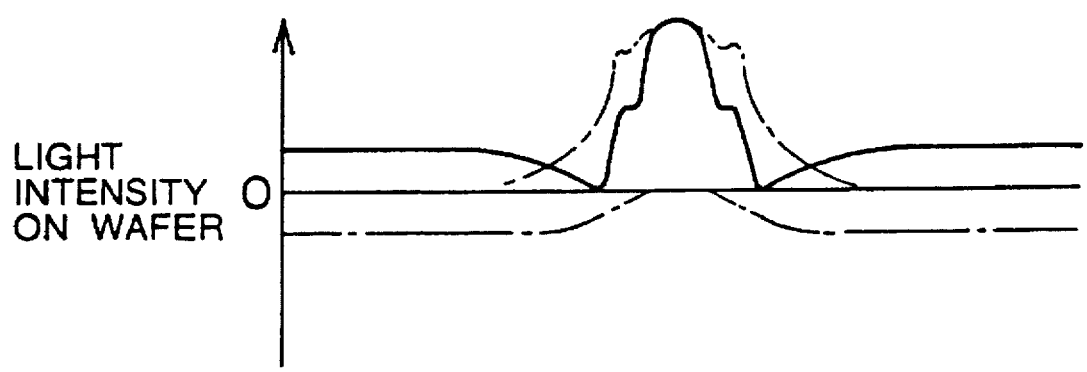
FIG. 4B is a graph showing light intensity on a wafer when the phase shifting mask shown in FIG. 4A is used.

In the meanwhile, if intensity of light transmitted through semi-light shielding film 3 is too weak, an effect of obtaining a sharp exposure pattern by virtue of overlapping of beams of exposure light having different phases, as discussed with FIGS. 4A and 4B, cannot be provided. More particularly, if transmittance of semi-light shielding film 3 is made less than 3%, light intensity of the exposure light transmitted through semi-light shielding film 3 becomes too small, prohibiting the above effect. Therefore, semi-light shielding film 3 must have transmittance of 3% or more.

Next, a specific structure of a phase shifting mask when the phase shifting mask of this embodiment is applied to a pattern in which the dense pattern and the isolated pattern are mingled, and a mingled pattern formed by such a phase shifting mask will be described below.

Figure 6A:
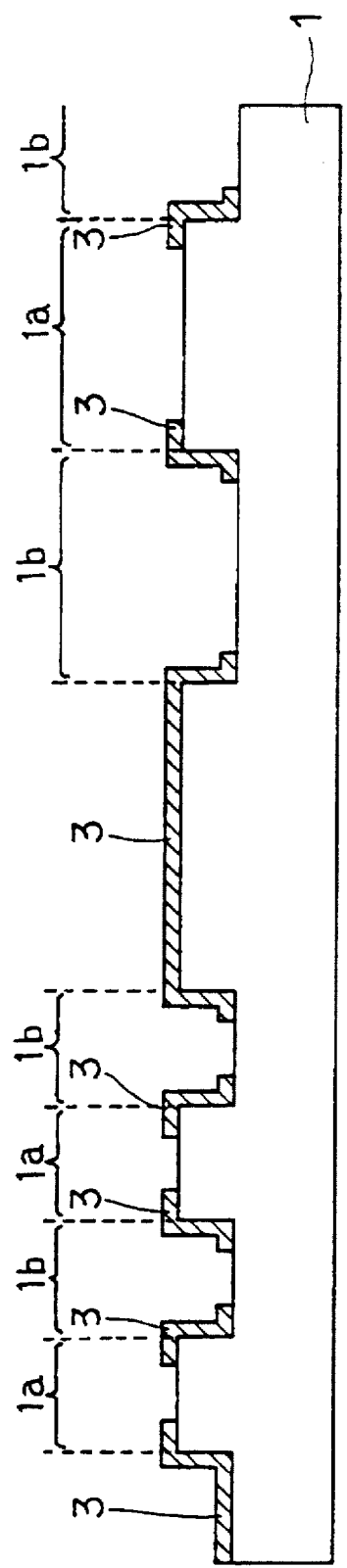
FIG. 6A is a cross sectional view schematically showing a structure of the phase shifting mask according to the first embodiment of the present invention when used to a pattern in which the dense pattern and the isolated pattern are mingled.
Figure 7A:
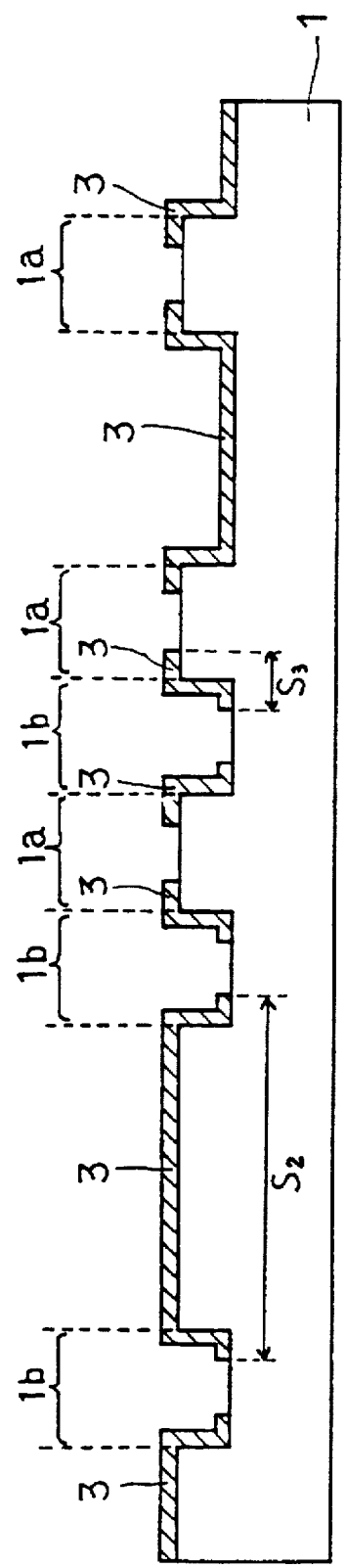
FIG. 7A is a cross sectional view schematically showing a structure of the phase shifting mask according to the first embodiment of the present invention when used to a pattern in which the dense pattern and the isolated pattern are mingled.

Referring to FIG. 6A or FIG. 7A, a plurality of trenches are formed spaced apart a predetermined distance from each other on the surface of quartz substrate 1. A region in which the trench is not formed serves as first light transmitting portion 1a, while a region in which the trench is formed serves as second light transmitting portion 1b. Light shielding film 3 is patterned to cover the sidewall of the trench and to expose predetermined regions of first and second light transmitting portions 1a and 1b.

Figure 6B:
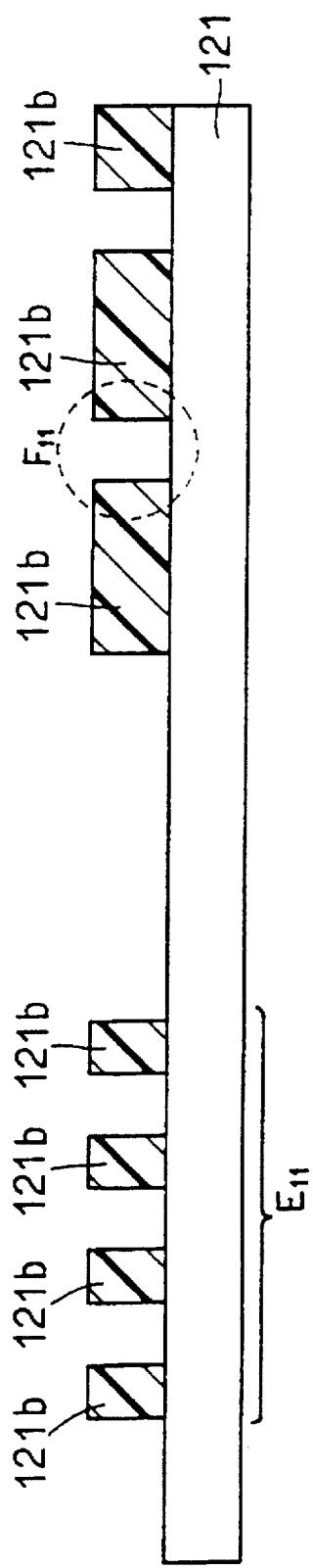
FIG. 6B is a cross sectional view schematically showing a resist pattern formed by the phase shifting mask shown in FIG. 6A.
Figure 7B:
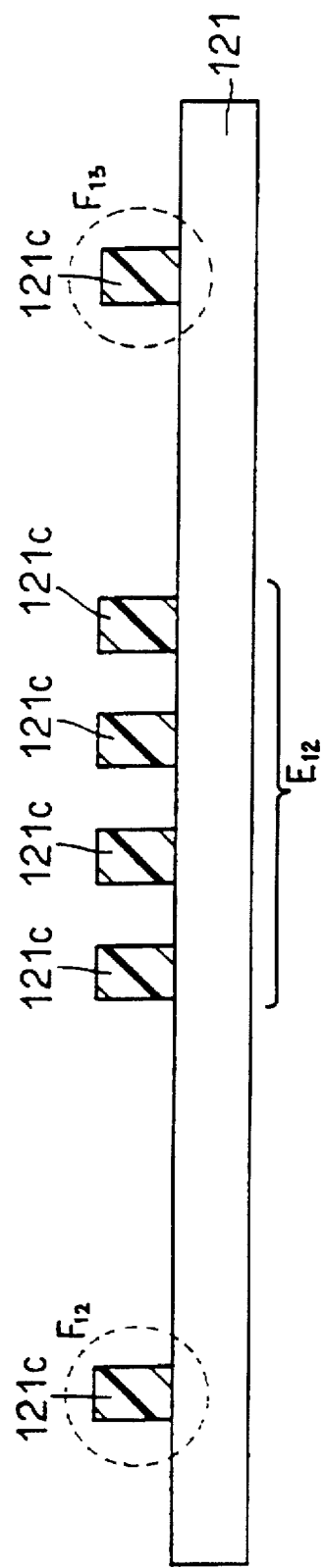
FIG. 7B is a cross sectional view schematically showing a resist pattern formed by the phase shifting mask shown in FIG. 7A.

Referring to FIG. 6B or FIG. 7B, when the photoresist on a wafer 121 is exposed with light and developed with using the above-described phase shifting mask, each resist pattern 121b, 121c is obtained. It is noted that a negative photoresist is used in both cases. A region $E_{11}$ of resist pattern 121b and a region $E_{12}$ of resist pattern 121c serve as the dense pattern. A region $F_{11}$ of resist pattern 121b is a so-called aperture of the isolated pattern, while regions $F_{12}$ and $F_{13}$ of resist pattern 121c are so-called remaining portions of the isolated pattern.

Now, a relationship between a distance $S_1$ between adjacent transmitting regions 1L and 1M shown in FIG. 1 and a degree of overlapping of exposure patterns by exposure light transmitted through both regions 1L and 1M will be discussed below.

Figure 8:
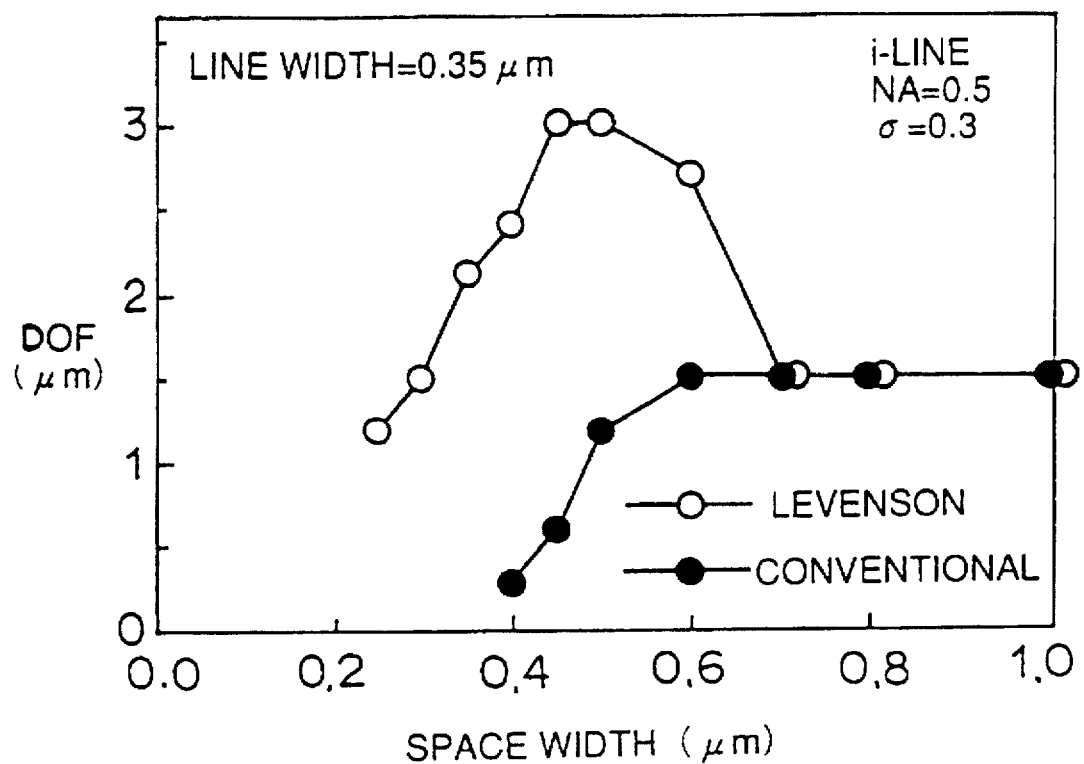
FIG. 8 is a graph showing a relationship between size of a light shielding film on a wafer and the depth of focus plotted for a phase shifting mask of the Levenson system and an ordinary mask.

FIG. 8 is a graph included in J. Miyazaki et al. "The effect of duty ratio of line and space in phase-shifting lithography" SPIE vol. 1927, 55, pp. 677–685. This graph is concerned with the phase shifting mask of the Levenson system and the conventional mask, showing a relationship between a dimension of the light shielding portion on the wafer (Space Width) and a depth of focus (DOF).

In FIG. 8, the depth of focus is plotted on the ordinate, while the distance between adjacent transmitting regions on the wafer (that is, a dimension of the light shielding portion irradiated onto the wafer) is plotted on the abscissa. As can be seen from the figure, when the dimension of the light shielding portion of the mask is not more than 0.7µm on the wafer, the depth of focus of the phase shifting mask of the Levenson system is greater than that of the conventional mask. However, when the dimension is 0.7µm or more, the phase shifting mask of the Levenson system and the conventional mask will have approximately the same depth of focus, diminishing a difference of the two.

Since the i-line which has a wavelength of 0.365µm is used in this experiment, the dimension of 0.7µm equals about two times (2λ) a wavelength λ of the i-line. In other words, unless the dimension of the light shielding portions irradiated onto the wafer is 2λ or less, the phase shifting effect of the Levenson system cannot be provided.

Figure 45:
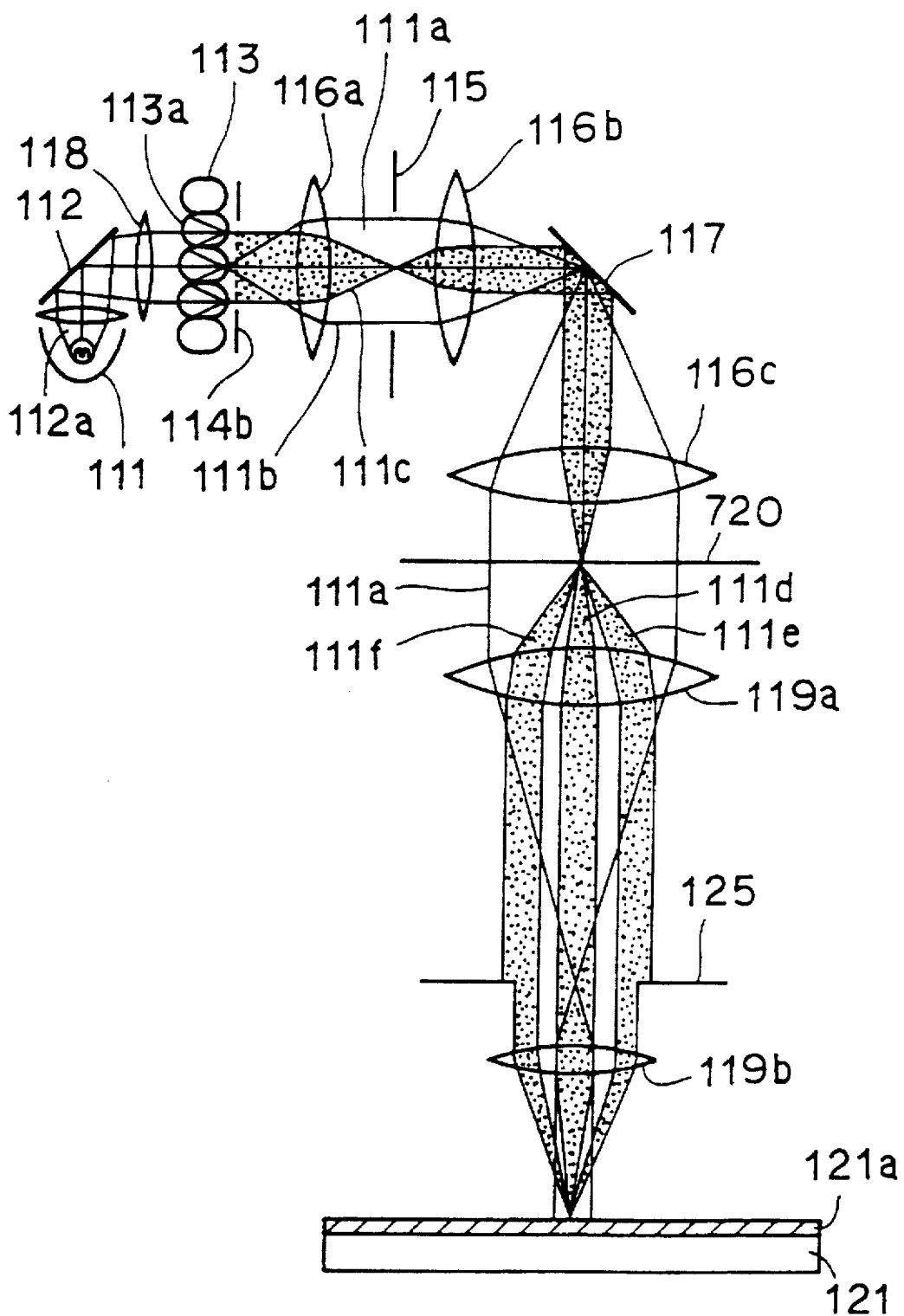
FIG. 45 is a schematic view of an exposure method using a conventional phase shifting mask.
Figure 46A:
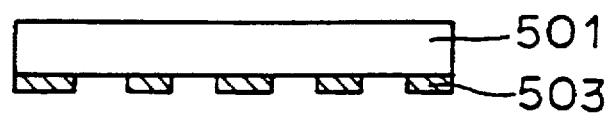
FIG. 46A is a cross sectional view of a mask when a conventional photomask is used.
Figure 46B:
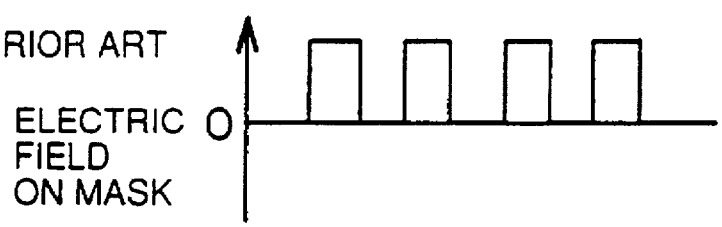
FIG. 46B is a graph showing an electric field on the mask when the photomask shown in FIG. 46A is used.
Figure 46C:
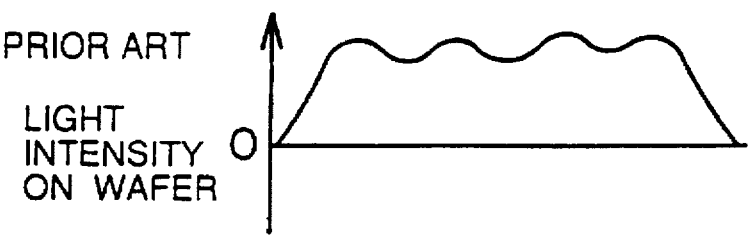
FIG. 46C is a graph showing light intensity on the wafer when the photomask shown in FIG. 46A is used.
Figure 47A:
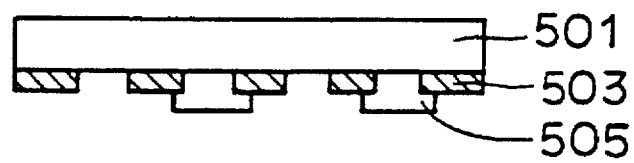
FIG. 47A is a cross sectional view of a mask when a phase shifting mask of the Levenson system is used.
Figure 47B:
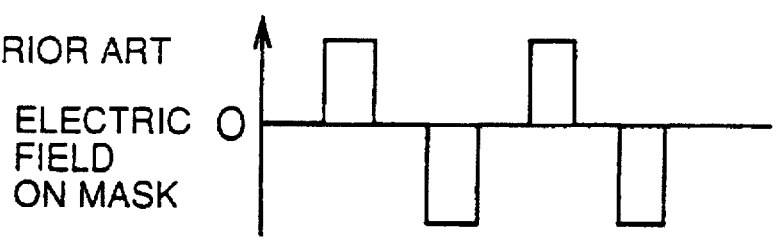
FIG. 47B is a graph showing an electric field of the mask when the phase shifting mask shown in FIG. 47A is used.
Figure 47C:
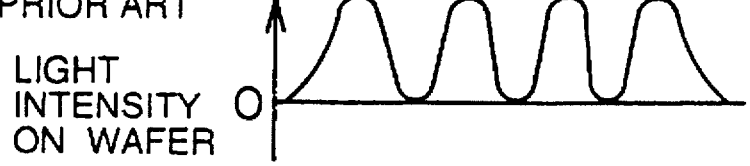
FIG. 47C is a graph showing light intensity on the wafer when the phase shifting mask shown in FIG. 47A is used.
Figure 48A:
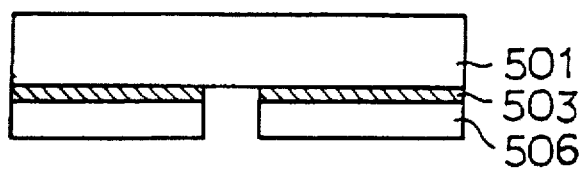
FIG. 48A is a cross sectional view of a mask when a phase shifting mask of the halftone system is used.
Figure 48B:
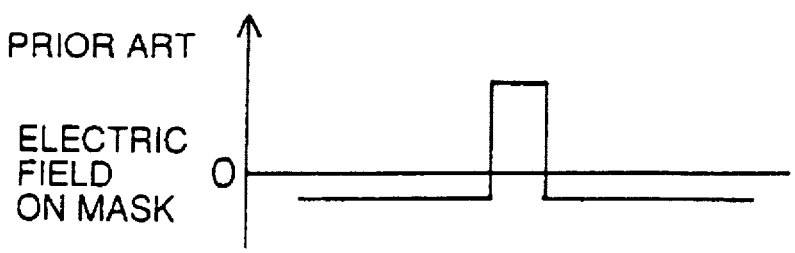
FIG. 48B is a graph showing an electric field on the mask when the phase shifting mask shown in FIG. 48A is used.
Figure 48C:
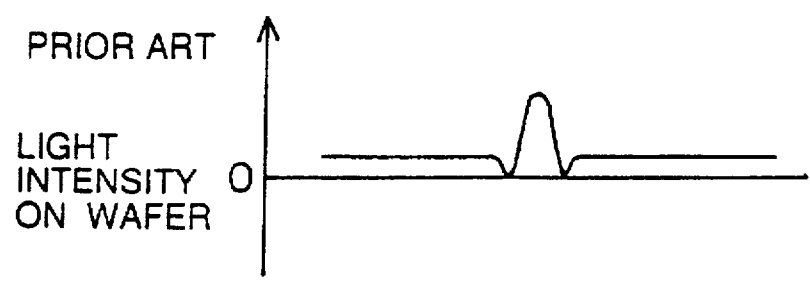
FIG. 48C is a graph showing light intensity on the wafer when the phase shifting mask shown in FIG. 48A is used.

If it is desired that the dimension of the light shielding portion irradiated onto the wafer is converted to the dimension of the light shielding portion on the phase shifting mask, a magnification of the projection optical system shown in FIG. 45 should be considered. Referring to FIG. 45, a circuit pattern of a phase shifting mask 720 is usually reduced by a predetermined magnification by the projection optical system to be directed onto a photoresist 121a. Suppose that the circuit pattern of phase shifting mask 720 is reduced by five times to be directed onto photoresist 121a, the dimension of 5µm on phase shifting mask 720 would be the dimension of 1µm on photoresist 121a. Therefore, assuming that the dimension of the light shielding portion irradiated onto a wafer 121 reduced by n times by the projection optical system is 2λ, the dimension of the light shielding portion on the phase shifting mask is 2λ×n.

Figure 49:
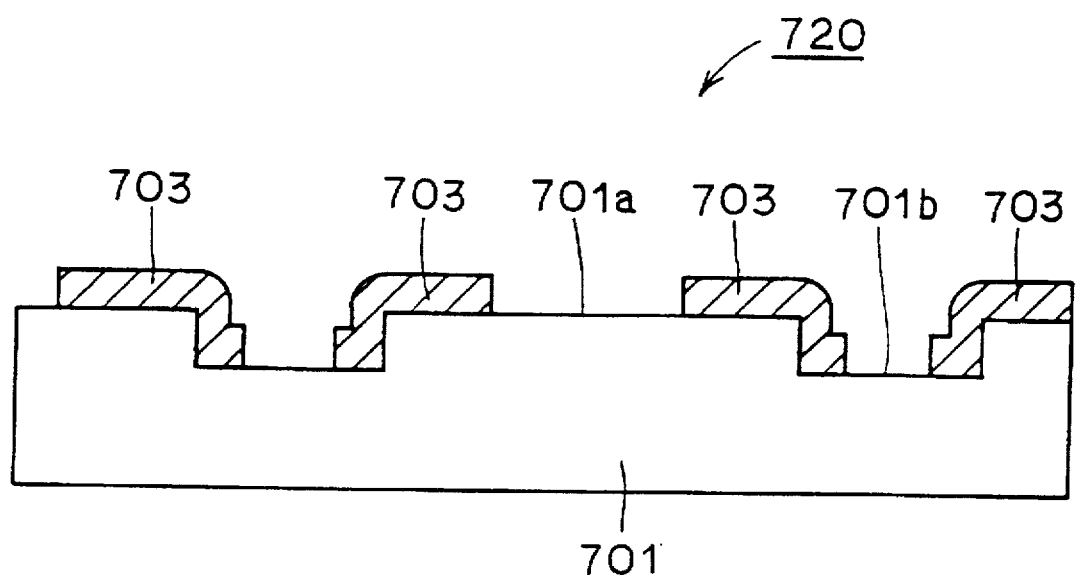
FIG. 49 is a cross sectional view schematically showing a structure of a conventional phase shifting mask.
Figure 50:
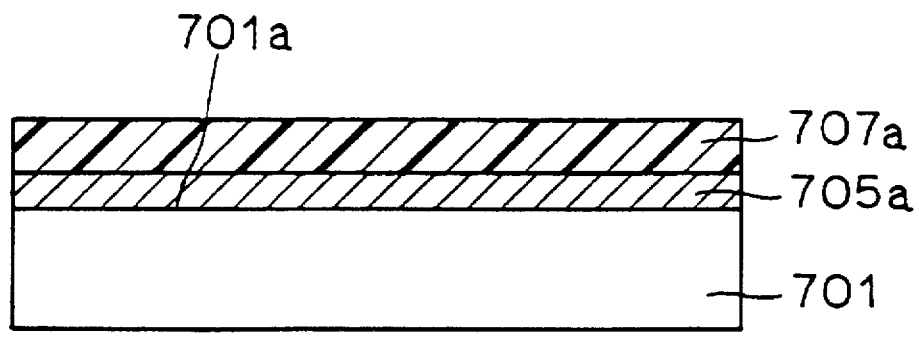
FIGS. 50-57 are cross sectional views schematically showing in this order a manufacturing method of the conventional phase shifting mask.
Figure 51:
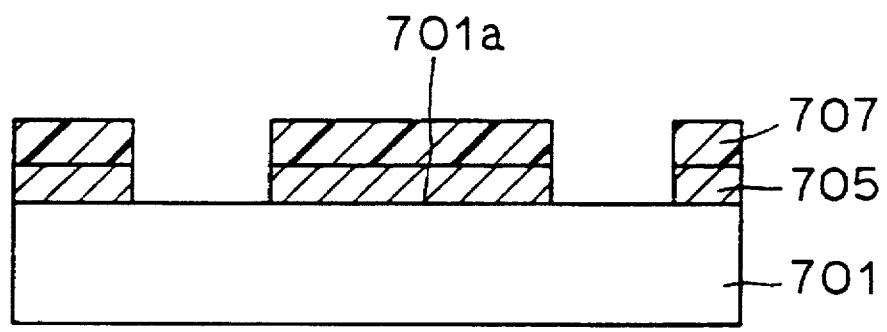
Figure 52:
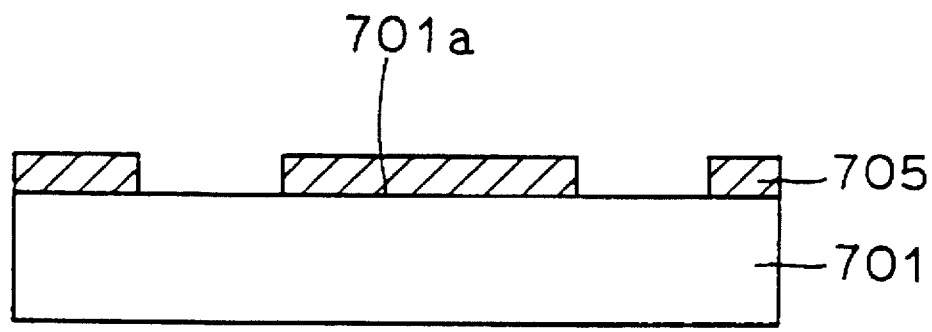
Figure 53:
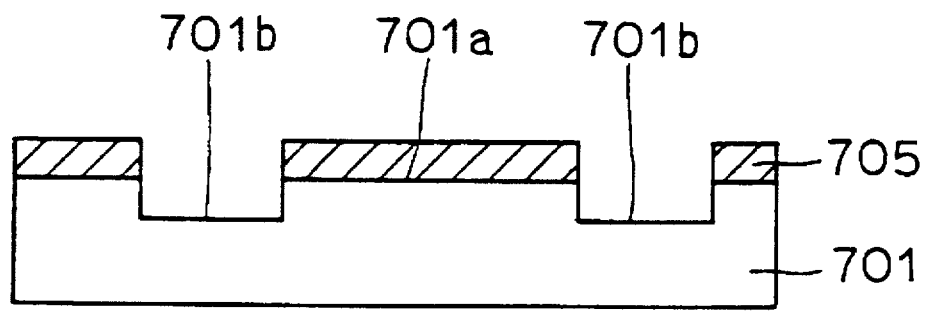
Figure 54:
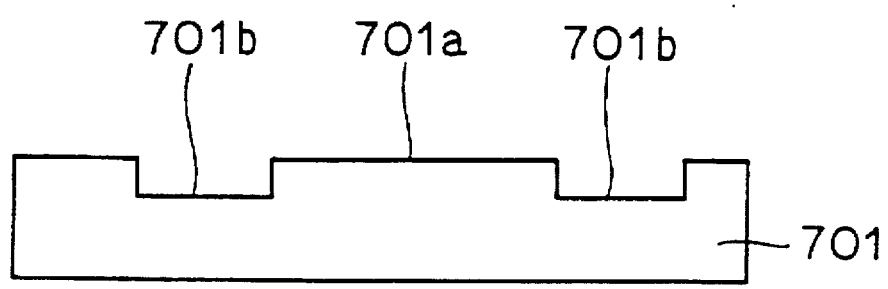
Figure 55:
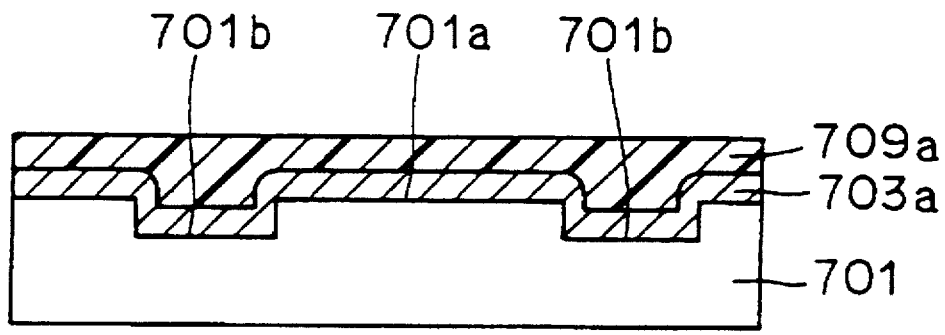
Figure 56:
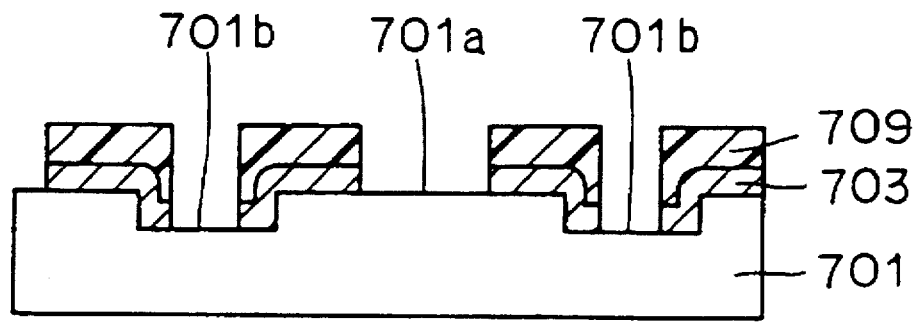
Figure 57:
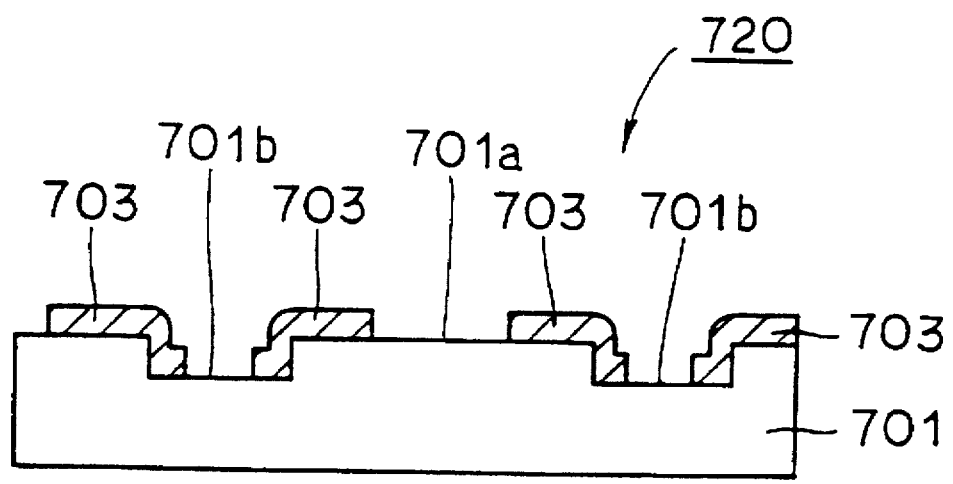
Figure 58:
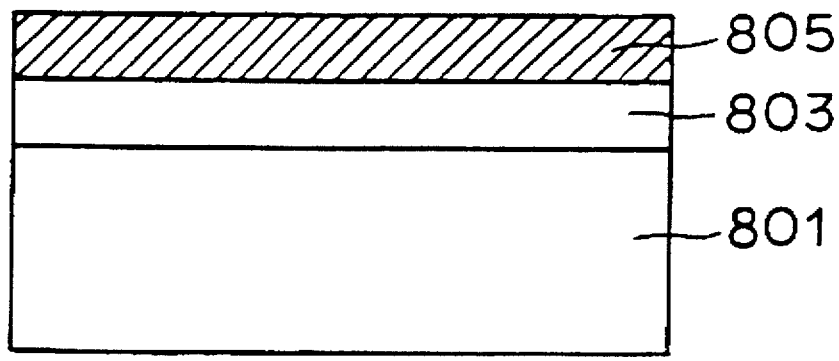
FIGS. 58-61 are cross sectional views schematically showing in this order a manufacturing method of a phase shifting mask disclosed in prior art documents.
Figure 59:
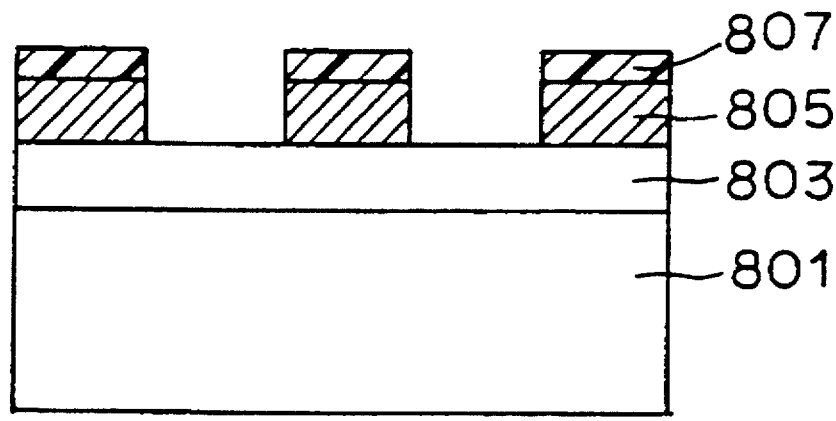
Figure 60:
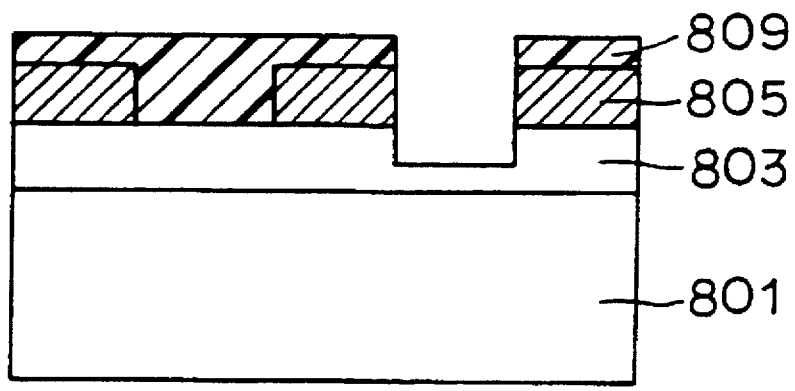
Figure 61:
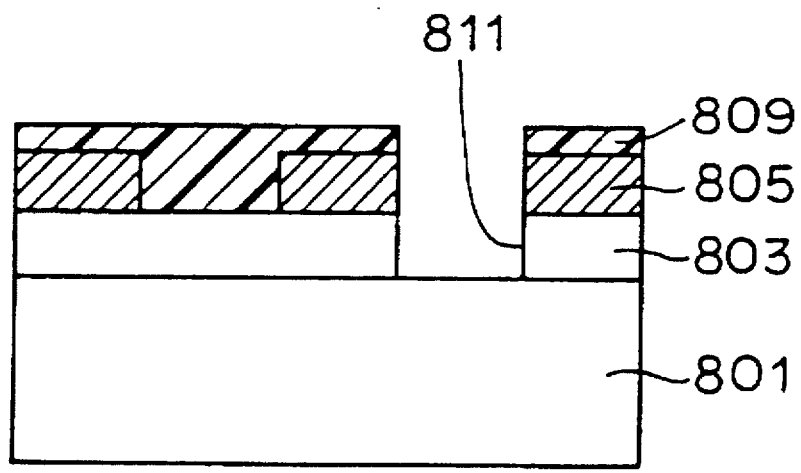
Figure 62:
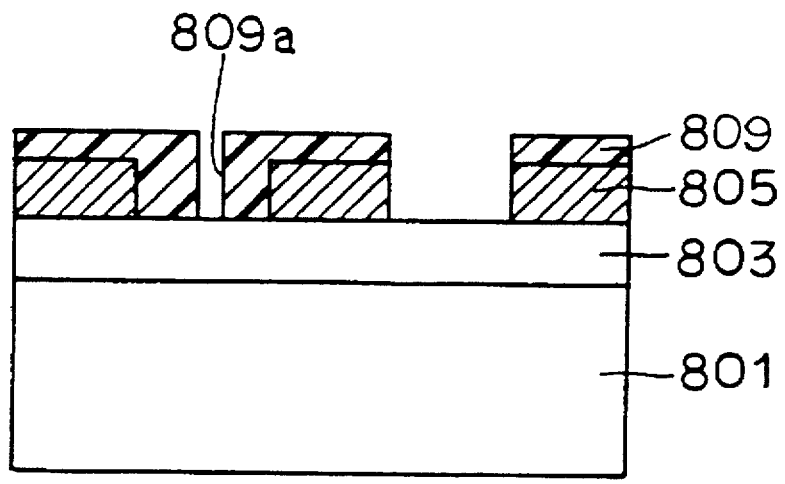
FIGS. 62 and 63 are cross sectional views for illustrating a disadvantage in the manufacturing method of the phase shifting mask disclosed in prior art documents.
Figure 63:
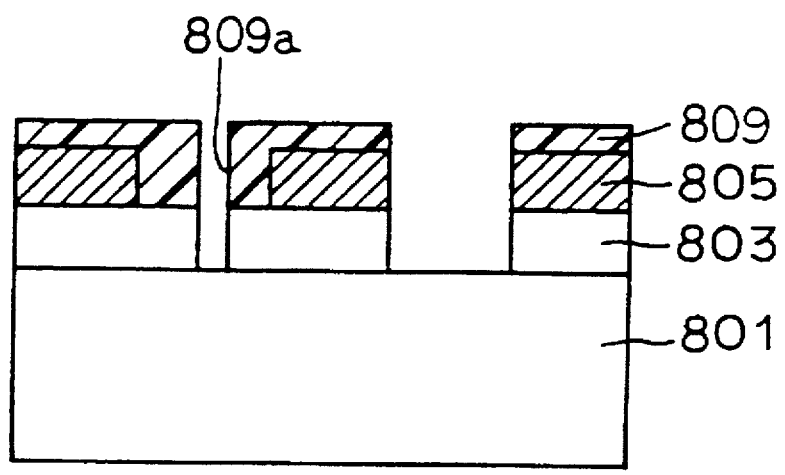
Figure 64:
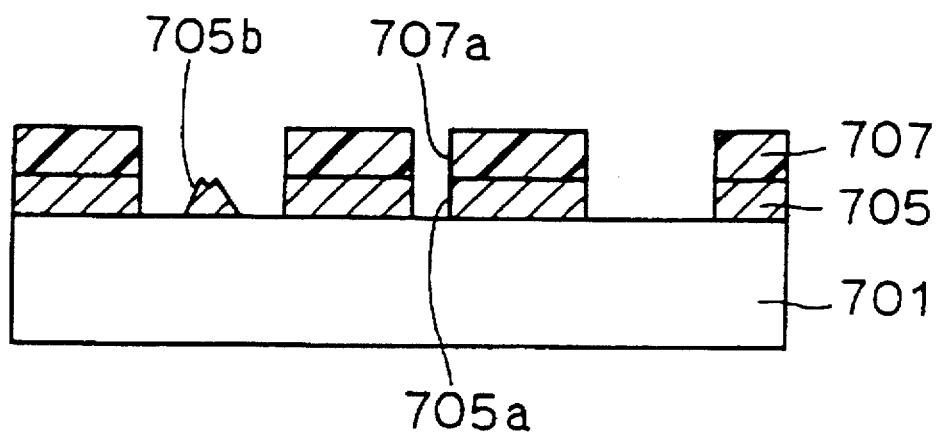
FIGS. 64 and 65 are cross sectional views for illustrating an advantage of the manufacturing method of the conventional phase shifting mask.
Figure 65:
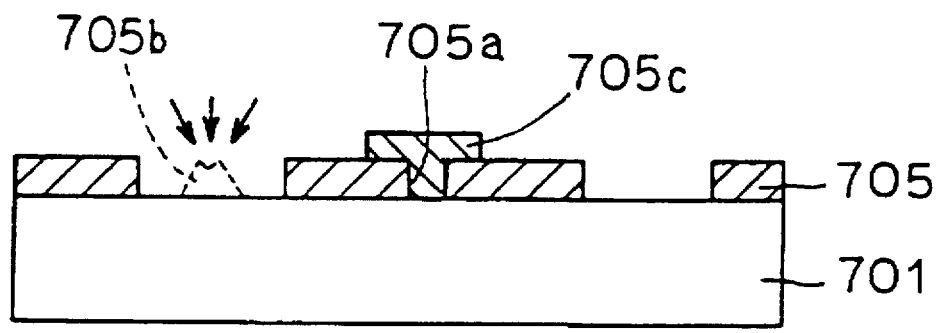
Figure 66:
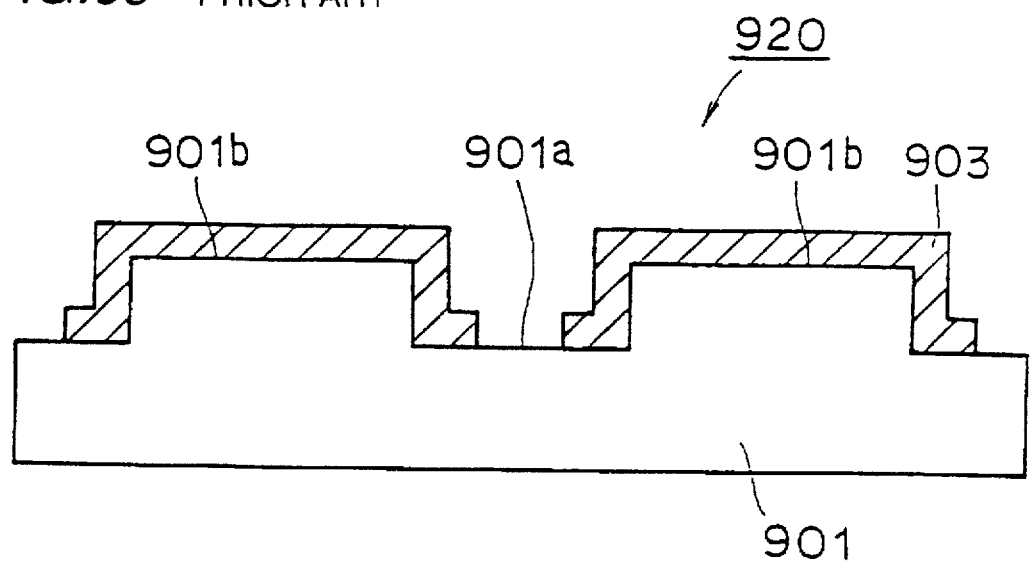
FIG. 66 is a cross sectional view schematically showing a structure of the conventional phase shifting mask of the halftone system.
Figure 67A:
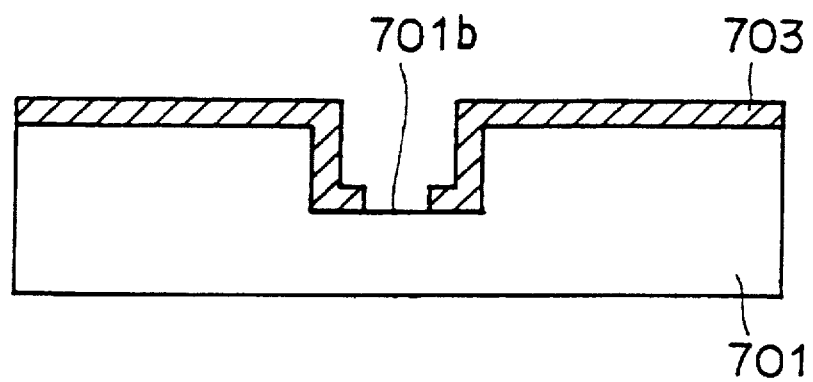
FIG. 67A is a cross sectional view showing the conventional phase shifting mask of the Levenson system for illustrating a disadvantage when an isolated pattern is formed by using the conventional phase shifting mask of the Levenson system.
Figure 67B:
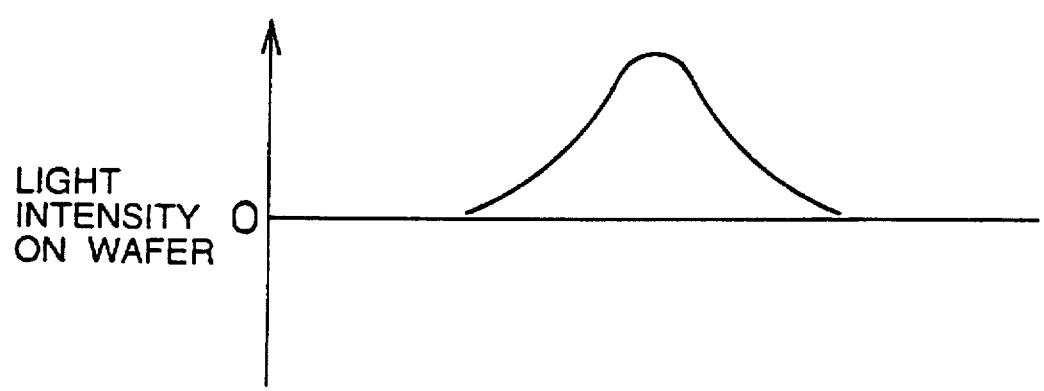
FIG. 67B is a graph showing light intensity on the wafer when the phase shifting mask shown in FIG. 47A is used.
Figure 68A:
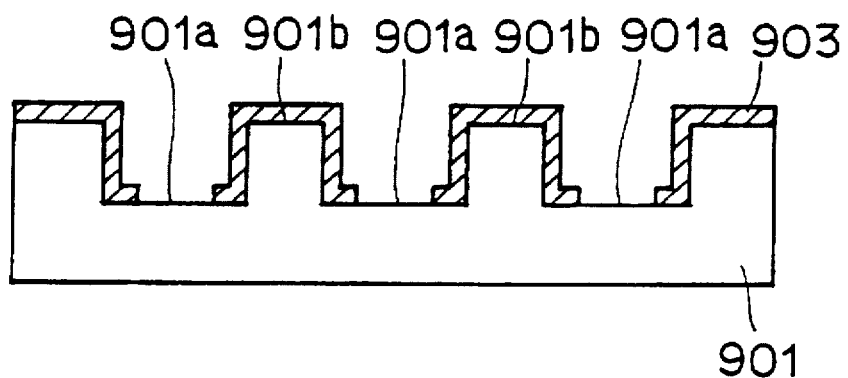
FIG. 68A is a cross sectional view schematically showing the conventional phase shifting mask of the halftone system for illustrating a disadvantage when a dense pattern is formed by using the conventional phase shifting mask of the halftone system.
Figure 68B:
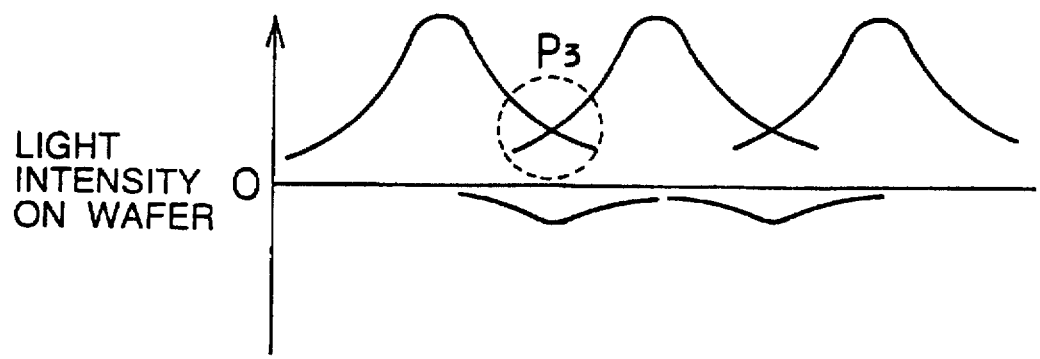
FIG. 68B is a graph showing light intensity on the wafer when the phase shifting mask shown in FIG. 68A is used.
Figure 69:
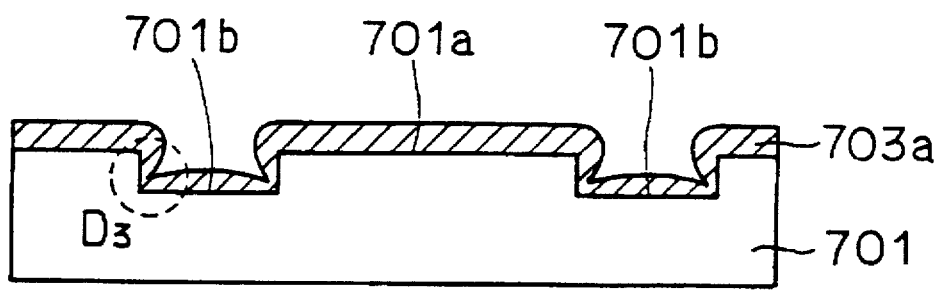
FIG. 69 is a cross sectional view schematically showing the conventional phase shifting mask for illustrating degradation of adherence of the light shielding film.
Figure 70:
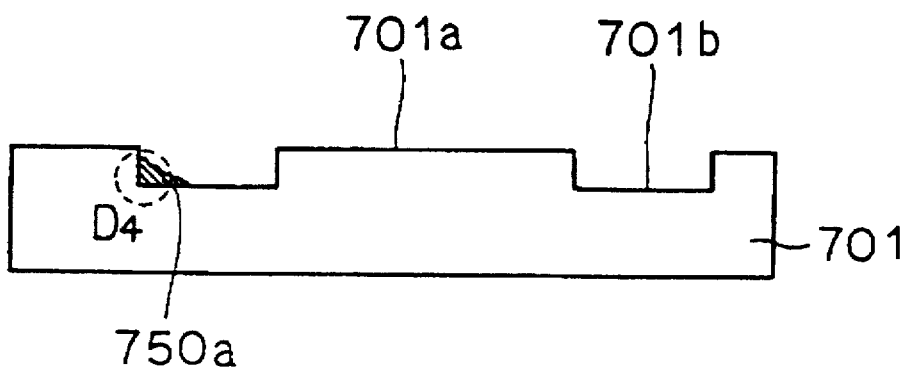
FIGS. 70-73 are cross sectional views of the conventional phase shifting mask for illustrating a disadvantage caused by remaining of a foreign object.
Figure 71:
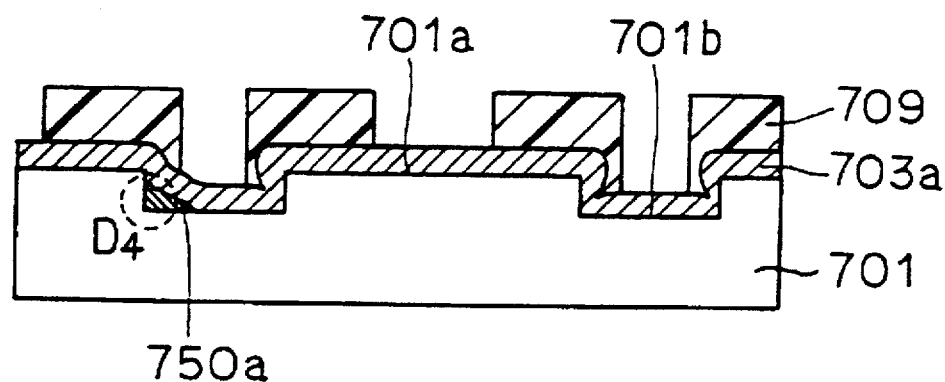
Figure 72:
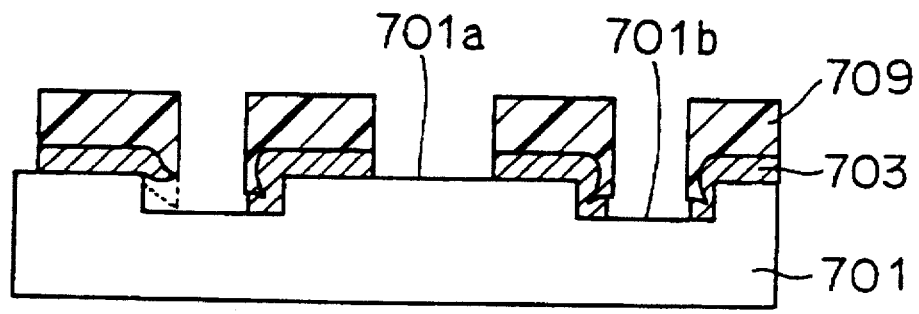
Figure 73:
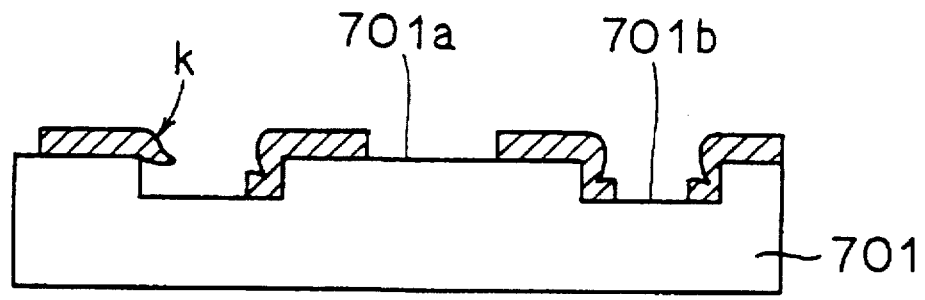
Figure 74:
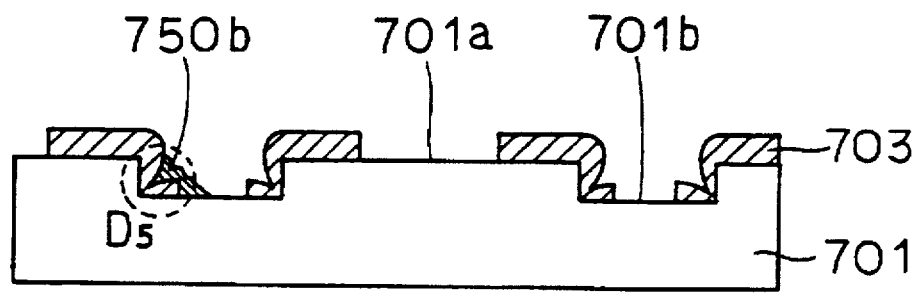
FIG. 74 is a cross sectional view schematically showing the conventional phase shifting mask for illustrating a disadvantage when a foreign object is left on a stepped portion of the light shielding film.
Figure 75:
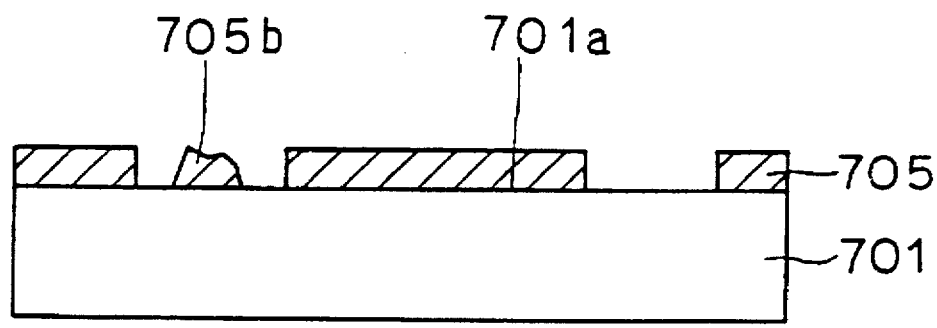
FIGS. 75-77 are cross sectional views of the conventional phase shifting mask for illustrating a disadvantage caused by a remaining defect.
Figure 76:
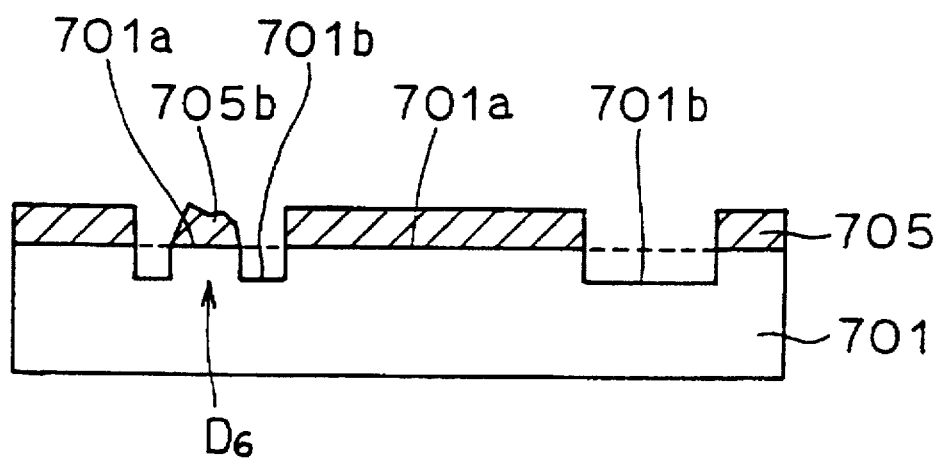
Figure 77:
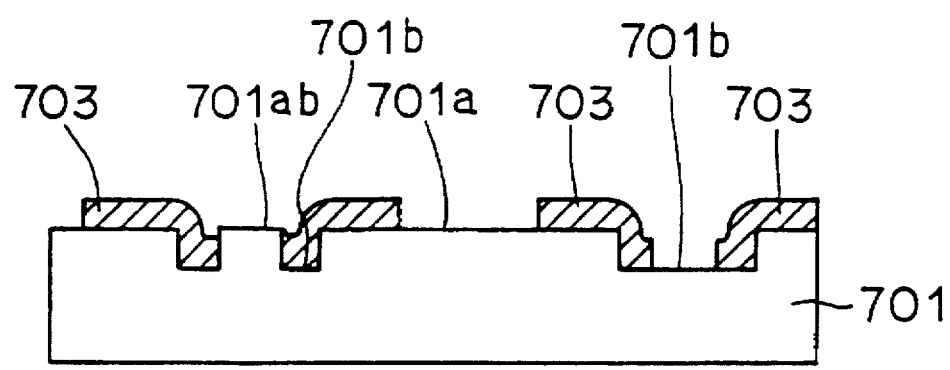
Figure 78:
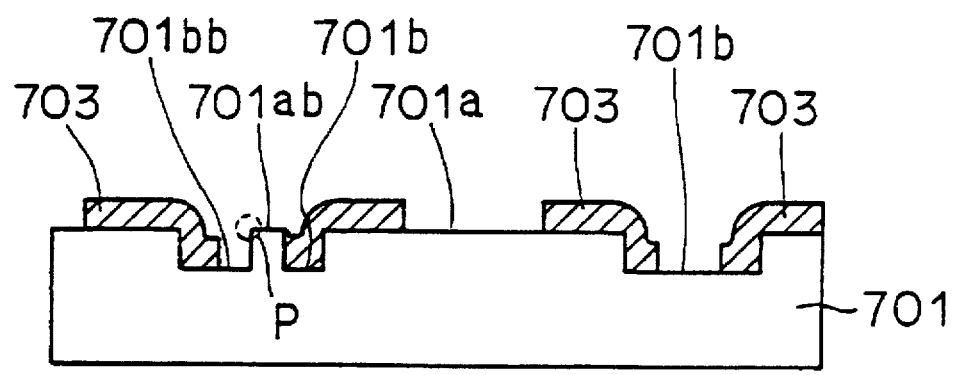
FIG. 78 is a cross sectional view schematically showing the conventional phase shifting mask for illustrating a disadvantage when a remaining defect is partially generated.
Figure 79:
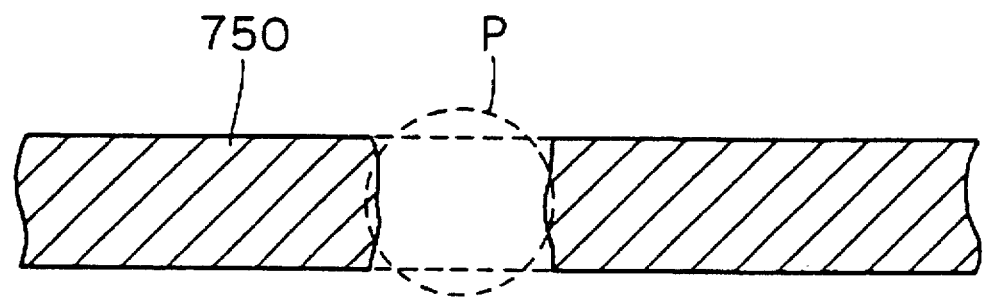
FIG. 79 is a plan view schematically showing a structure of an interconnection layer patterned by a phase shifting mask in which a remaining defect is partially generated.

Thus, in the phase shifting mask of the conventional Levenson system as shown in FIG. 49, the phase shifting effect cannot be provided unless the dimension of the light shielding portion on the phase shifting mask is about 2λ×n or less, for which the description will be given below.

Figure 9A:
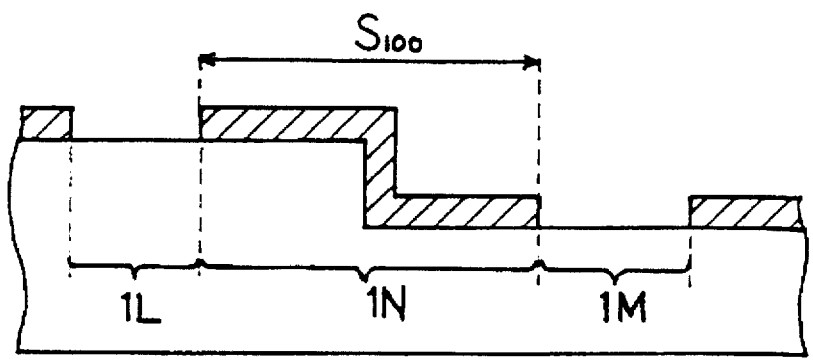
FIG. 9A is a cross sectional view schematically showing an ordinary phase shifting mask of the Levenson system for illustrating a relationship between size of the light shielding film and an exposure pattern.
Figure 9B:
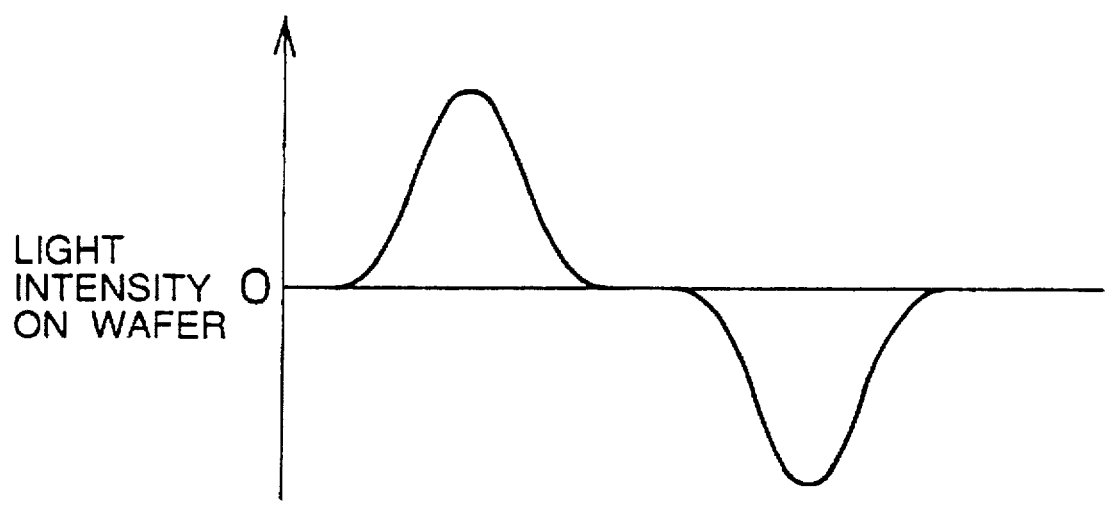
FIG. 9B is a graph showing light intensity when the size of the light shielding portion is greater than $2\lambda xn$.

Referring to FIGS. 9A and 9B, if a dimension $S_{100}$ of attenuated transmitting region 1N exceeds 2λ×n, beams of exposure light transmitted through adjacent transmitting regions 1L and 1M are not overlapped. It is thus considered that the phase shifting effect cannot be provided and the depth of focus becomes similar to that of the conventional mask, if dimension $S_{100}$ of attenuated transmitting region 1N is greater than 2λ×n.

Figure 9C:
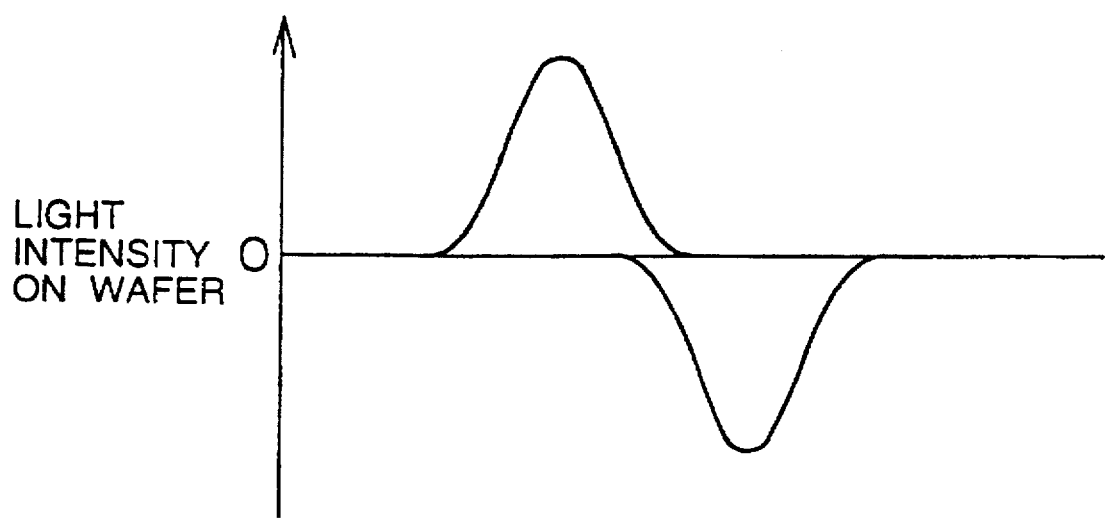
FIG. 9C is a graph showing light intensity when the size of the light intensity when the size of the light shielding portion is smaller than $2\lambda xn$.

On the contrary, referring to FIGS. 9A and 9C, beams of exposure light transmitted through adjacent transmitting regions 1L and 1M are overlapped when the dimension of the attenuated transmitting region 1N is smaller than 2λ×n. Therefore, the phase shifting effect can be provided and the depth of focus is greater than that of the conventional mask.

As described above, it is considered that whether beams of exposure light transmitted through adjacent transmitting regions 1L and 1M are overlapped depends on the dimension of attenuated transmitting region 1N provided between transmitting regions 1L and 1M being greater or smaller than 2λ×n. If this concept is applied to this embodiment, the following is the result.

Referring to FIGS. 3A and 3B, beams of light transmitted through adjacent transmitting regions 1L and 1M are overlapped if the dimension of attenuated transmitting region 1N is smaller than 2λ×n. Therefore, the phase shifting effect of the Levenson system can be obtained.

On the contrary, referring to FIGS. 4A and 4B, beams of exposure light transmitted through adjacent transmitting regions 1L and 1M are not overlapped if the dimension of attenuated transmitting region 1N is greater than 2λ×n. However, beams of exposure light transmitted through transmitted through transmitting region 1M and attenuated transmitting region 1N are overlapped. Therefore, the phase shifting effect of the halftone system can be obtained in this case.

As a result, in the phase shifting mask of this embodiment, the phase shifting effect of the Levenson system can be obtained when dimension $S_{100}$ of attenuated transmitting region 1N is made smaller than 2λ×n, while the effect of the halftone system can be obtained when dimension $S_{100}$ is made larger than 2λ×n.

In this respect, when the circuit pattern in which the dense pattern and the isolated pattern are mingled is formed as shown in FIGS. 7A and 7B, it is sufficient to set dimension $S_3$ of semi-light shielding film 3 smaller than 2λ×n in the dense pattern region $E_{12}$, and set dimension $S_2$ larger than 2λ×n in the isolated pattern region.

Now, an exposure method using the phase shifting mask of this embodiment will be described.

Figure 10:
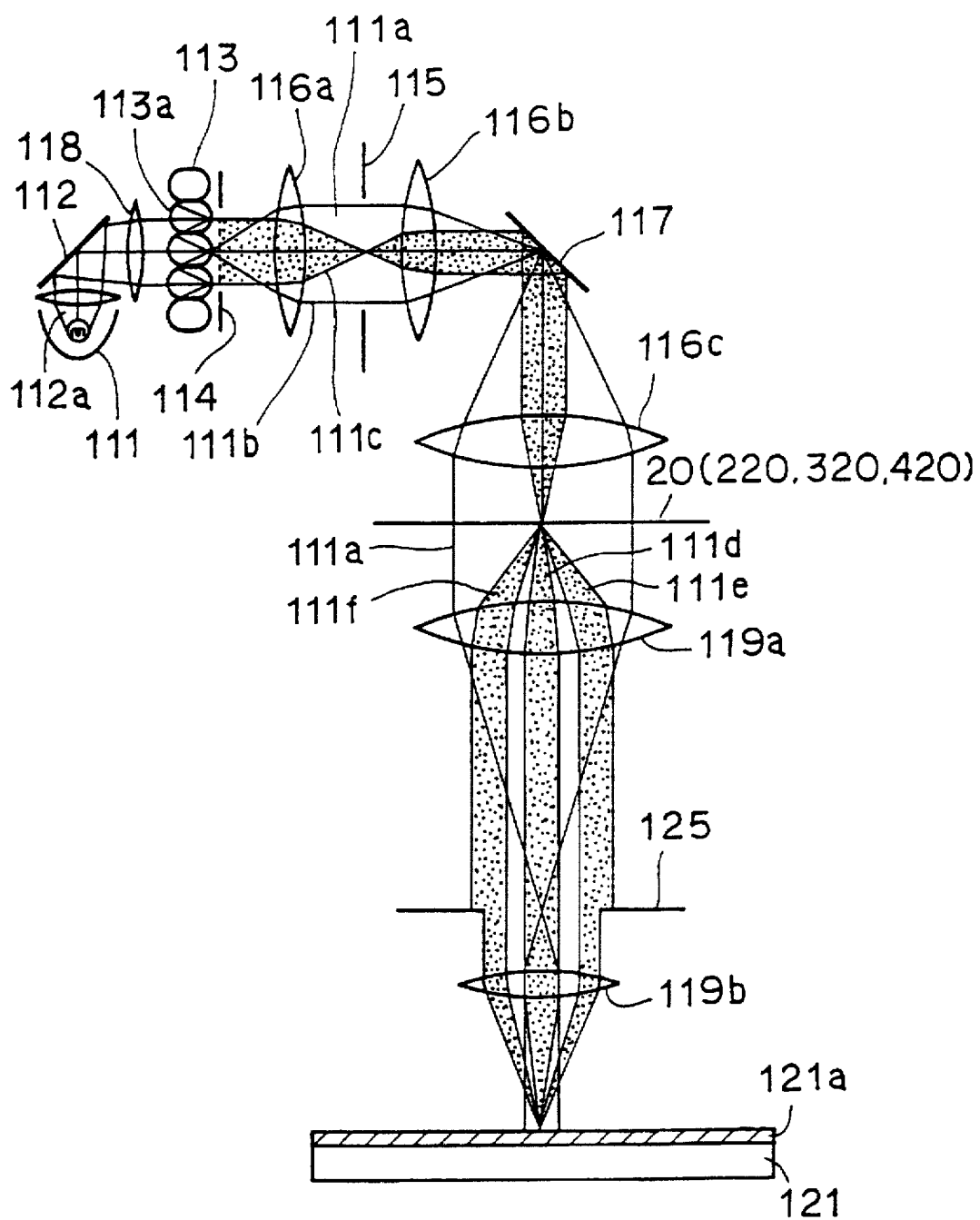
FIG. 10 is a schematic diagram of an optical system for implementing an exposure method using a phase shifting mask according to the first embodiment of the present invention.

Referring to FIG. 10, the exposure method of this embodiment is almost similar to a conventional exposure method except for a mask 20 and a diaphragm 114 used. Diaphragm 114 is different because coherency σ of exposure light used when the phase shifting mask of this embodiment is used is different from that used when a conventional mask is used, for which description will be given below in more detail.

In the phase shifting masks of the Levenson system and the halftone system, a smaller coherency σ is preferred. Coherency σ represents a degree of interference of light, so that the smaller coherency σ, the greater a degree of interference of light, while the greater coherency α, the smaller a degree of interference of light. In other words, since the phase shifting mask is intended to improve a resolution by interference of reverse-phased light, greater degrees of interference of light are preferred. Thus, a smaller coherency σ is preferred when the phase shifting mask is used. In practice, however, coherency σ of the phase shifting mask is about 0.3 because of constraint such as reduction of the amount of exposure light.

On the contrary, smaller interference of light is preferred in the conventional mask, so that a larger coherency σ is preferred. Thus, coherency σ is about 0.6 due to a structural constraint in the conventional mask.

Figure 11:
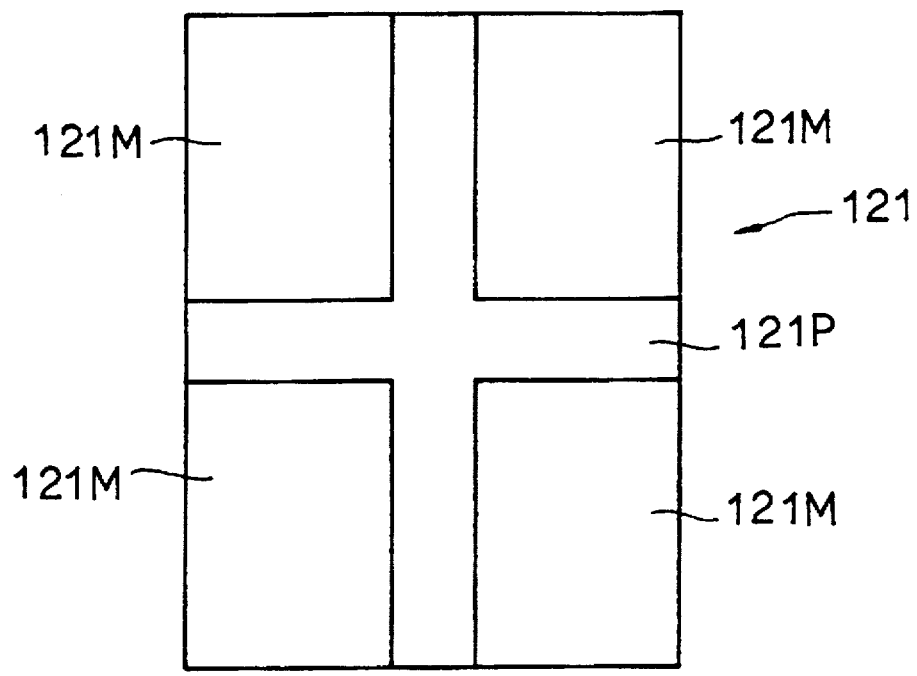
FIG. 11 is a plan view showing a specific circuit pattern including a dense pattern and an isolated pattern.

When a circuit pattern including the dense pattern such as a memory cell region 121M and the isolated pattern such as a peripheral circuit region 121P as shown in FIG. 11 is formed, conventionally the phase shifting mask and the conventional mask are used respectively for the dense pattern and the isolated pattern. In other words, the phase shifting mask and the conventional mask are mingled on the same mask.

In this case, if coherency σ of exposure light irradiated to the mask is 0.3, then a resolution of the conventional mask is decreased, while if coherency σ is 0.6, then a resolution of the phase shifting mask is decreased. Therefore, an intermediate coherency σ of about 0.4–0.5 has been used. However, with this coherency σ (0.4–0.5), a so much high resolution cannot be obtained in both the phase shifting mask and the conventional mask. Therefore, it has been difficult to form a desired pattern shape in the smaller circuit patterns.

In this embodiment, on the contrary, both dense pattern and isolated pattern can be formed by virtue of the phase shifting effect. Thus, even if the pattern includes both dense and isolated patterns, a high resolution can be obtained when coherency σ of the exposure light directed to the mask is set 0.3 which is suitable for the phase shifting mask, whereby a desired pattern shape can easily be obtained.

Coherency σ is determined depending on a diameter of an aperture of diaphragm 114. Since coherency σ of this embodiment is different from that of the conventional example, a structure of diaphragm 114, especially its aperture diameter, is different. Diaphragm 114 of this embodiment will be described below.

Figure 12:
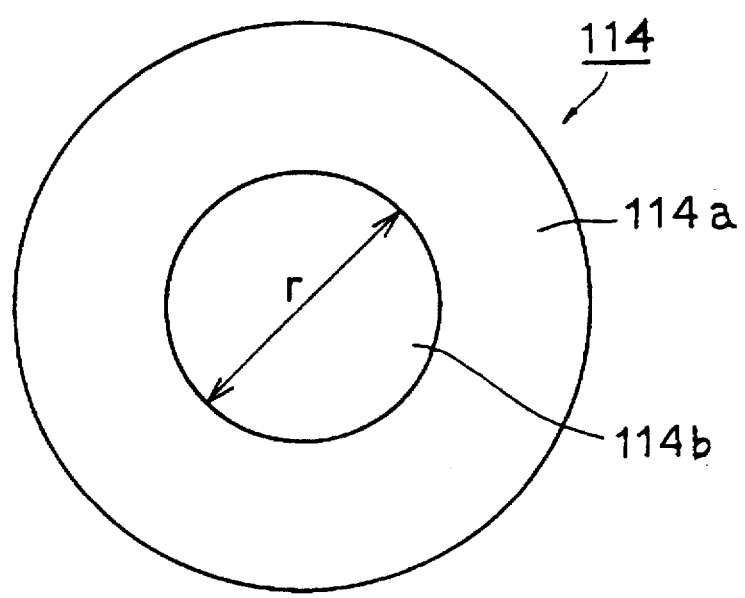
FIG. 12 is a plan view schematically showing a structure of a diaphragm.

Referring to FIG. 12, diaphragm 114 includes a disk 114a having a light-shielding characteristic and an aperture 114b. Exposure light is transmitted through aperture 114b of diaphragm 114. Coherency σ can be made smaller by reducing diameter r of aperture 114b. The larger the diameter r, the greater coherency σ.

Embodiment 2

Figure 13:
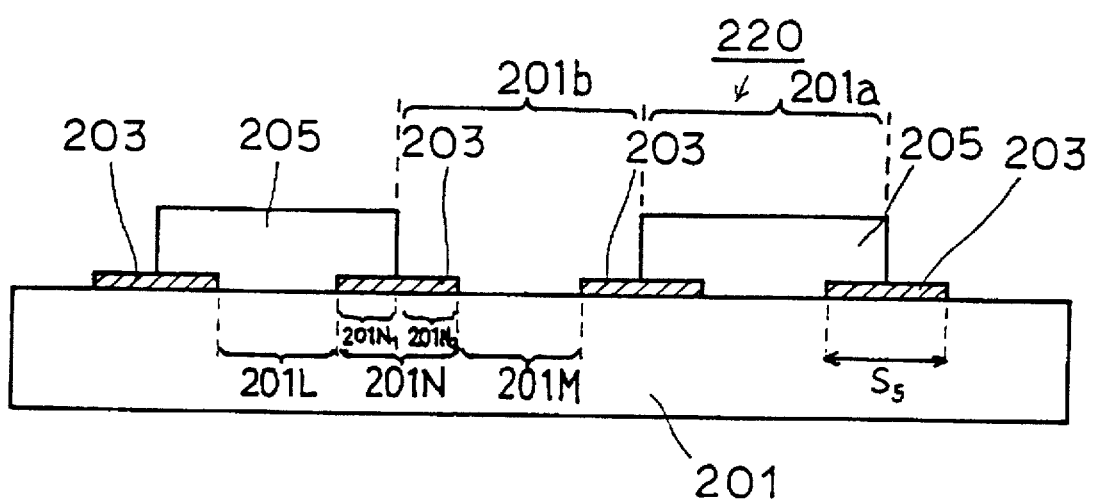
FIG. 13 is a cross sectional view schematically showing a structure of a phase shifting mask according to a second embodiment of the present invention.

Referring to FIG. 13, a plurality of semi-light shielding films 203 are formed spaced apart a predetermined distance from each other on the surface of a quartz substrate 201. A quartz layer 205 serving as a shifter is formed for every other surface of quartz substrate 201 which is exposed from semi-light shielding film 203. A portion where shifter 205 is formed serves as a first light transmitting portion 201a, while a portion where the shifter is not formed serves as a second light transmitting portion 201b. Phases of exposure light transmitting through first and second light transmitting portions 201a and 201b are out of phase with each other by about 180°.

First light transmitting portion 201a includes a first transmitting region 201L where semi-light shielding film 203 is not formed and a first attenuated transmitting region 201 N₁ where semi-light shielding film 203 is formed. Second light transmitting portion 201b includes a second transmitting region 201M where semi-light shielding film 203 is not formed, and a second attenuated transmitting region 201N₂ where semi-light shielding film 203 is formed.

As semi-light shielding film 203, a chromium film, for example, is used. A thickness of the chromium film is about 200Å when the i-line is used as exposure light, and about 150Å when KrF excimer laser is used, providing 10% of exposure light is transmitted.

Also, it is sufficient to set the chromium film to have a thickness within the range of 100Å–300Å, since the thickness changes according to a wavelength of exposure light used and transmittance to be set.

Figure 14:
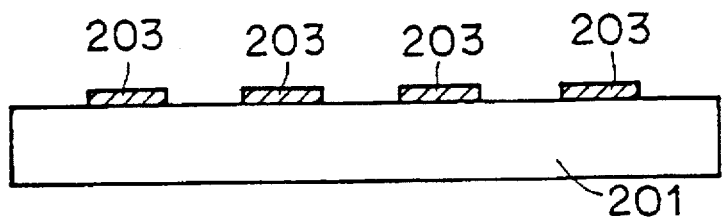
FIGS. 14–16 are cross sectional views schematically showing in this order a manufacturing method of the phase shifting mask according to the second embodiment of the present invention.

Now, a manufacturing method of this embodiment will be described. First, referring to FIG. 14, a chromium film having a thickness of, for example, 200Å is formed on the surface of quartz substrate 201. By patterning the chromium film by photolithography, semi-light shielding film 203 having a desired shape is formed.

Figure 15:
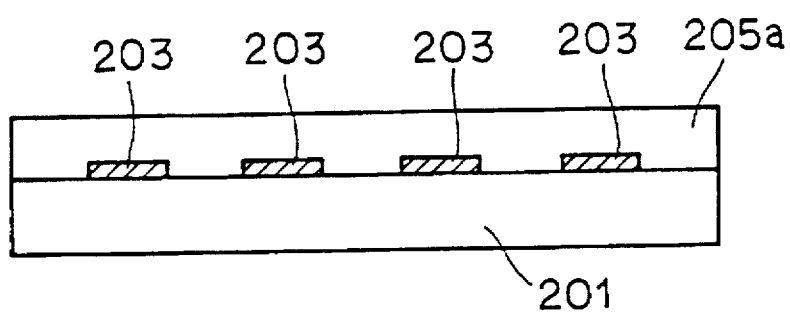

Referring to FIG. 15, a quartz layer 205a is formed on the entire surface of quartz substrate 201 so as to cover semi-light shielding film 203.

Figure 16:
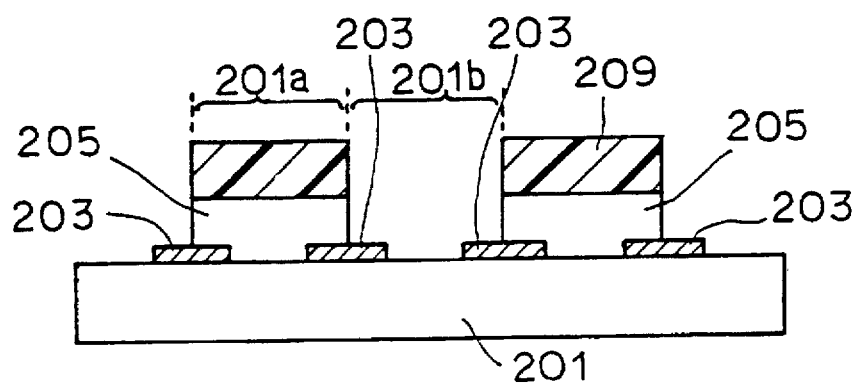

Referring to FIG. 16, a resist pattern 209 having a desired shape is formed on the surface of quartz layer 205a. Using resist pattern 209 as a mask, anisotropic etching is conducted to quartz layer 205. A shifter 205 made of quartz is formed for every other surface of quartz substrate 201 which is exposed from semi-light shielding film 203 by this etching. Thus, a region in which shifter 205 is formed serves as a first light transmitting portion 201a, while a region in which the shifter is not formed serve as a second light transmitting portion 201b. Resist pattern 209 is then removed, whereby the phase shifting mask shown in FIG. 13 is obtained.

In the phase shifting mask of this embodiment, semi-light shielding film 203 is formed in a part of first and second light transmitting portions, and has transmittance of at least 3% and not more than 30%. Thus, as in the first embodiment, a high resolution can be obtained in both densed and isolated patterns, whereby a desired pattern shape can easily be formed even in a complex circuit pattern.

Figure 17A:
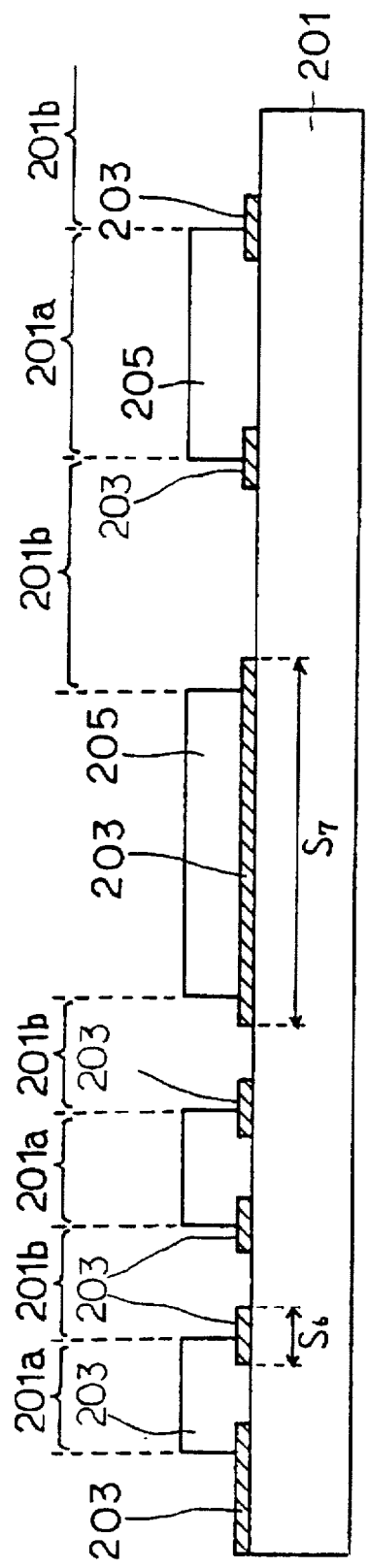
FIG. 17A is a cross sectional view schematically showing a structure of the phase shifting mask according to the second embodiment of the present invention when used to a pattern in which the dense pattern and the isolated pattern are mingled.
Figure 18A:
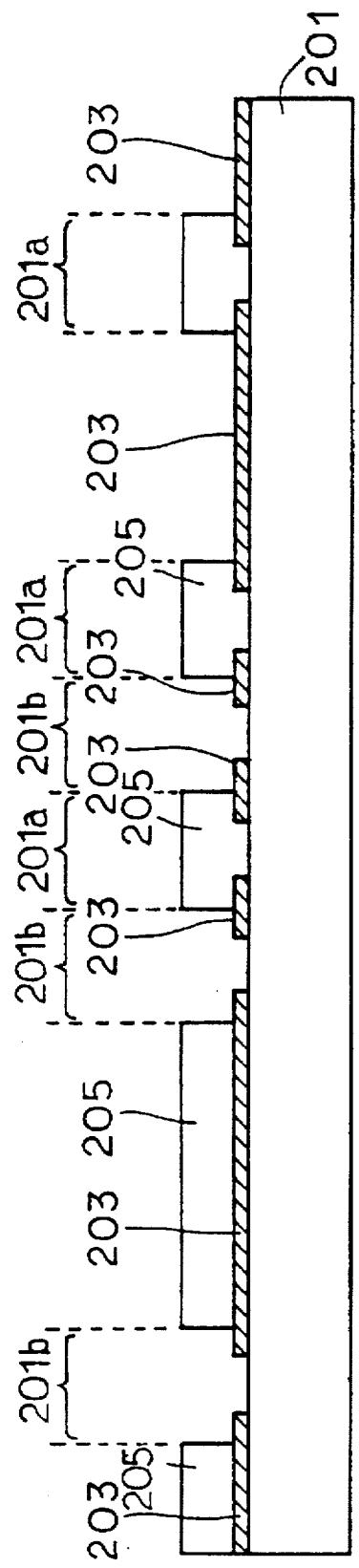
FIG. 18 is a cross sectional view schematically showing a structure of the phase shifting mask according to the second embodiment of the present invention when used to a pattern in which the dense pattern and the isolated pattern are mingled.
FIG. 18B is a cross sectional view schematically showing a resist pattern formed by the phase shifting mask shown in FIG. 18A.

When the phase shifting mask of this embodiment is applied to a pattern in which the dense pattern and the isolated pattern are mingled, a phase shifting mask having a structure as shown in FIG. 17A and FIG. 18A, for example, can be obtained.

Referring to FIGS. 17A and 18A, a plurality of semi-light shielding films 203 are formed spaced apart by a desired distance from each other on the surface of quartz substrate 201. Shifter 205 is formed on the surface of quartz substrate 201 which is exposed from semi-light shielding film 203 or on the surface of semi-light shielding film 203. A region in which shifter 205 is formed serves as first light transmitting portion 201a, while a region in which shifter 205 is not formed serves as second light transmitting portion 201b. Phases of exposure light transmitted through first and second light transmitting portions 201a and 201b are different from each other by 180°.

Figure 17B:
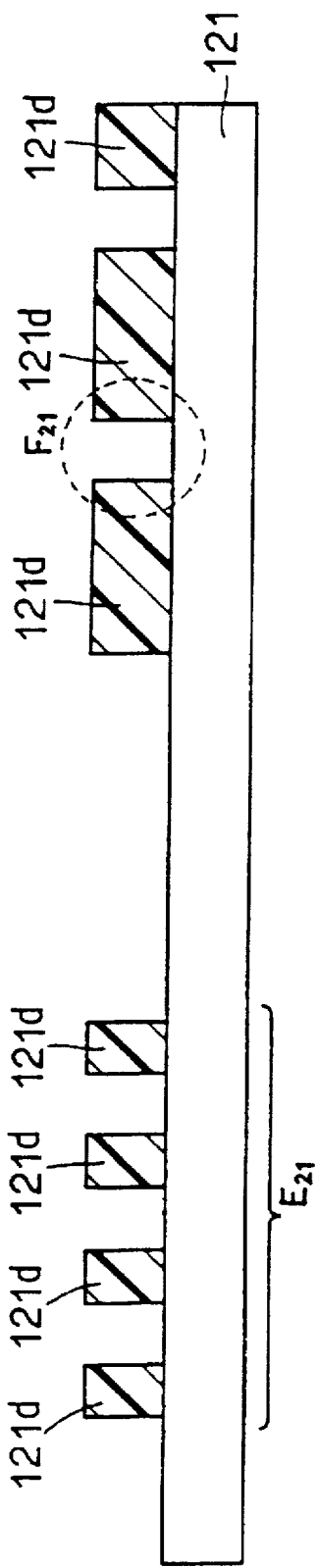
FIG. 17B is a cross sectional view schematically showing a resist pattern formed by the phase shifting mask shown in FIG. 17A.
Figure 18B:
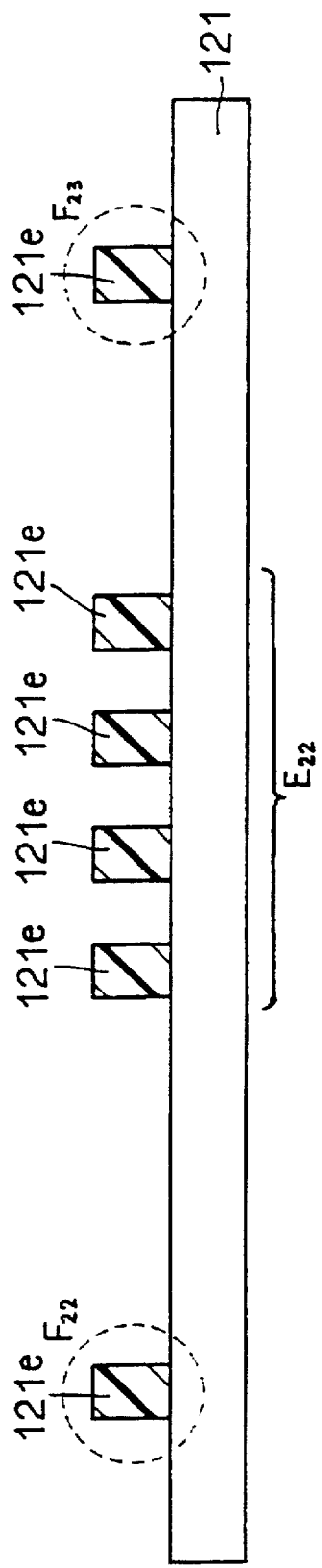

Referring to FIGS. 17B and 18B, resist patterns 121d and 121e are formed on wafer 121 by using the above-described phase shifting mask. Region E₂₁ of resist pattern 121d and region E₂₂ of resist pattern 121e represent the dense pattern region. Region F₂₁ of resist pattern 121d represents the so-called aperture of the isolated pattern, while regions F₂₂ and F₂₃ of resist pattern 121e represent the so-called remaining portions of the isolated pattern.

In the phase shifting mask of this embodiment, as in the first embodiment, either the Levenson system or the halftone system can be selected to obtain the phase shifting effect by making dimension S₅ of semi-light shielding film 203 shown in FIG. 13 smaller or larger than 2λ×n (n: magnification of the projection optical system).

More specifically, in FIGS. 17A and 17B, a dimension S₆ of semi-light shielding film 203 is set less than 2λ×n in the dense pattern region E₂₁, while a dimension S₇ is set more than 2λ×n in the isolated pattern region. Accordingly, the phase shifting effect of the Levenson system and the halftone system can be provided respectively in the dense pattern region $E_{21}$ and the isolated pattern region $E_{22}$. Therefore, a high resolution can be provided in both densed and isolated patterns.

Also, in the phase shifting mask of this embodiment, as in the first embodiment, both densed and isolated patterns can be formed by virtue of the phase shifting effect. Thus, a high solution can be obtained even in the mixed pattern by setting coherency σ of exposure light to be a value (0.3) which is appropriate to the phase shifting mask.

Embodiment 3

Figure 19:
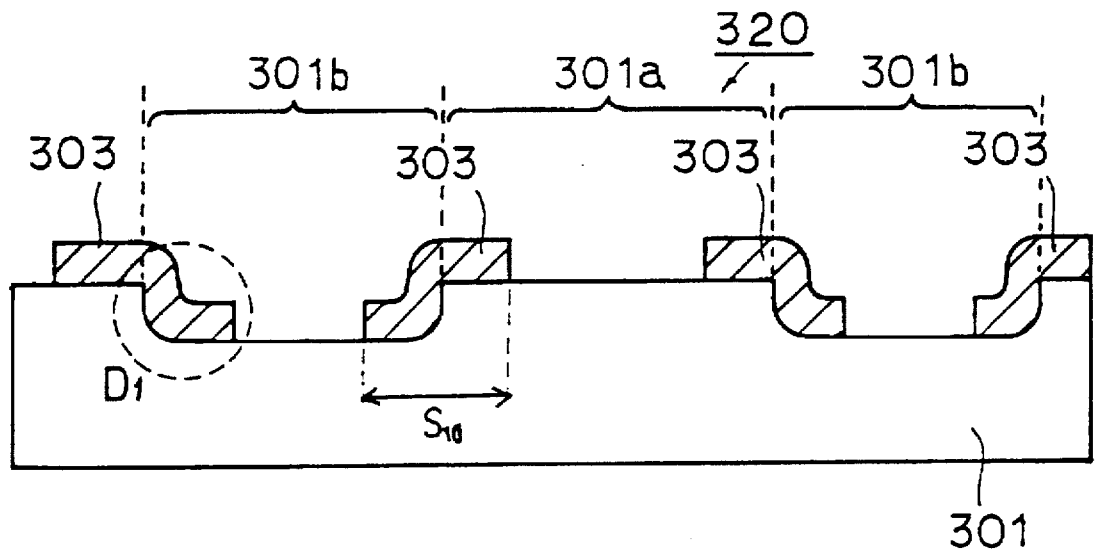
FIG. 19 is a cross sectional view schematically showing a structure of a phase shifting mask according to a third embodiment of the present invention.
Figure 20:
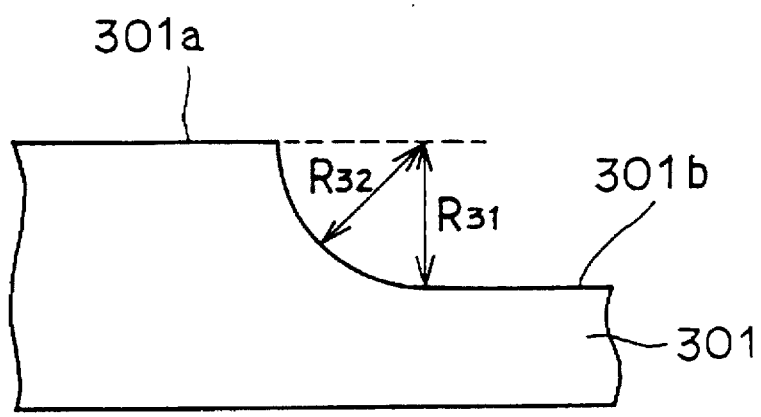
FIG. 20 is a partial cross sectional view showing in an enlarged manner a region $D_1$ shown in FIG. 19.

Referring to FIGS. 19 and 20, a phase shifting mask 320 according to a third embodiment includes a quartz substrate 301 and a light shielding film 303. A trench is formed on the surface of quartz substrate 301. A region in which the trench is not formed serves as a first light transmitting portion 301a, and a region in which the trench is formed serves as a second light transmitting portion 301b. Beams of exposure light transmitted through first and second light transmitting portions 301a and 301b, respectively, are 180° out of phase with each other.

The surface of first light transmitting portion 301a is formed at a position having a first height from the bottom surface of substrate 301. In the meanwhile, the surface of second light transmitting portion 301b is formed at a position having a second height which is lower than the first height from the bottom surface of quartz substrate 301. Thus, there is provided a stepped portion between first and second light transmitting portions 301a and 301b. This stepped portion has a radius of curvature $R_{32}$ which is substantially equal to a height $R_{31}$ of the stepped portion.

A light shielding film 303 is formed on the surface of quartz substrate 301 so as to cover the stepped portion and to expose predetermined regions of first and second light transmitting portions 301a and 301b.

Now, a manufacturing method of the phase shifting mask of this embodiment will be described.

Figure 21:
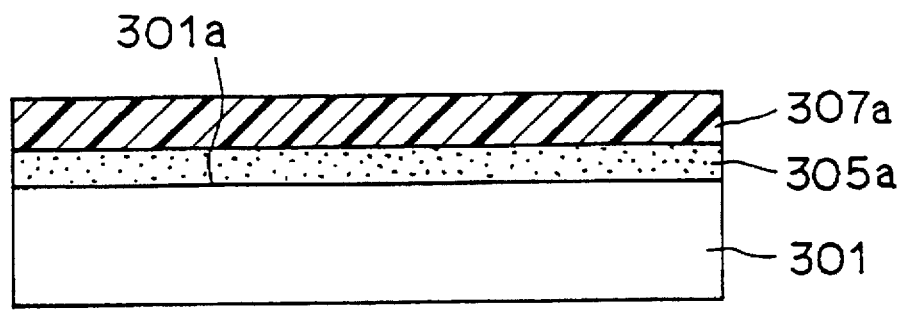
FIGS. 21–28 are cross sectional views schematically showing in this order a manufacturing method of the phase shifting mask according to the third embodiment of the present invention.

Referring to FIG. 21, the necessary cleaning and preprocessing are carried out to quartz substrate 301 which is made of synthetic quartz formed into a required shape and flatness. Then, a doped amorphous silicon film 305a having a thickness of 300Å–1000Å is formed on quartz substrate 301 by an ordinary DC electric discharge sputtering apparatus. An electron beam resist film 307 having a thickness of 3000Å or less is formed on the entire surface of doped amorphous silicon film 305a by an ordinary spin coater. Onto this electron beam resist film 307a, a shifter pattern of the phase shifting mask of the Levenson type is drawn by an electron beam lithography apparatus.

Figure 22:
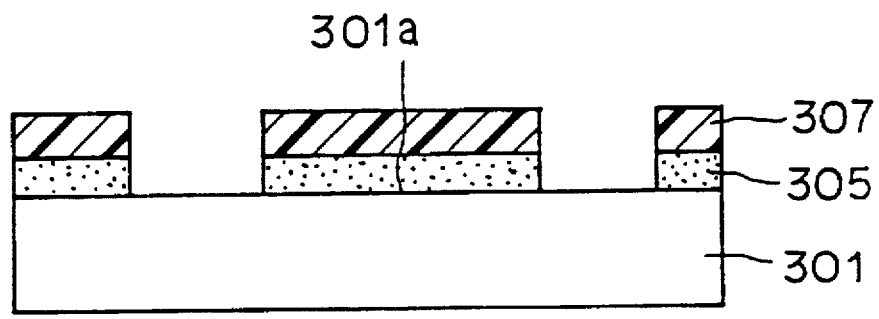

After lithography, referring to FIG. 22, a resist pattern 307 is formed through development by an ordinary development apparatus. Using resist pattern 307 as a mask, doped amorphous silicon film 305a is selectively etched over quartz substrate 301 with plasma of a mixed gas having a $CF_4:O_2$ ratio of 95:5 by the plasma etching apparatus.

An etching selectivity at this time is about 60. Thus, an etched amount of the quartz substrate when doped amorphous silicon film 305a is overetched by 100% is 5–16Å, that is, about 10Å. An influence, therefore, of the etching upon a phase angle of the shifter is negligible. Then, electron beam resist pattern 307 is removed by ashing using the ordinary oxygen plasma. After that, cleaning is carried out by an alkali cleaning solution.

Figure 23:
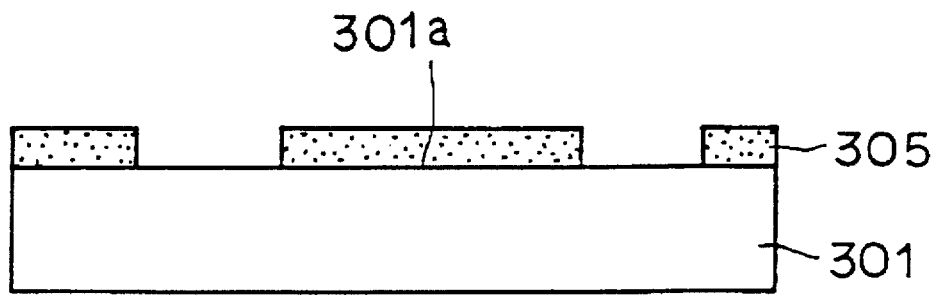

Referring to FIG. 23, a shifter pattern is thus formed in doped amorphous silicon film 305. A defect test of the shifter pattern is conducted by an ordinary optical pattern defect inspection apparatus. Commonly in such a mask process, it is unlikely that clear defects are generated, so that only opaque defects are generated and detected. Since opaque defects can be repaired by the above-described ordinary baser repairing apparatus, no defects will be left.

Figure 24:
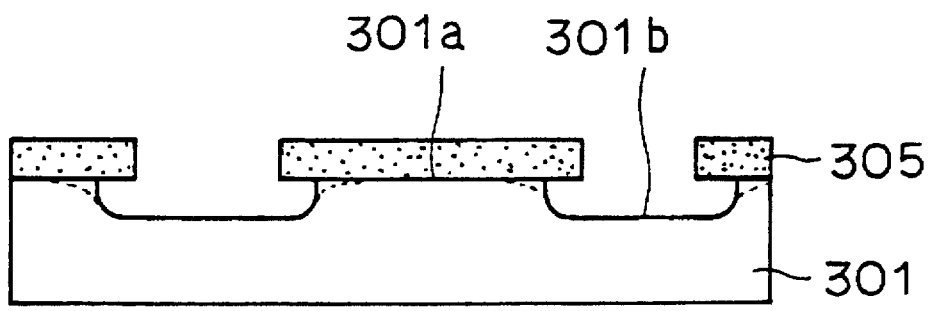

Referring to FIG. 24, a surface processing is carried out by oxygen plasma in order to improve wettability (that is, to facilitate wetting) during wet etching. Wet etching is then carried out to quartz substrate 301 for a desired amount (about 4100Å in the mask for i-line exposure) by using a solution having a mixture ratio of ammonium fluoride and hydrofluoric acid of 50:1 plus active agent. The shifter pattern is formed in quartz substrate 301 by this wet etching.

During wet etching, doped amorphous silicon film 305 serves as an etching mask material against quartz substrate 301. Since there is sufficient adherence between doped amorphous silicon film 305 and quartz substrate 301, an etchant is unlikely to enter an interface between doped amorphous silicon film 305 and quartz substrate 301.

If the etchant is likely to enter the interface, quartz substrate 301 is removed by etching along the interface, as shown by a dotted line in the figure, whereby peeling-off of amorphous silicon film 305 is facilitated. However, as described above, the etchant is unlikely to enter the interface thanks to a good adherence, doped amorphous silicon film 305 will not be peeled off.

In the meanwhile, the etching rate of quartz substrate 301 during wet etching is sufficiently small. Therefore, controllability of a phase shifting angle determined by the etching amount can be within ±5°. Doped amorphous silicon film 305 is then removed by plasma of the mixed gas having a $CF_4:O_2$ ratio of 95:5. At this time, the etching selectivity between doped amorphous silicon film 305 and quartz substrate 301 is about 60. Thus, an etched amount of quartz substrate 301 when doped amorphous silicon film 305 is overetched by 100% is 5–16Å, that is, about 10Å. Therefore, the influence of etching upon phase shifting angles of the shifter is negligible.

Figure 25:
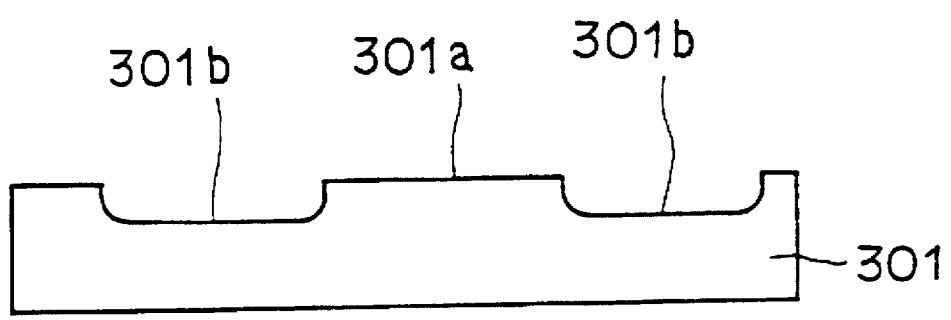

Referring to FIG. 25, first and second light transmitting portions 301a and 301b are thus formed in quartz substrate 301. Then, washing is carried out by the alkali cleaning solution.

Figure 26:
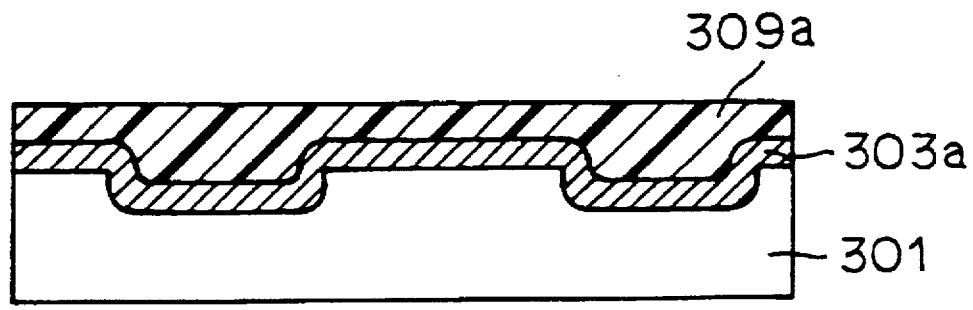

Referring to FIG. 26, a chromium film 303a having a thickness of about 1000Å which will serve as a light shielding material of the phase shifting mask is formed on the entire surface by the ordinary DC discharge sputtering apparatus. An electron beam resist film 309a having a thickness of about 3000Å is formed on the entire surface of chromium film 303a by the ordinary spin coater. Then, a desired shape is drawn on electron beam resist film 309a by the electron beam lithography apparatus.

Figure 27:
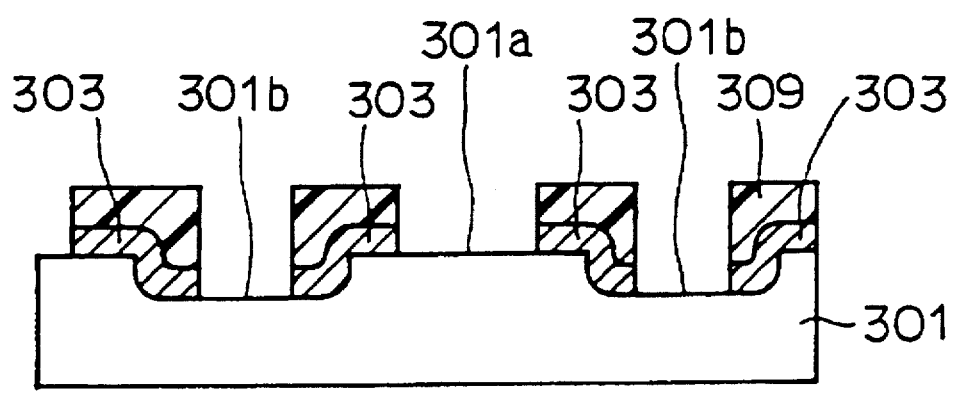

After lithography, referring to FIG. 27, an electron beam resist pattern 309 is formed through development by the ordinary development apparatus.

During lithography using the electron beam, accuracy required in alignment with the underlying shifter pattern is sufficient to the level of that of the ordinary electron beam lithography apparatus. In other words, the accuracy of the ordinary electron beam lithography apparatus is about 0.1μm which is sufficiently smaller than that of underlying pattern shape, so that the accuracy of alignment with the underlying pattern is sufficient to the level of that of the electron beam lithography apparatus.

Figure 28:
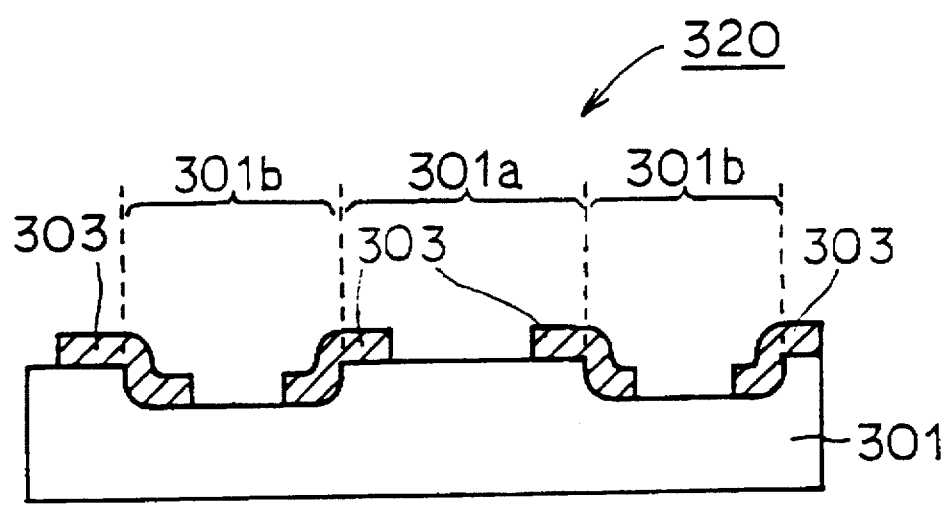

After that, electron beam resist pattern 309 is removed. Also, usual defect inspection and repairs are carried out, whereby a desired phase shifting mask 320 of the Levenson system as shown in FIG. 28 is completed.

As described with reference to FIGS. 19 and 20, in the phase shifting mask of this embodiment, the stepped portion between first and second light transmitting portion 301a and 301b has a radius of curvature $R_{32}$ which is substantially equal to height $R_{31}$ of the stepped portion. Thus, a slope of the stepped portion of this embodiment is gentler than that of the conventional phase shifting mask 720 shown in FIG. 49. Thus, adherence of light shielding film 303 formed to cover the stepped portion to quartz substrate 301 is improved compared to conventional phase shifting mask 720.

Also, the gentle slope of the stepped portion of quartz substrate 301 in phase shifting mask 320 of this embodiment prevents at the bottom of the stepped portion trapping of a foreign object which is generated during removal of doped amorphous silicon film 305 in the steps shown in FIGS. 24 and 25. Thus, the foreign object is prevented from being left at the bottom of the stepped portion.

Figure 29:
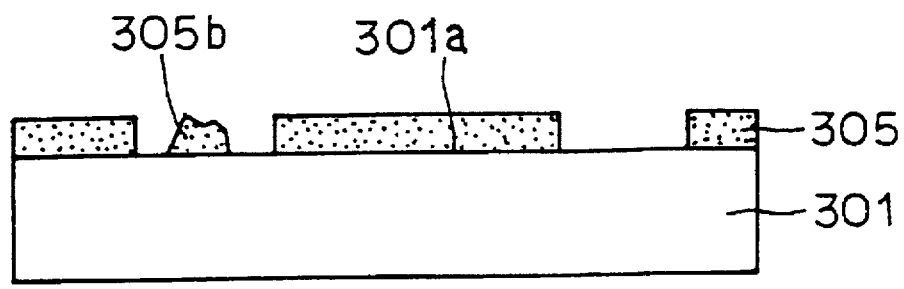
FIGS. 29 and 30 are cross sectional views for illustrating a case when a remaining defect is generated in the manufacturing method of the phase shifting mask according to the third embodiment of the present invention.

In the manufacturing method of this embodiment, isotropic etching is carried out to quartz substrate 301 in the steps shown in FIGS. 23 and 24. Thus, even if a remaining defect 305b of doped amorphous silicon film 305 is left as shown in FIG. 29, the underlying layer of remaining defect 305b is also removed by etching.

Figure 30:
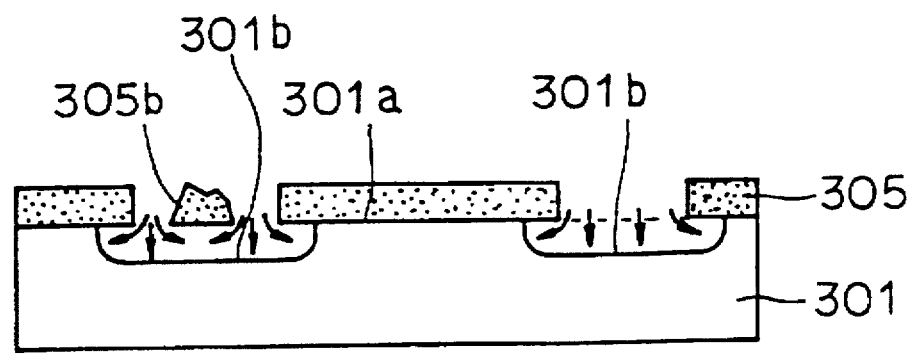

More particularly, with reference to FIG. 30, spreading of the etchant is good in isotropic etching. Accordingly, the etchant spreads under mask 305 or remaining defect 305b. This causes regions of quartz substrate 301 located under mask 305 and remaining defect 305b to be removed by etching. When thus removed by etching, remaining defect 305b falls from quartz substrate 301 with the underlying layer thereof being lost. This eliminates the possibility that a region to be removed is not removed because of remaining defect 305b. When the resist film on the wafer is exposed with light by using the thus manufactured phase shifting mask, a favorable resolution can be obtained so that no unsatisfactory pattern shape is provided.

In the phase shifting mask of this embodiment, the semi-light shielding film used in the first and second embodiments can be used instead of light shielding film 303. A chromium film is used, for example, as the semi-light shielding film. A thickness of chromium is about 200Å when the i-line is used as exposure light, and about 150Å when KrF excimer laser is used, providing 10% of exposure light is transmitted. Also, the thickness of the chromium film changes depending on a wavelength of exposure light used and transmittance to be set, so that it is sufficient to set the thickness within the range of 100Å–300Å.

If the semi-light shielding film is used in this embodiment instead of the light shielding film, then the same effect as can be obtained in the first and second embodiments can be provided.

More particularly, referring to FIG. 19, semi-light shielding film 303 is formed in a part of first and second light transmitting portions 301a and 301b, and has transmittance of at least 3% and not more than 30%. As in the first and second embodiments, therefore, a high resolution can be obtained in both densed and isolated patterns. Therefore, a desired pattern shape can easily be formed even in a complex circuit pattern.

One specific example of the phase shifting mask when the phase shifting mask of this embodiment is applied to the mix pattern in which the densed and isolated patterns are mingled is as shown in FIGS. 31A and 32A.

Referring to FIGS. 31A and 32A, a plurality of trenches are formed spaced apart by a desired distance from each other on the surface of quartz substrate 301. The sidewall of the trench has substantially the same radius of curvature as a depth of the trench. A region in which trench is not formed serves as first light transmitting portion 301a, and a region in which a trench is formed serves as second light transmitting portion 301b.

Beams of exposure light transmitted through first and second light transmitting portions 301a and 301b are 180° out of phase with each other. Semi-light shielding film 303 is formed to cover the sidewall of the trench and to expose predetermined regions of first and second light transmitting portions 301a and 301b.

Also, in the phase shifting mask of this embodiment, either the Levenson system or the halftone system can be selected to obtain the phase shifting effect by making a dimension $S_{10}$ of semi-light shielding film 303 smaller or larger than $2\lambda \times n$ (n:magnification of the projection optical system) as shown in FIG. 19.

More specifically, a dimension $S_{11}$ of semi-light shielding film 303 is made smaller than $2\lambda \times n$ in the dense pattern region $E_{31}$, while a dimension $S_{12}$ of semi-light shielding film 303 is made larger than $2\lambda \times n$, as shown in FIGS. 31A and 31B. Therefore, the phase shifting effect of the Levenson system and the halftone system can be obtained respectively in the dense pattern region $E_{31}$ and the isolated pattern region. Thus, a high resolution can be obtained in both isolated and densed patterns.

As in the first embodiment, both dense pattern and isolated pattern can be formed by using the phase shifting effect in the phase shifting mask of this embodiment. Therefore, a high resolution can be obtained by setting coherency σ of exposure light to be a value (0.3) which is appropriate to the phase shifting mask.

Embodiment 4

Figure 33:
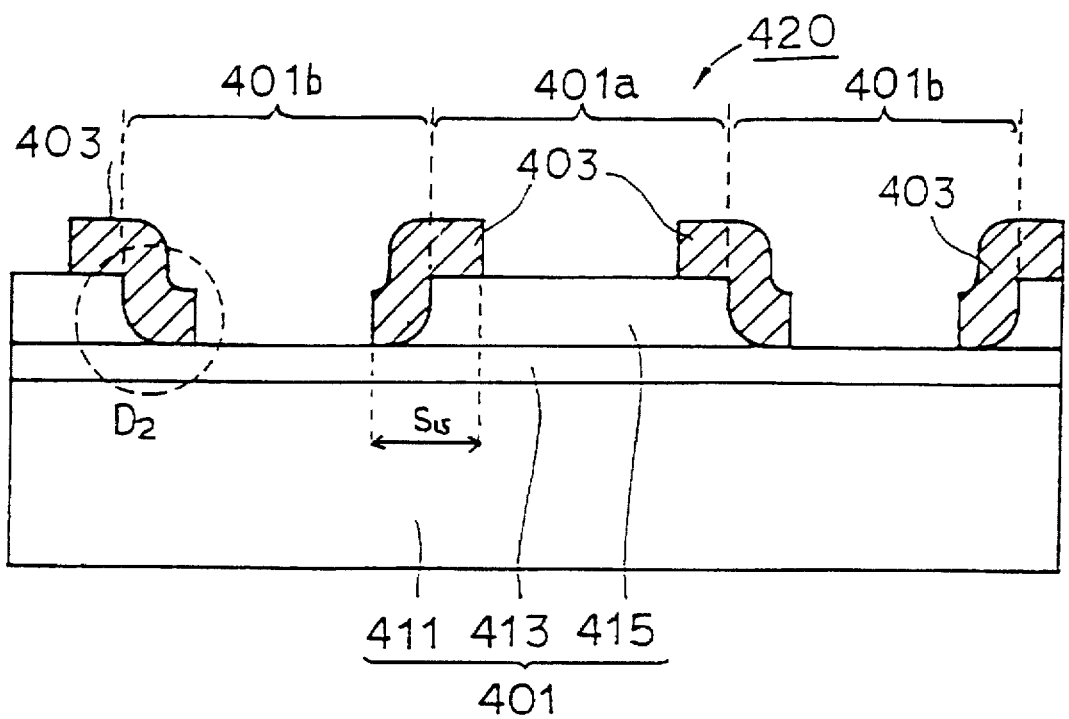
FIG. 33 is a cross sectional view schematically showing a structure of a phase shifting mask according to a fourth embodiment of the present invention.
Figure 34:
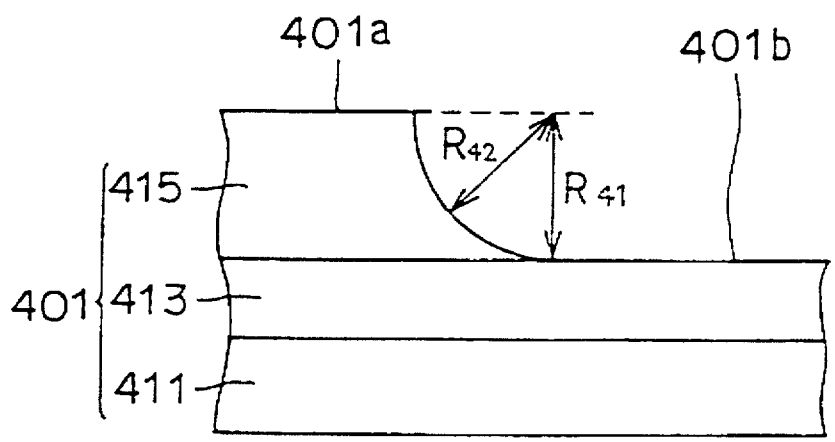
FIG. 34 is a partial cross sectional view showing in an enlarged manner a region $D_2$ shown in FIG. 33.

Referring to FIGS. 33 and 34, a phase shifting mask 420 according to a fourth embodiment includes a quartz substrate 411, an etching stopper film 413, a silicon oxide film (SOG:Spin On Glass) 415, and a light shielding film 403. Etching stopper film 413 and silicon oxide film 415 are stacked successively on the surface of quartz substrate 411. Quartz substrate 411, etching stopper film 413, and silicon oxide film 415 constructs a substrate 401 which transmits exposure light.

Etching stopper film 413 is made by, for example, SnO, $Al_2O_3$, or the like, and has a thickness of 100Å–1000Å. Silicon oxide film 415 has a thickness of about 4000Å. A trench is formed in silicon oxide film 415 such that part of the surface of etching stopper film 413 is exposed at the bottom of the trench. A region in which the trench is not formed serves as a first light transmitting portion 401a, and a region in which the trench is formed serves as a second light transmitting portion 401b.

A difference in height between the top surface of etching stopper film 413 and the top surface of silicon oxide film 415 is equivalent to a thickness of silicon oxide film 415. A stepped portion is thus formed by top surfaces of etching stopper film 413 and silicon oxide film 415. More particularly, a stepped portion is formed between surfaces of first and second light transmitting portions 401a and 401b. The stepped portion has substantially the same radius of curvature $R_{42}$ as a height $R_{41}$ of the stepped portion.

Light shielding film 403 made of chromium (Cr) is formed to cover the stepped portion which is formed by the sidewall of the trench, and to expose desired regions of first and second light transmitting portions 401a and 401b.

Now, a manufacturing method of the phase shifting mask according to the fourth embodiment of the present invention will be described below.

Figure 35:
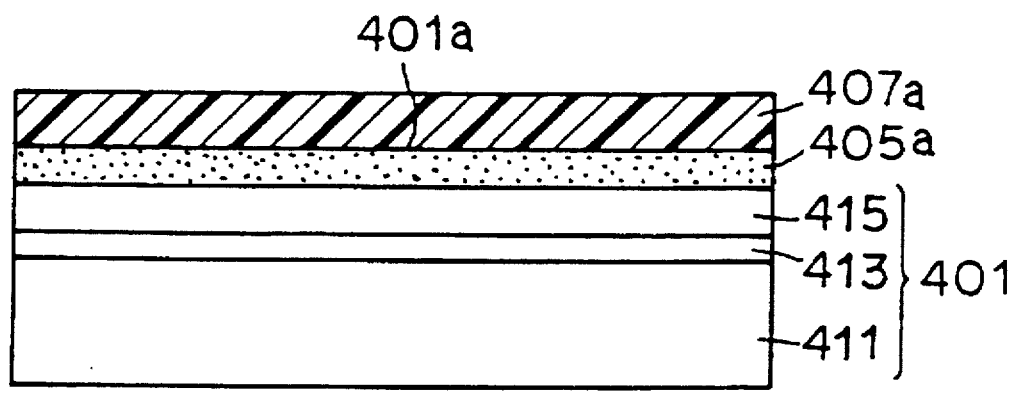
FIGS. 35-42 are cross sectional views schematically showing in this order a manufacturing method of the phase shifting mask according to the fourth embodiment of the present invention.

First, referring to FIG. 35, an etching stopper film 413, a silicon oxide film 415, and a doped amorphous silicon film 405a are formed stacked successively on the entire surface of quartz substrate 411 to have thicknesses of 100Å–1000Å, not more than 4000Å, and 300Å–1000Å, respectively. An electron beam resist film 407a having a thickness of 3000Å is formed on the entire surface of doped amorphous silicon film 405a by the ordinary spin coater. A shifter pattern of the phase shifting mask of the Levenson system is drawn on electron beam resist film 407a by the electron beam lithography apparatus.

Figure 36:
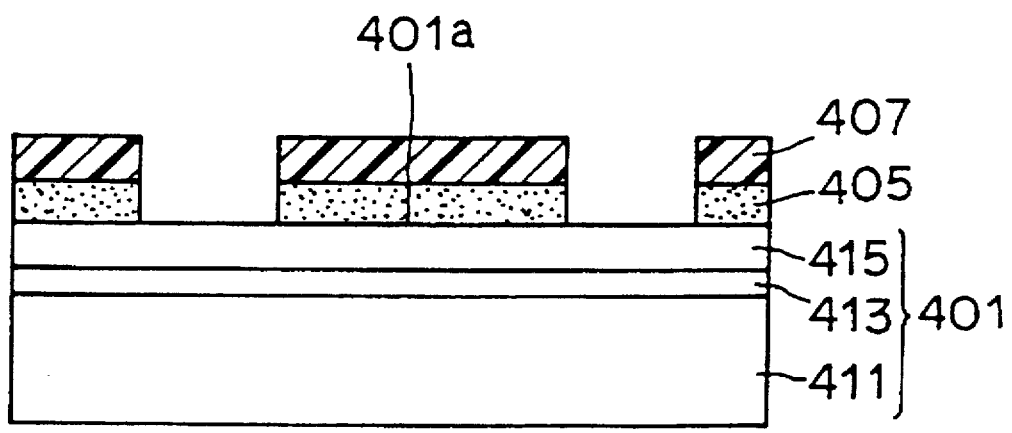

After lithography, referring to FIG. 36, a resist pattern 407 is formed through development by the ordinary development apparatus. Using resist pattern 407 as a mask, doped amorphous silicon film 405 is selectively etched over silicon oxide film 415 by plasma of a mixed gas having a $CF_4:O_2$ ratio of 95:5 by the isotropic plasma etching apparatus.

At this time, an etching selectivity of doped amorphous silicon film 405 over silicon oxide film 415 is about 60. Thus, an etched amount of silicon oxide film 415 when doped amorphous silicon film is overetched by 100% is 5Å–16Å, that is, about 10Å. This indicates that an influence of the etching upon a phase angle of the shifter is negligible. Electron beam resist pattern 407 is then removed by ashing using the ordinary oxygen plasma, and cleaning is carried out with the alkali cleaning solution.

Figure 37:
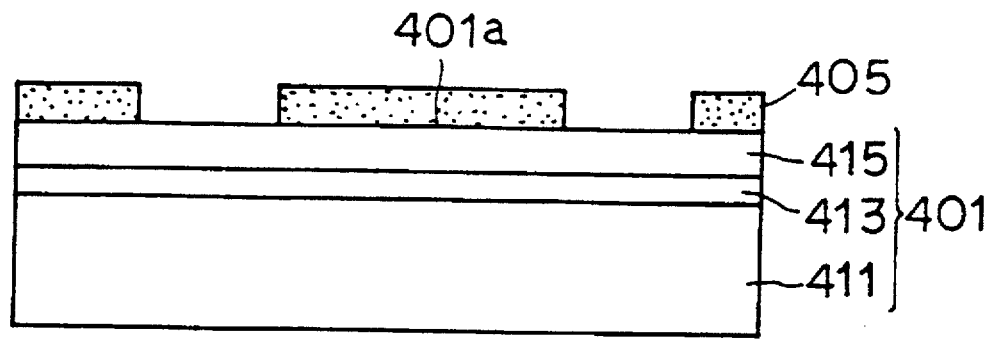

Referring to FIG. 37, a shifter pattern is thus formed in doped amorphous silicon film 405. Defect inspection of the shifter pattern is conducted by the ordinary optical defect inspection apparatus. As in most masking processes, it is unlikely that clear defects are generated, so that only opaque defects are generated and detected. Since opaque defects can be repaired by the ordinary laser repairing apparatus, any defects can be eliminated by such a repairing.

After that, the surface processing is carried out by the oxygen plasma in order to improve wettability (that is, to facilitate wetting) during wet etching. Then, wet etching is carried out until the surface of etching stopper film 413 is exposed by using a solution having a mixture ratio of ammonium fluoride to hydrofluoric acid of 50:1 plus a surface active agent, thus forming the shifter pattern in substrate 401.

At this time, there is provided a sufficient adherence between doped amorphous silicon film 405 serving as an etching mask and silicon oxide film 415. Therefore, there is no possibility that doped amorphous silicon film 405 is peeled off. At the same time, etching stopper film 413 serves as an etching stopper during wet etching of silicon oxide film 415. Therefore, controllability of a phase shifting angle can be very much improved.

Figure 38:
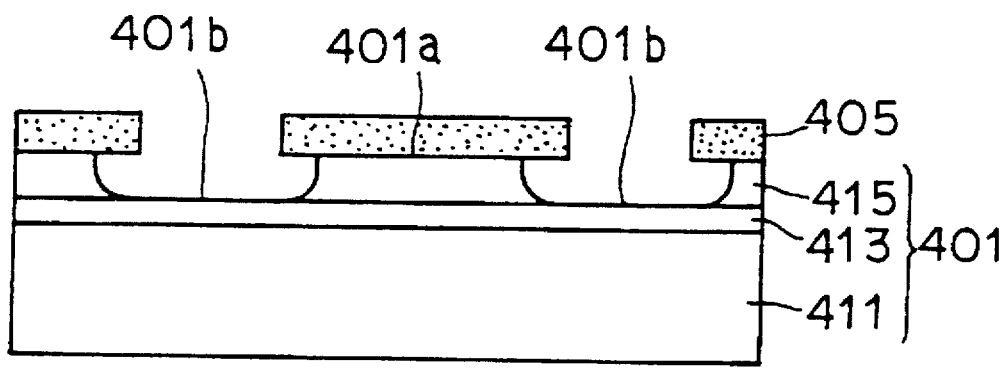

Referring to FIG. 38, after the above wet etching, a part of silicon oxide film 415 is removed and a part of the surface of etching stopper film 413 is exposed. Then, doped amorphous silicon film 405 is removed by plasma of a mixed gas having a $CF_4:O_2$ ratio of 95:5 by the isotropic plasma etching apparatus.

Figure 39:
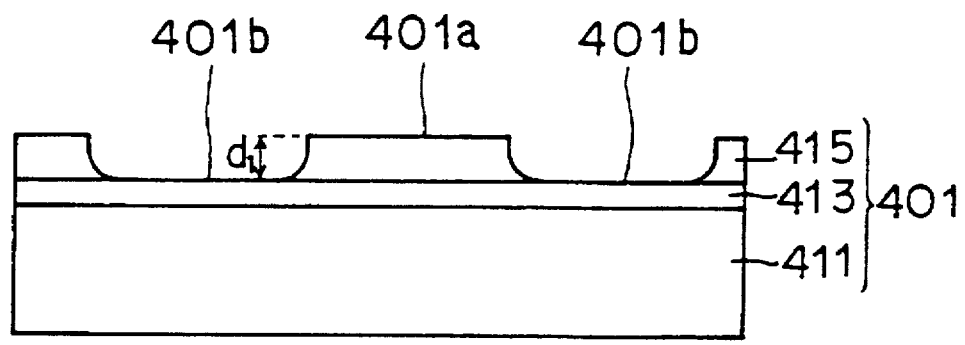

Referring to FIG. 39, substrate 401 (which consists of quartz substrate 411, etching stopper film 413 and silicon oxide film 415) including first and second light transmitting portions 401a and 401b can thus be provided. Then, cleaning is carried out by using the alkali cleaning solution.

Figure 40:
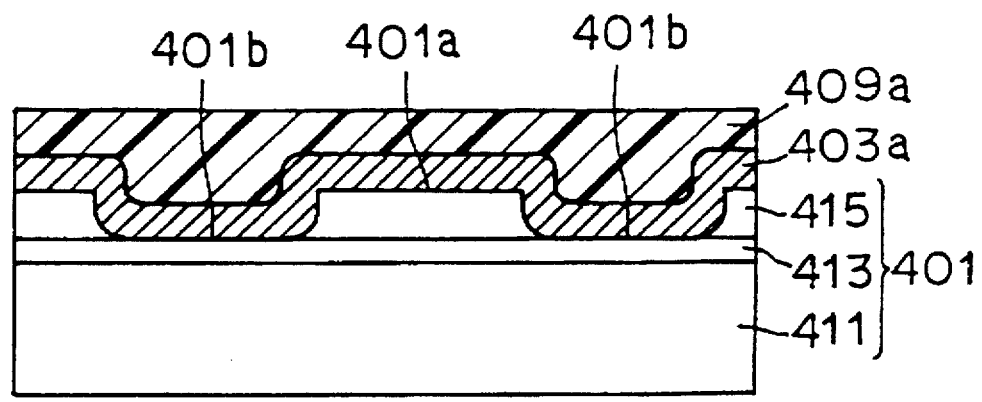

After cleaning, referring to FIG. 40, a chromium film 403a which will serve as a light shielding material having a thickness of about 1000Å is formed to cover the entire surface by the ordinary DC discharge sputtering apparatus. An electron beam resist film 409a having a thickness of about 3000Å is formed on the entire surface of chromium film 403a by the ordinary spin coater. A desired pattern shape is drawn on electron beam resist film 409a by the electron beam lithography apparatus.

Figure 41:
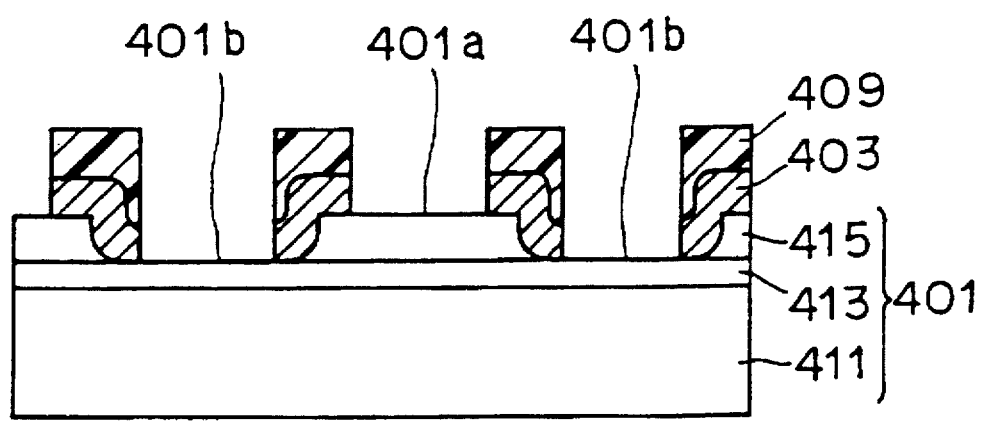

After lithography, referring to FIG. 41, a resist pattern 409 is formed through development by the ordinary development apparatus.

During lithography by the electron beam, an accuracy required in alignment with the underlying shifter pattern is sufficient to the level of that of the ordinary electron beam lithography apparatus. In other words, an accuracy of the ordinary electron beam lithography apparatus is about 0.1μm which is sufficiently smaller than the underlying pattern shape, so that the level of alignment accuracy of the electron beam lithography apparatus is sufficient.

Figure 42:
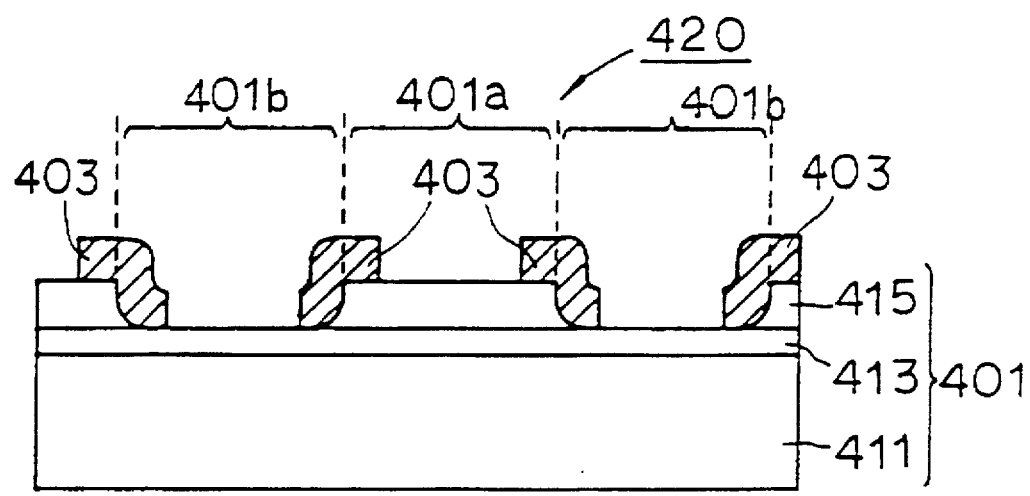

By using electron beam resist pattern 409 as a mask, chromium film 403a is selectively etched to form a light shielding pattern 403 made of chromium film. Electron beam resist pattern 409 is then removed by the ordinary ashing using oxygen plasma. After that, usual defect inspection and repairs are carried out, thus completing a desired phase shifting mask 420 of the Levenson system shown in FIG. 42.

In the phase shifting mask of this embodiment, the stepped portion formed between surfaces of first and second light transmitting portions 401a and 401b has substantially the same radius of curvature $R_{42}$ as a height $R_{41}$ of the stepped portion. In other words, a sidewall of the stepped portion of this embodiment is gentler than a sidewall of the stepped portion in conventional phase shifting mask 720 in FIG. 49. Therefore, even if light shielding film 403 is formed on the stepped portion of this embodiment, a good adherence of light shielding film 403 to silicon oxide film 415 can be provided.

Also, the gentle slope of stepped portion prevents at the bottom of stepped portion trapping of a foreign object which is generated during removal of doped amorphous silicon film 405 in the steps shown in FIGS. 38 and 39.

Also, in the manufacturing method of the phase shifting mask of this embodiment, isotropic etching is carried out to silicon oxide film 115 in the steps shown in FIGS. 37 and 38. During this isotropic etching, an etchant spreads under mask 405 and remaining defects, (not shown). Therefore, as described with reference to FIGS. 29 and 30 in the third embodiment, even if remaining defects are generated in this embodiment, there is no possibility that a region to be removed by etching is left. When the resist film on the wafer is exposed with light by using the thus manufactured phase shifting mask, a good resolution can be obtained and no unsatisfactory pattern shape is formed.

In the meantime, in this embodiment, substrate 401 is not formed by a single layer as in the third embodiment. More particularly, substrate 401 consists of three layers of quartz substrate, 411, etching stopper film 413 and silicon oxide film 415. Etching stopper film 413 serves as an etching stopper during etching of silicon oxide film 415. It is unlikely that etching stopper film 413 is etched during etching of silicon oxide film 415. Therefore, a distance $d_1$ between surfaces of first and second light transmitting portions 401a and 401b can easily be controlled, as shown in FIG. 39.

More particularly, since etching stopper film 413 is provided under silicon oxide film 415, the distance between surfaces of first and second light transmitting portions 401a and 401b can easily be adjusted to a desired distance $d_1$ without strictly controlling an etching amount of silicon oxide film 415. In the meanwhile, a difference in phase shifting angles of first and second light transmitting portions 401a and 401b can be determined according to this distance $d_1$. Therefore, the three-layered structure of substrate 401 facilitates control of the difference in phase shifting angles of first and second light transmitting portions 401a and 401b, whereby controllability of phase shifting angles can be very much improved.

It is noted that the semi-light shielding film used in the first and second embodiments can be used instead of light shielding film 403 in the phase shifting mask of this embodiment. A chromium film, for example, is used for the semi-light shielding film. The chromium film has a thickness of about 200Å when the i-line is used as exposure light, and about 150Å when KrF excimer laser is used, providing 10% of exposure light is transmitted.

Also, it is sufficient to set the thickness of the chromium film within the range of 100Å–300Å, because the thickness changes depending on a wavelength of exposure light used and transmittance to be set.

Figures 43A, 43B:
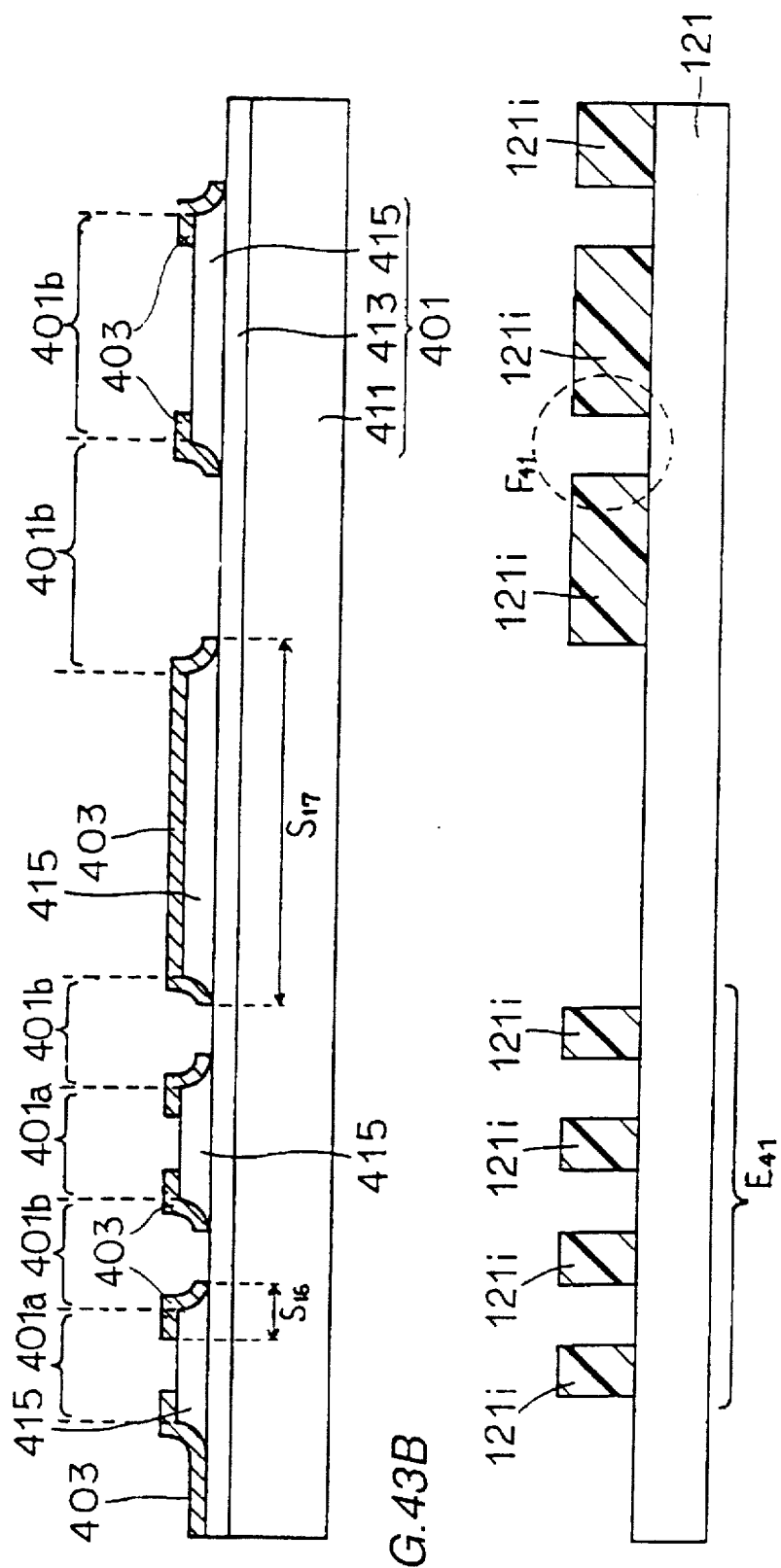
FIG. 43A is a cross sectional view schematically showing a structure of the phase shifting mask according to the fourth embodiment of the present invention when used to a pattern in which the dense pattern and the isolated pattern are mingled.
FIG. 43B is a cross sectional view schematically showing a resist pattern formed by the phase shifting mask shown in FIG. 43A.
Figures 44A, 44B:
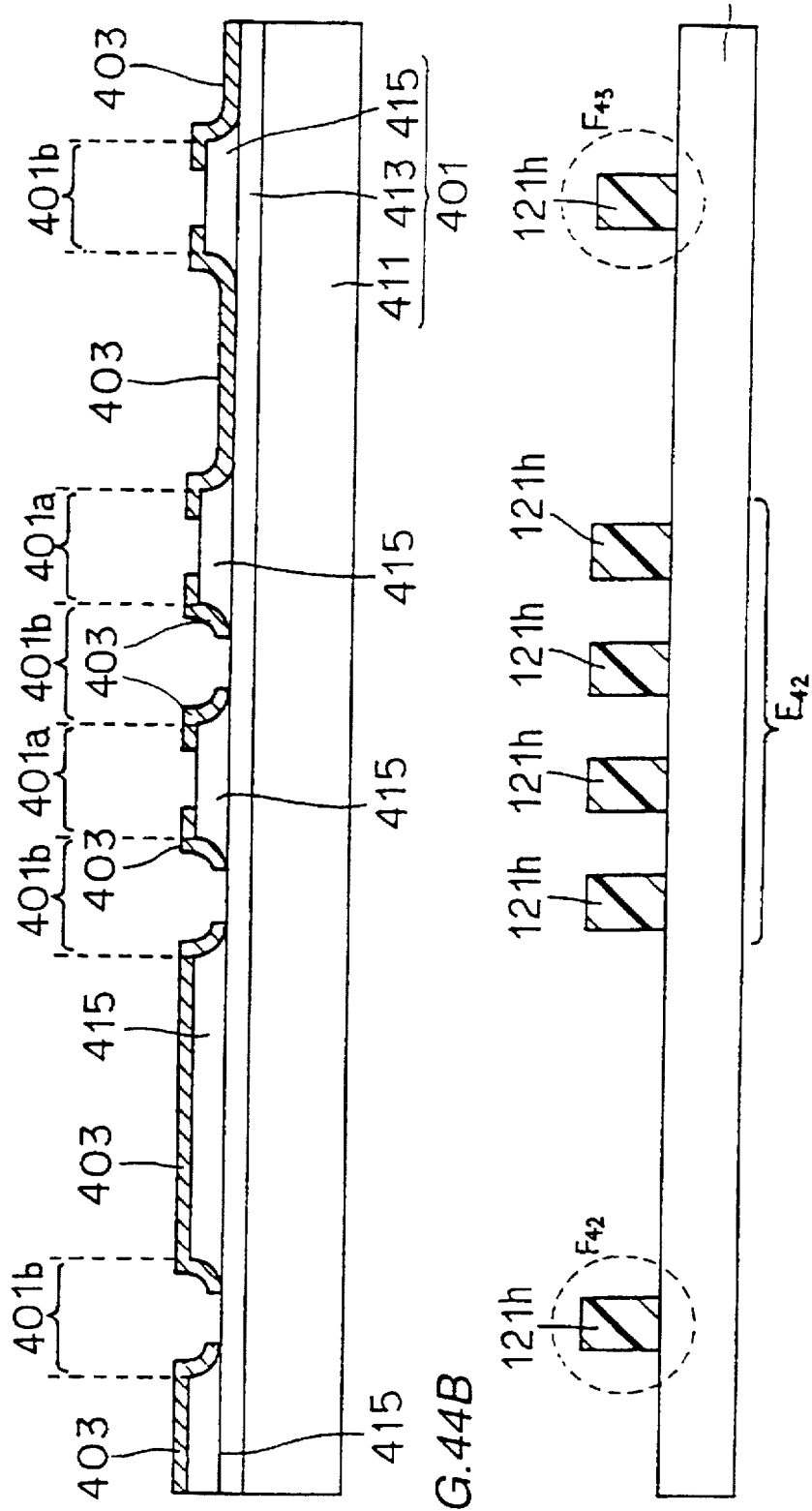
FIG. 44A is a cross sectional view schematically showing a structure of the phase shifting mask according to the fourth embodiment of the present invention when used to a pattern in which the dense pattern and the isolated pattern are mingled.
FIG. 44B is a cross sectional view schematically showing a resist pattern formed by the phase shifting mask shown in FIG. 44A.

One specific example of the phase shifting mask is as shown in FIGS. 43A and 44A, when the phase shifting mask of this embodiment using the semi-light shielding film is applied to the mixed pattern of dense and isolated patterns.

Referring to FIGS. 43A and 44A, etching stopper film 413 is formed on the entire surface of quartz substrate 411. Silicon oxide film 415 is formed on a predetermined region of etching stopper film 413. A trench reaching etching stopper film 413 is formed in silicon oxide film 415. The sidewall of the trench has substantially the same radius of curvature as a thickness of silicon oxide film 415.

A portion in which silicon oxide film 415 is formed serves as first light transmitting portion 401a, and a portion in which silicon oxide film 415 is not formed serves as second light transmitting portion 401b. Semi-light shielding film 403 is formed to cover the curved sidewall having a predetermined curvature of silicon oxide film 415 and to expose predetermined regions of first and second light transmitting portions 401a and 401b.

Resist patterns formed by using the phase shifting masks shown in FIGS. 43A and 44A are illustrated respectively in FIGS. 43B and 44B. A region $E_{41}$ of resist pattern 121i and a region $E_{42}$ of resist pattern 121h represent the dense pattern region, while a region $F_{41}$ of resist pattern 121i represents the so-called aperture of the isolated pattern. Also, regions $F_{42}$ and $F_{43}$ of resist pattern 121h represent the so-called remaining portions of the isolated pattern.

In the phase shifting mask of this embodiment using the semi-light shielding film, either the Levenson system or the halftone system can be selected to obtain the phase shifting effect by making a dimension $S_{15}$ of semi-light shielding film 403 shown in FIG. 33 smaller or larger than 2λ×n.

More specifically, when a dimension $S_{16}$ of semi-light shielding film 413 in the dense pattern region $E_{41}$ is made smaller than 2λ×n, and a dimension $S_{17}$ of semi-light shielding film 403 in isolated pattern region is made larger than 2λ×n, whereby the phase shifting effect of the Levenson system and the halftone system can be provided respectively in the dense pattern region $E_{41}$ and the isolated pattern region. Therefore, a high resolution can be obtained in both isolated and dense patterns.

Also in the phase shifting mask of this embodiment using the semi-light shielding film, both the dense pattern and the isolated pattern can be formed by using the phase shifting effect. Therefore, it is possible to set coherency σ of exposure light to be a value (0.3) which is appropriate to the phase shifting mask, thus providing a high resolution in both dense and isolated patterns.

It is noted that chromium has been used for the semi-light shielding film 3, 203, 303, 403, in first through fourth embodiments, however, it is not limited thereto and any material can be applied so long as only transmittance of light can be controlled and a phase is not changed substantially.

This embodiment has been described when substrate 401 is formed by the three-layered structure of quartz substrate 411, etching stopper film 413, and silicon oxide film 415, however, the structure is not limited thereto. More specifically, any structure can be applied so long as at least two layers having different under etching characteristics are stacked, and the stacked structure may include three layers or more.

Also, this embodiment has been described in the case when etching stopper film 413 is made of SnO or $Al_2O_3$, however, materials used are not limited thereto. More specifically, any material can be used so long as the material has transmittance of 90% or more and resists wet etching of the silicon oxide film.

Further, silicon oxide film 415 can be made of other materials having transmittance of at least 90%. Also, it has been described that the silicon oxide film has the thickness of 4000Å, however, the thickness changes depending on the material. More specifically, a thickness d can assume any value as long as it satisfies the following expression:

$$d = \frac{1}{2} \cdot \frac{\lambda_0}{(n-1)}$$

(where $\lambda_0$: wavelength of exposure light, n:index of refraction of shifter material)

In first through fourth embodiments, quartz substrate 1, 201, 301, 411 is not necessarily made of quartz, and it can be made of any material having transmittance of at least 90%.

In third and fourth embodiments, doped amorphous silicon film 305, 405 can be made of other materials. More specifically, any material can be used so long as it has conductivity and a superior resistance against hydrofluoric acid such as $MoSi_2$. The reason why conductivity is important as a characteristic of such a material is that the resist film applied on the surface of such a film is exposed with light by the electron beam lithography method. In other words, if the exposure is carried out by the method other than the electron beam lithography method, conductivity is not required as a characteristic of such a film.

Light shielding film 303, 403 made of chromium (Cr) has been described in the above, however, the film is not limited thereto. In other words, the film may be such a multi-layered film as is made of CrO/Cr/CrO. Characteristics required for light shielding film 303, 403 include no transmission of exposure light, a high resistance against chemicals (during cleaning), and adherence. Any material which satisfies these characteristics can be used as light shielding film 303, 403.

Further, the dimensions and the materials described in first through fourth embodiments are not limited thereto and can be selected arbitrarily.

In a phase shifting mask according to one aspect of the present invention, a semi-light shielding film is located between first and second light transmitting portions, and formed at a region of these first and second light transmitting portions. The semi-light shielding film has transmittance of at least 3% and not more than 30%, whereby a high resolution can be obtained in a dense pattern and an isolated pattern. Thus, a desired pattern shape can easily be obtained.

In a phase shifting mask according to one preferred aspect of the present invention, a sidewall of a stepped portion of a substrate is in a shape having substantially the same radius of curvature as a height of the stepped portion. Accordingly, when the semi-light shielding film is formed on the stepped portion, adherence of the semi-light shielding film to the substrate is improved. Also, since a slope of the stepped portion is gentle, trapping of a foreign object which is generated during cleaning at the bottom of stepped portion can be prevented. Thus, a desired pattern shape can easily be obtained.

In a phase shifting mask according to another preferred aspect of the present invention, the substrate includes first and second films made of materials having different under etching characteristics. Therefore, controllability of a phase shifting angle between first and second light transmitting portions can be very much improved. Thus, a desired pattern shape can easily be obtained.

In a phase shifting mask according to another aspect of the present invention, a sidewall of a stepped portion of a substrate is in a shape having substantially the same radius of curvature as a height of the stepped portion. Therefore, when a light shielding film is formed on the stepped portion, adherence of the light shielding film to the substrate is improved.

Also, since a slope of the stepped portion is gentle, trapping of a foreign object which is generated during cleaning at the bottom at the stepped portion can be prevented.

In a phase shifting mask according to one preferred aspect of the present invention, the substrate includes first and second films made of materials having different under etching characteristics. Therefore, controllability of a phase shifting angle between first and second light transmitting portions is very much improved. Thus, a desired pattern shape can easily be obtained.

In an exposure method using the phase shifting mask according to one aspect of the present invention, the phase shifting mask allowing a high resolution in both dense and isolated patterns is used. Therefore, a desired pattern shape can easily be obtained even in a circuit pattern in which the dense and isolated patterns are mingled.

Also, since both the dense pattern and the isolated pattern can be formed by the phase shifting effect, coherency σ of exposure light can be set to be an appropriate value. Thus, a desired pattern shape can easily be obtained.

In an exposure method using the phase shifting mask according to another aspect of the present invention, the phase shifting mask which has a good adherence of the light shielding film to the substrate and in which a foreign object is unlikely to be trapped is used. Therefore, an unsatisfactory pattern shape due to defects is not likely to generate, so that a desired pattern shape can easily be obtained.

In a manufacturing method of the phase shifting mask according to one aspect of the present invention, a high resolution can be obtained in both dense and isolated patterns. This permits manufacturing of the phase shifting mask in which a desired pattern shape can easily be obtained.

In a manufacturing method of the phase shifting mask according to another aspect of the present invention, a main surface of the substrate is isotropically etched. A slope of the stepped portion formed by this etching is gentler than that when anisotropic etching is carried out. Thus, when the light shielding film is formed on the stepped portion, adherence of the light shielding film to the substrate is improved.

The gentle slope of the stepped portion prevents trapping a foreign object which is generated during cleaning at the bottom of stepped portion.

Further, an etchant spreads under a mask during isotropic etching. Even if a remaining defect is left on the substrate, the etchant spreads under that remaining defect during etching, thus removing that portion of the substrate. Accordingly, the remaining defect is fallen off because the underlying layer is lost. Therefore, a region to be removed by etching on the substrate will not be left by isotropic etching even when there is the remaining defect. Thus, degradation of resolution and formation of unsatisfactory pattern shape can be prevented.

In a manufacturing method of the phase shifting mask according to a preferred aspect of the present invention, the substrate includes first and second films made of materials having different under etching characteristics. Thus, controllability of a phase shifting angle between first and second light transmitting portions is very much improved, so that the phase shifting mask which facilitates formation of a desired pattern shape can be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposure method, comprising the steps of:

emitting exposure light from a light source;

directing said exposure light to a phase shifting mask; and projecting the exposure light transmitted through said phase shifting mask onto a photoresist placed on a film to be etched for photosensitizing said photoresist, wherein said phase shifting mask includes a substrate including a first light transmitting portion which transmits said exposure light and a second light transmitting portion which is adjacent to said first light transmitting portion and transmits exposure light to have a different phase from that of the exposure light transmitted through said first light transmitting portion, and a semi-light shielding film which is located at an interface between said adjacent first and second light transmitting portions and formed in a part of said first and second light transmitting portions, said first light transmitting portion includes a first transmitting region and a first attenuated transmitting region in which said semi-light shielding film is formed, light intensity of exposure light transmitted through said first transmitting region is greater than that of the exposure light transmitted through said first attenuated transmitting region, said second light transmitting portion includes a second transmitting region and a second attenuated transmitting region in which said semi-light shielding film is formed, light intensity of exposure light transmitted through said second transmitting region is greater than that of the exposure light transmitted through said second attenuated transmitting region, and said semi-light shielding film has transmittance of at least 3% and not more than 30%.

2. An exposure method, comprising the steps of:

emitting exposure light from a light source;

directing said exposure light to a phase shifting mask; and projecting the exposure light transmitted through said phase shifting mask onto a photoresist placed on a film to be etched for photosensitizing said photoresist, wherein said phase shifting mask includes a substrate including a first light transmitting portion which transmits said exposure light and a second light transmitting portion which transmits exposure light to have a different phase from that of the exposure light transmitted through said first light transmitting portion, surfaces of said first and second light transmitting portions forming a stepped portion having a predetermined height, and a light shielding film which covers the stepped portion of said substrate and exposes a predetermined region of said first and second light transmitting portions, and wherein a sidewall of the stepped portion of said substrate is in a shape having a radius of curvature which is substantially equal to a height of said stepped portion.

* * * * *